United States Patent
Cai et al.

(10) Patent No.: US 12,075,708 B2
(45) Date of Patent: Aug. 27, 2024

(54) SPIN TORQUE DEVICE HAVING A SPIN CURRENT POLARIZED AT A CANTING ANGLE OF OUT-OF-PLANE SPIN

(71) Applicant: National University of Singapore, Singapore (SG)

(72) Inventors: Kaiming Cai, Singapore (SG); Yang Liu, Singapore (SG); Shuyuan Shi, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 783 days.

(21) Appl. No.: 16/887,247

(22) Filed: May 29, 2020

(65) Prior Publication Data

US 2020/0395532 A1    Dec. 17, 2020

(51) Int. Cl.
| | |
|---|---|
| *H10N 50/80* | (2023.01) |
| *G11C 11/16* | (2006.01) |
| *G11C 11/18* | (2006.01) |
| *H01F 10/32* | (2006.01) |
| *H10N 50/10* | (2023.01) |
| *H10N 50/85* | (2023.01) |

(52) U.S. Cl.
CPC .......... *H10N 50/80* (2023.02); *G11C 11/161* (2013.01); *G11C 11/18* (2013.01); *H01F 10/324* (2013.01); *H01F 10/3286* (2013.01); *H01F 10/329* (2013.01); *H10N 50/10* (2023.02); *H10N 50/85* (2023.02); *H01F 10/3254* (2013.01)

(58) Field of Classification Search
CPC ....... G11C 11/16; G11C 11/161; G11C 11/18; H01F 10/3254; H01F 10/3286; H01F 10/329; H10N 52/00; H10N 52/01; H10N 52/101; H10N 52/80; H10N 52/85
See application file for complete search history.

(56) References Cited

U.S. PATENT DOCUMENTS

| | | | |
|---|---|---|---|
| 2017/0200486 A1* | 7/2017 | Qiu ................... | H10N 50/80 |
| 2020/0203601 A1* | 6/2020 | Eom ................... | H01F 10/002 |
| 2022/0149269 A1* | 5/2022 | Nakatsuji .......... | H10B 99/00 |

* cited by examiner

*Primary Examiner* — Younes Boulghassoul
(74) *Attorney, Agent, or Firm* — Potomac Law Group, PLLC; John ("Jack") Penny, Jr.

(57) ABSTRACT

Described is a spin torque device, and a spintronics device incorporating the spin torque device. The spin torque device comprises a magnetic layer having a switchable magnetisation direction along a first axis, and a spin source layer adapted to generate a spin current from a current Injected along a second axis perpendicular to the first axis. Electrons of different spins in the spin source layer are rearranged by scattering so the spin current is generated in a plane perpendicular to the second axis and polarized at an angle to the first axis, so that the spin current diffuses into the magnetic layer to produce spin torque to switch the magnetisation direction.

15 Claims, 40 Drawing Sheets

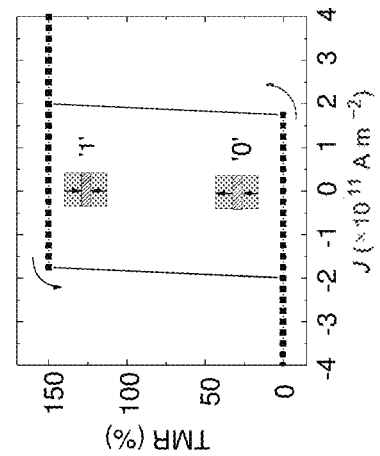
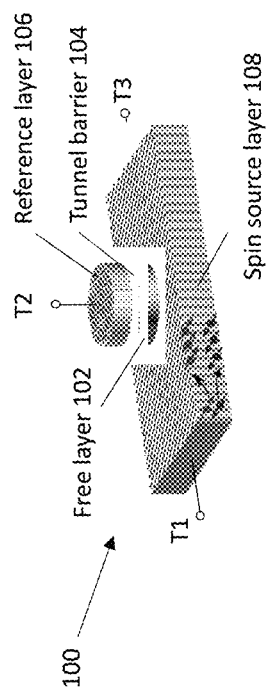
FIG 1A
FIG 1B

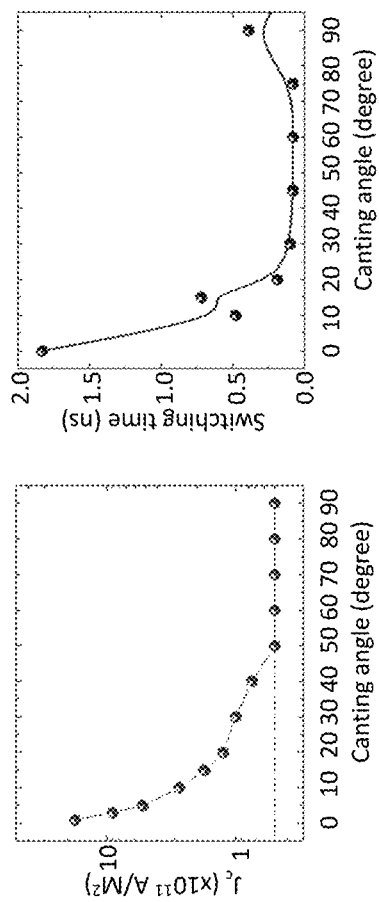

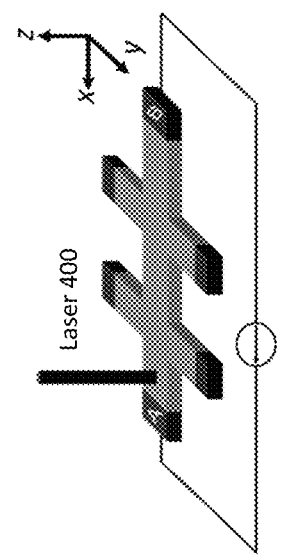
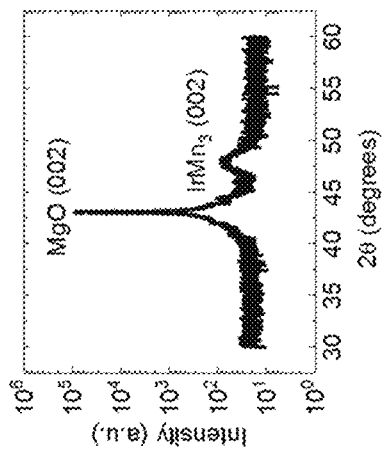
FIG 4A
FIG 4B

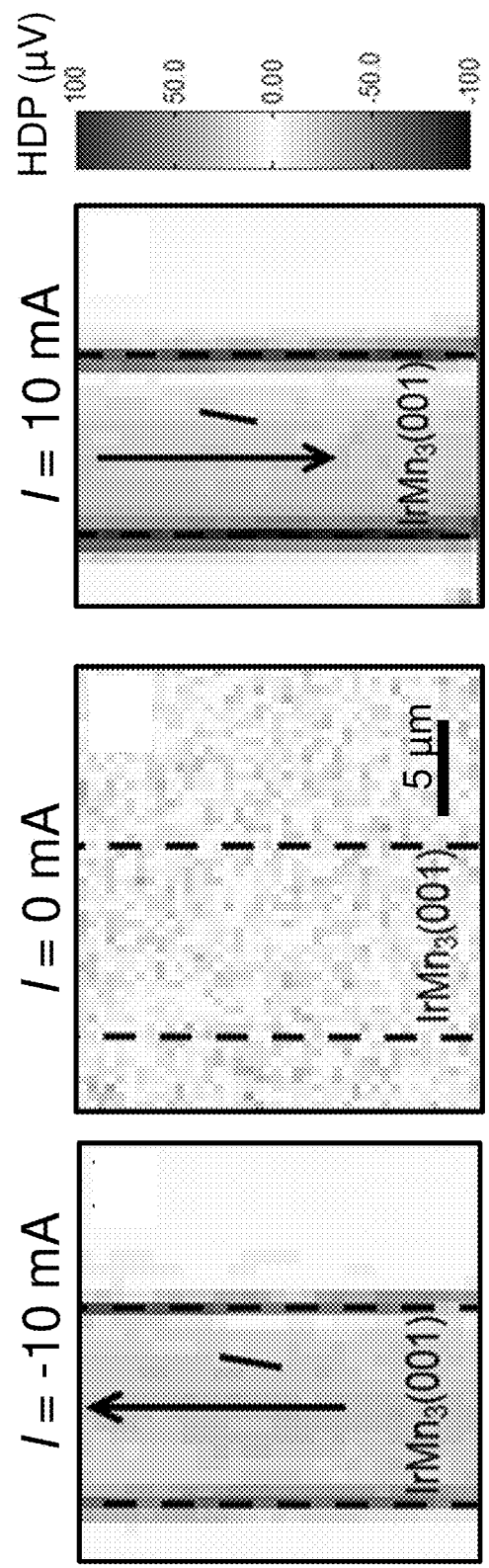

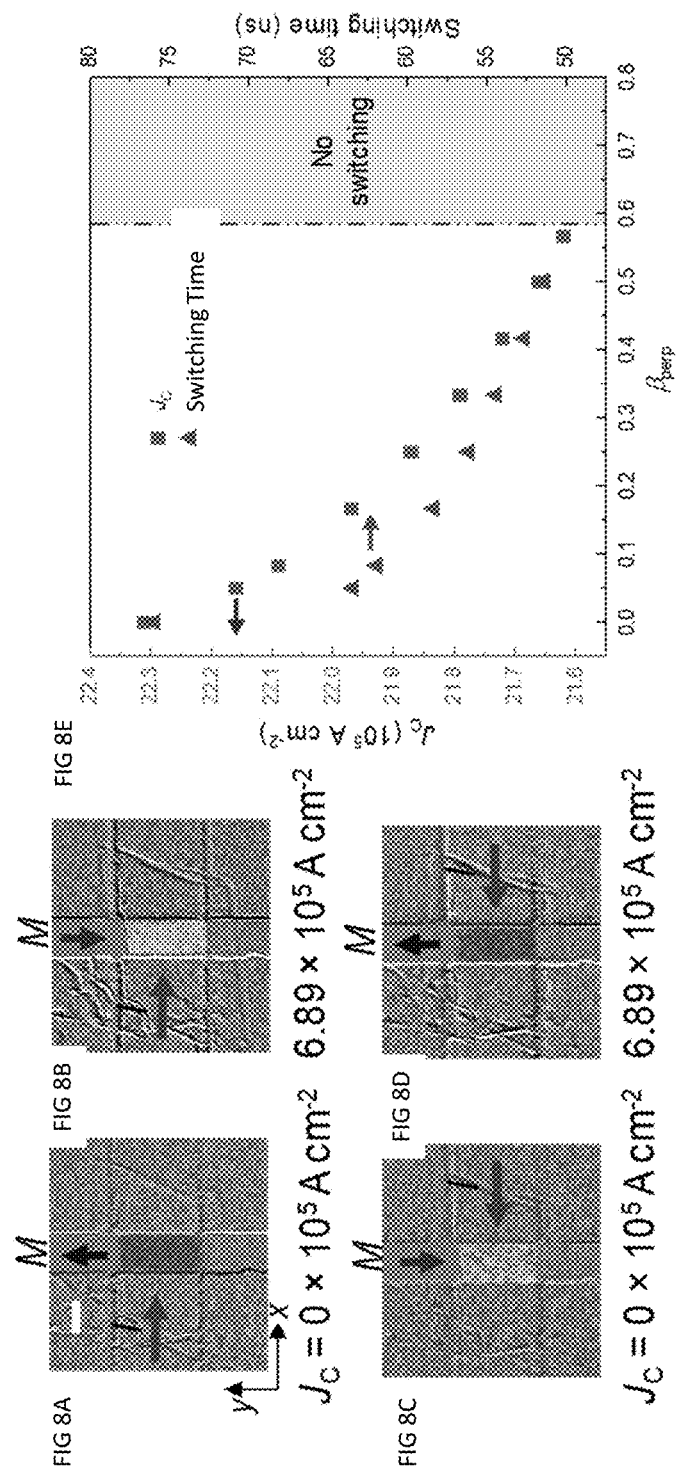

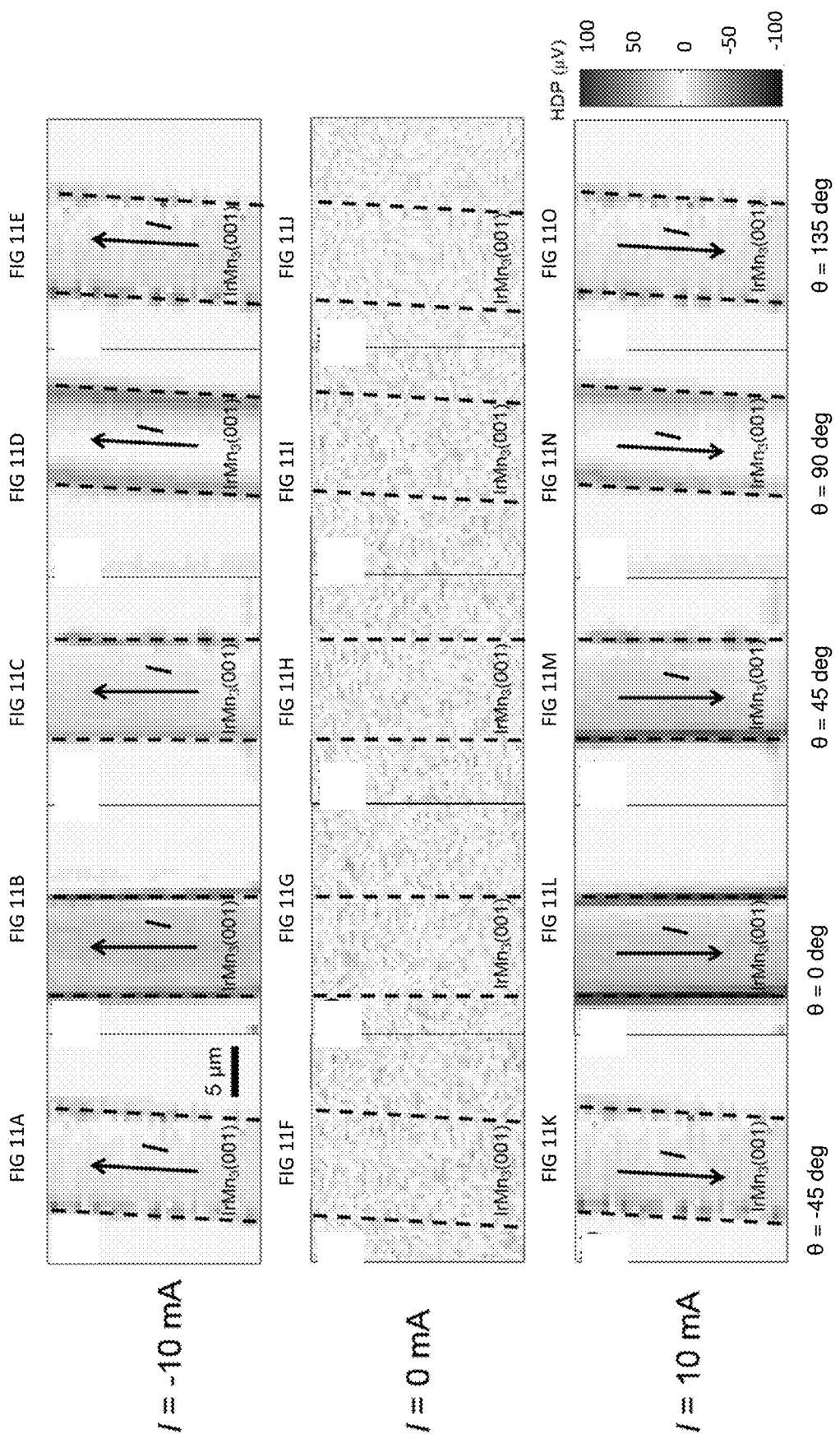

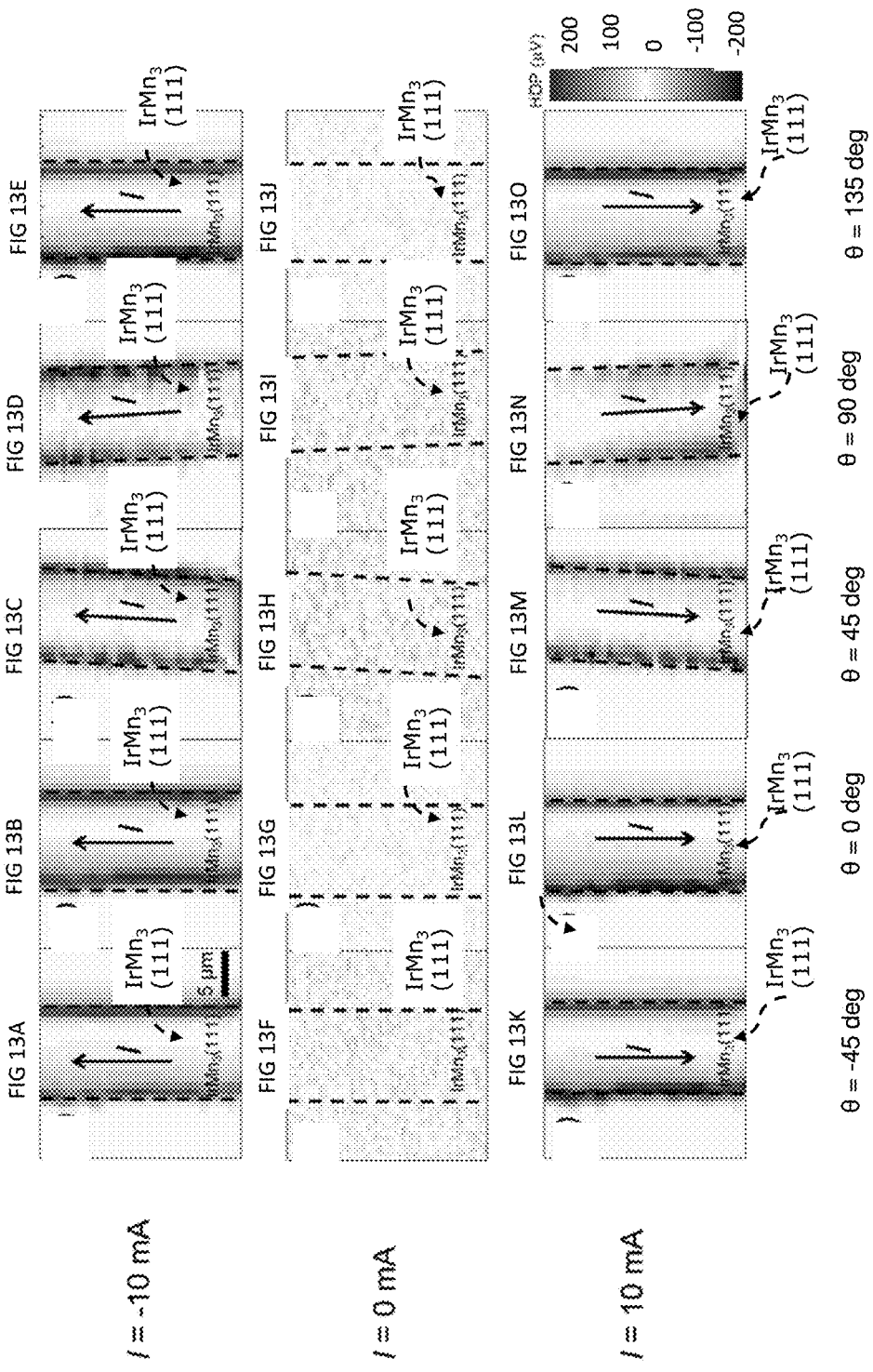

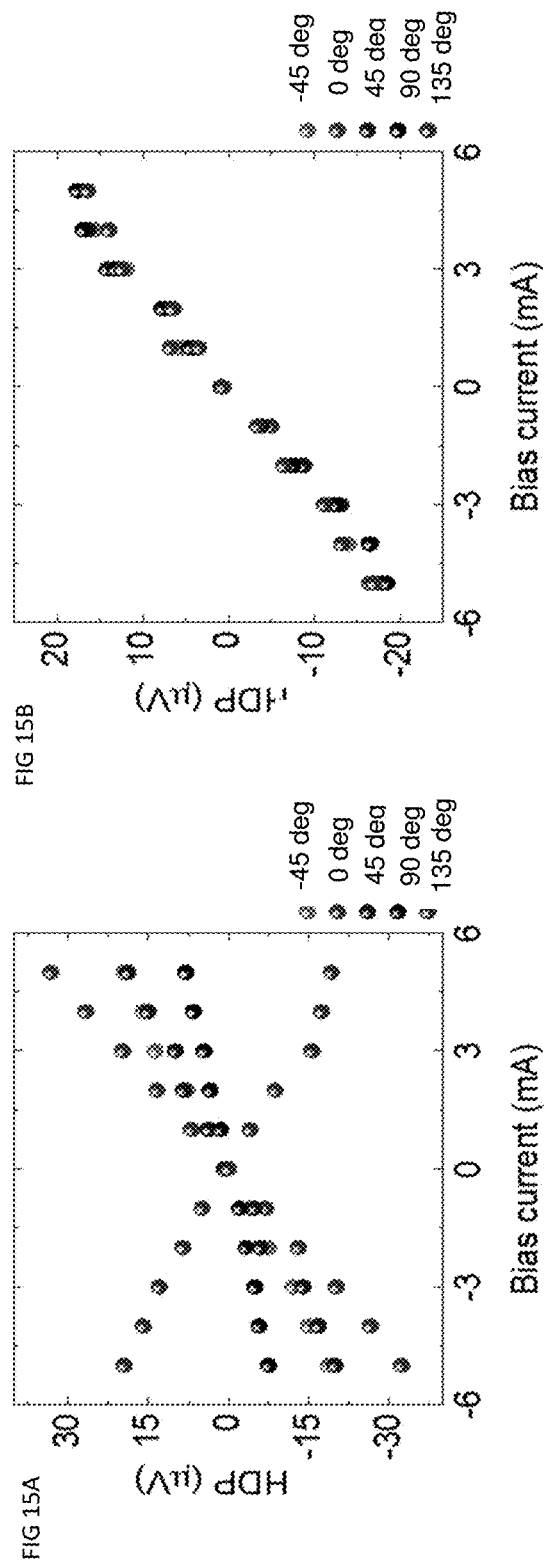

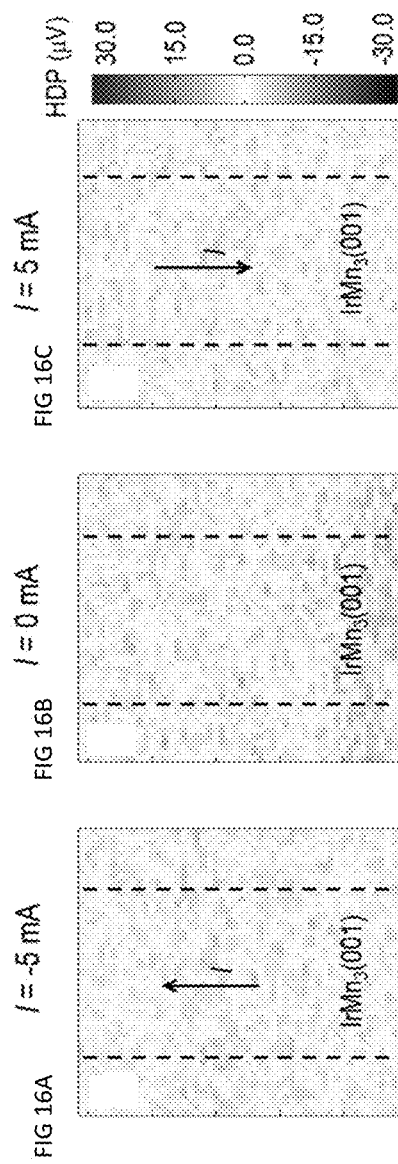

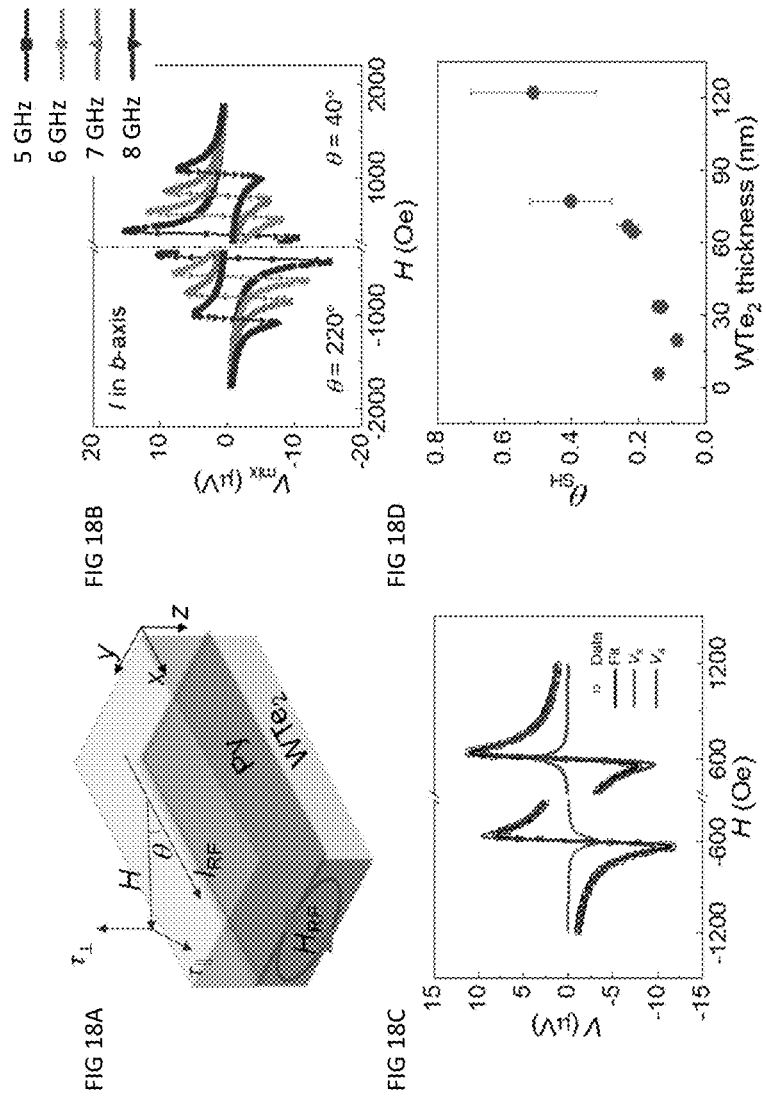

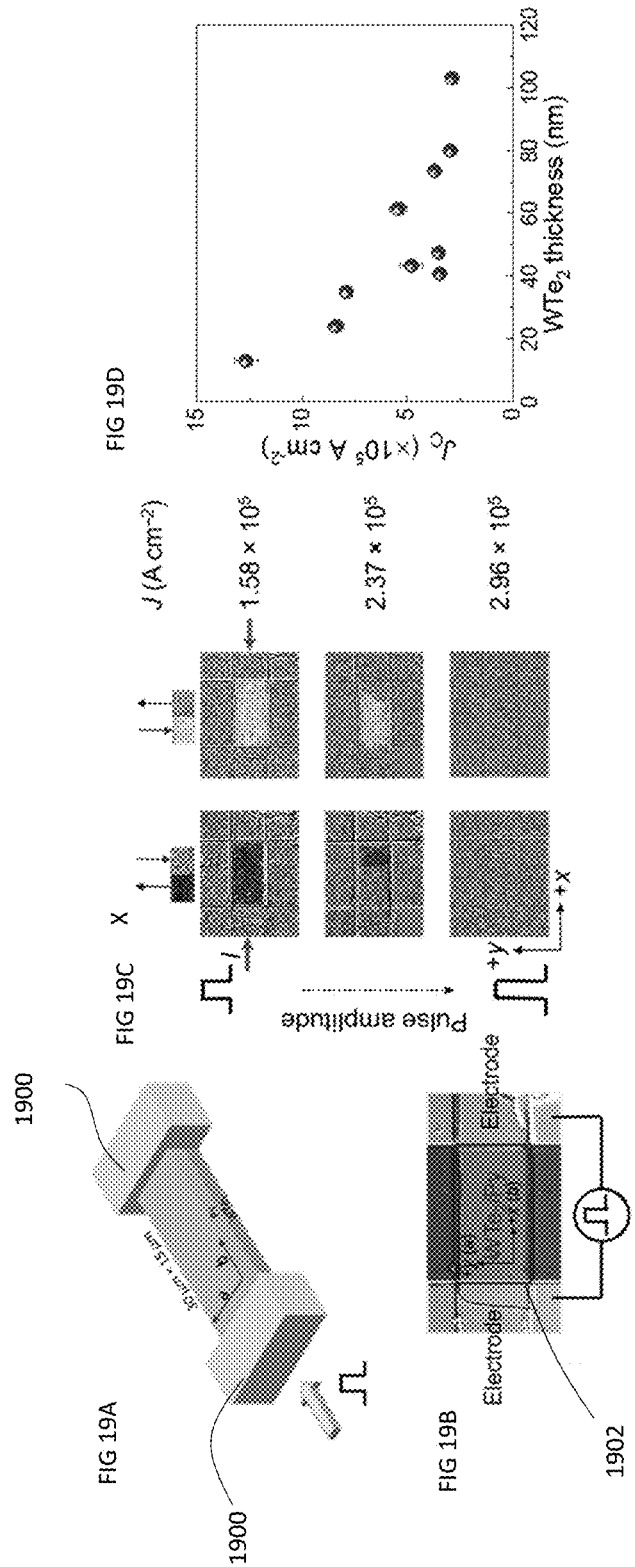

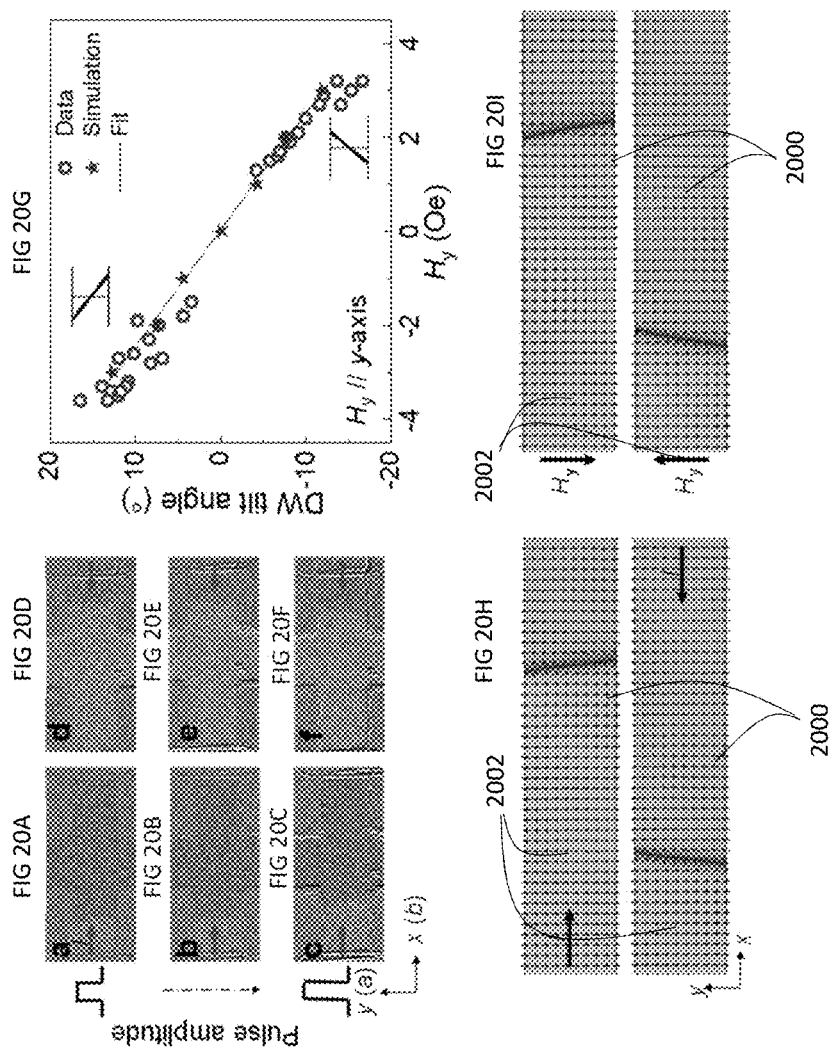

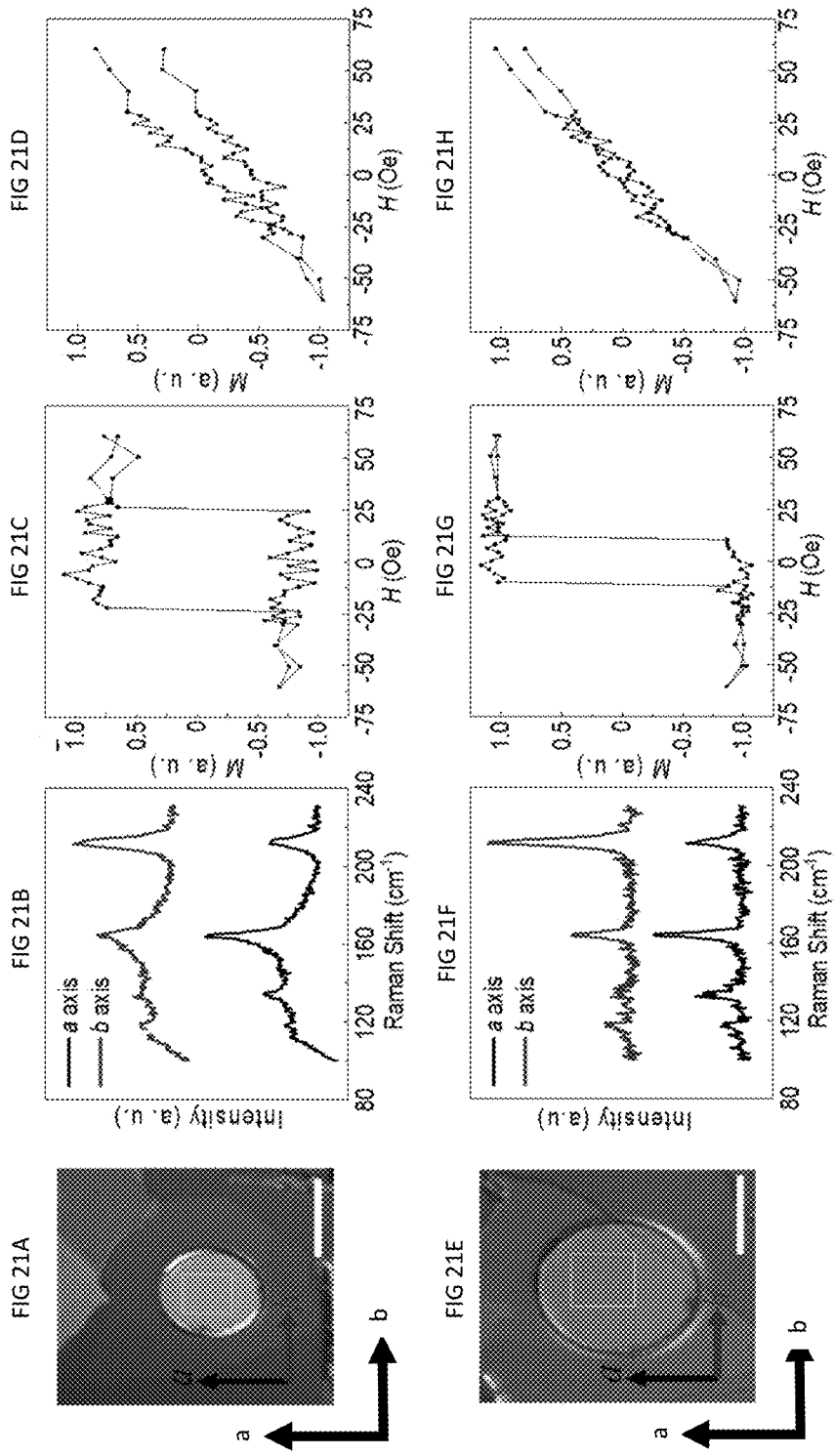

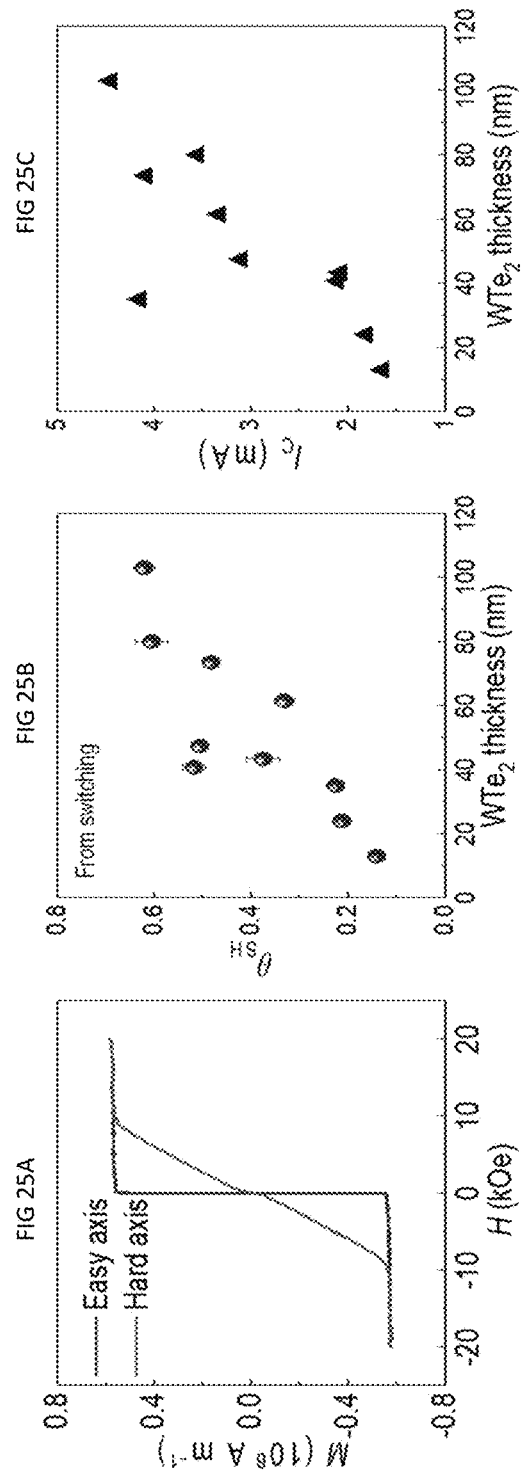

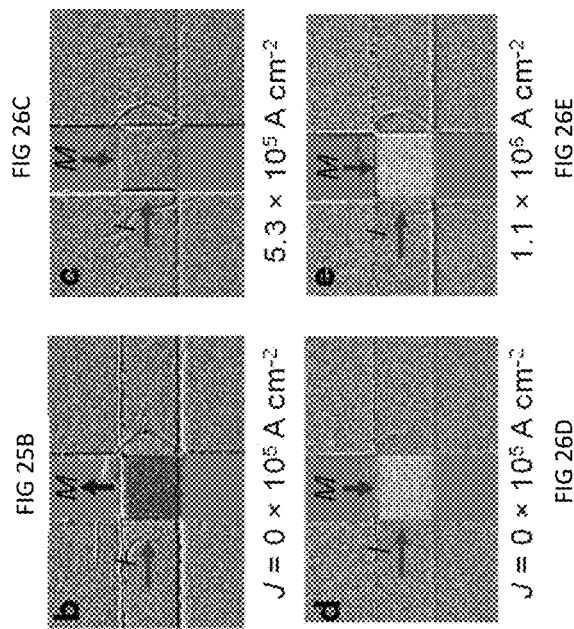
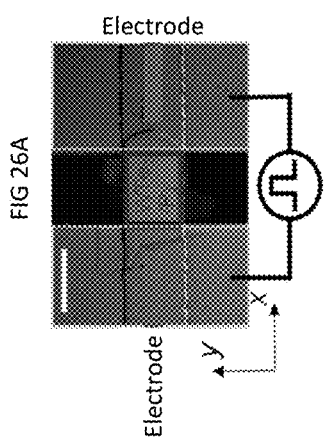

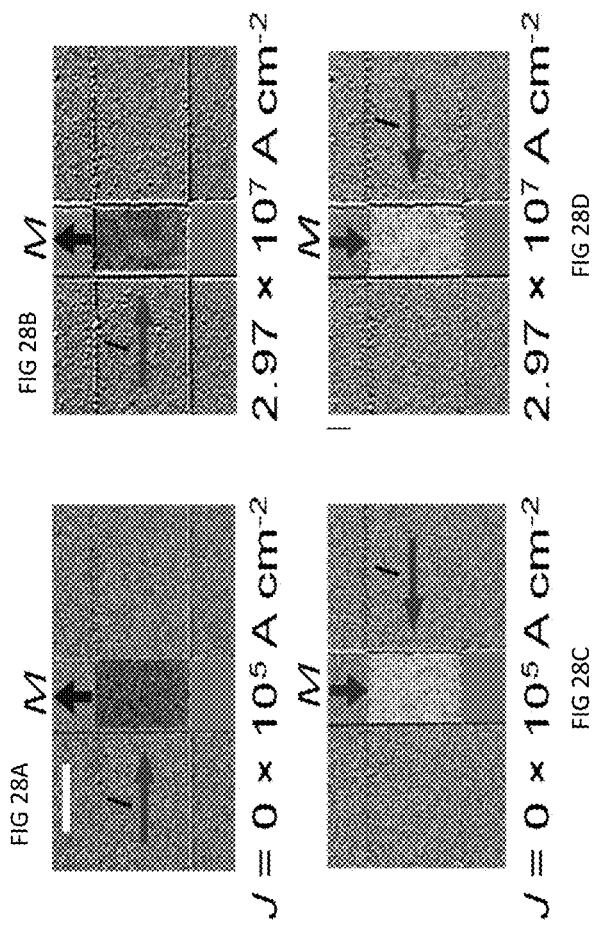

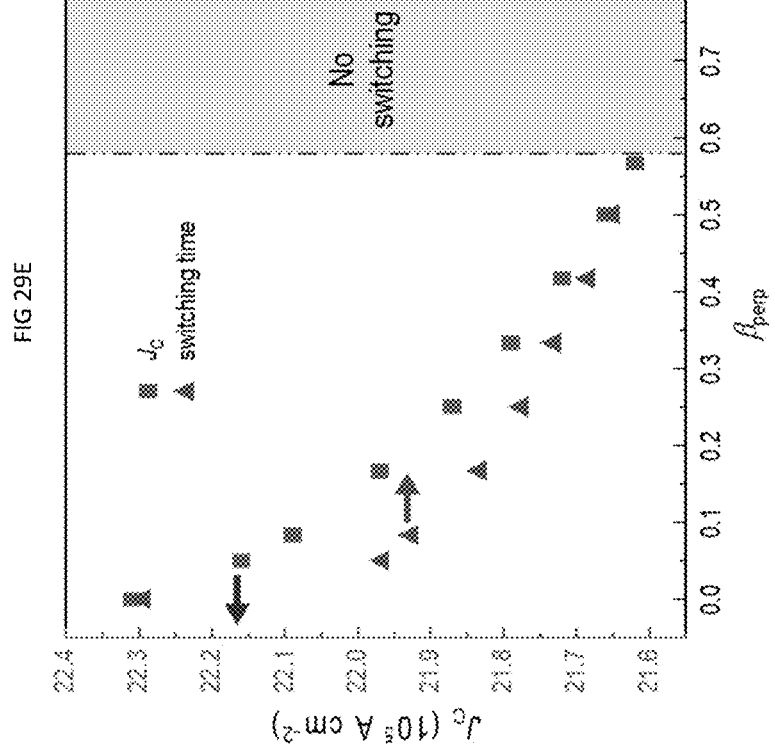
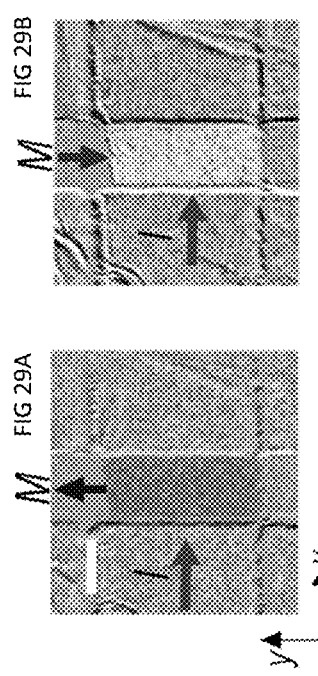 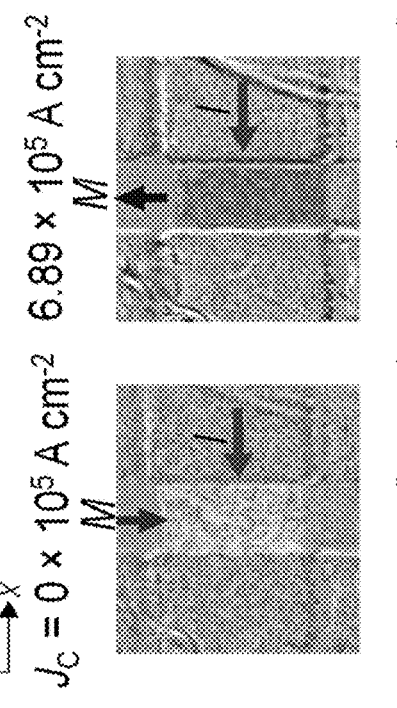 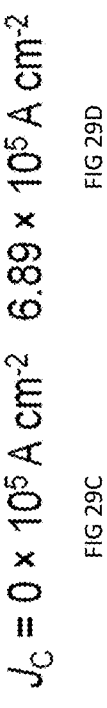
FIG 29A  FIG 29B
FIG 29C  FIG 29D
FIG 29E

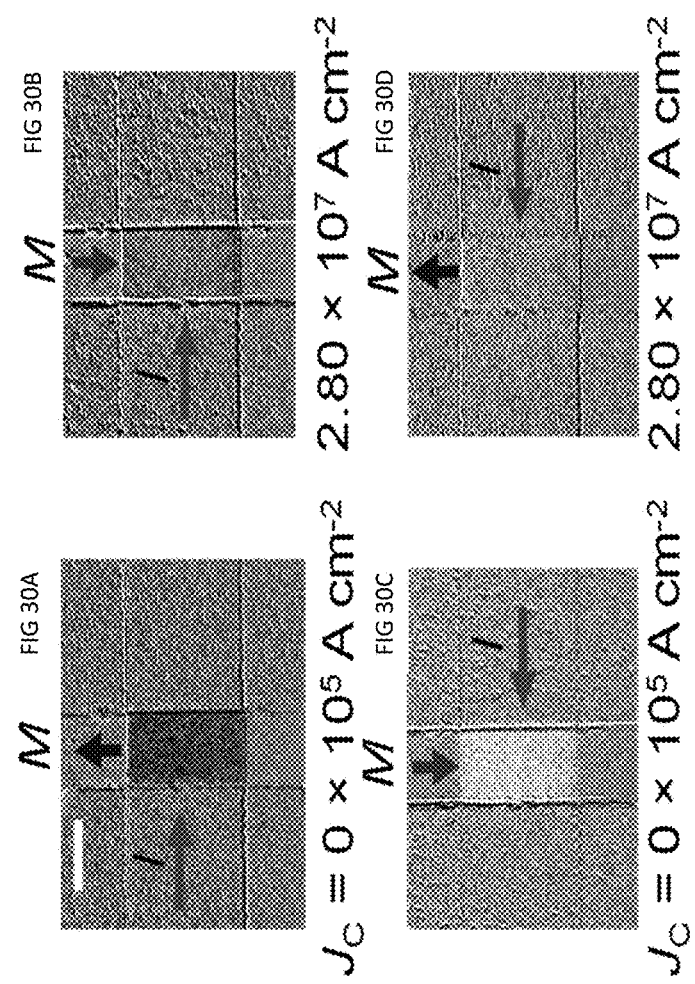

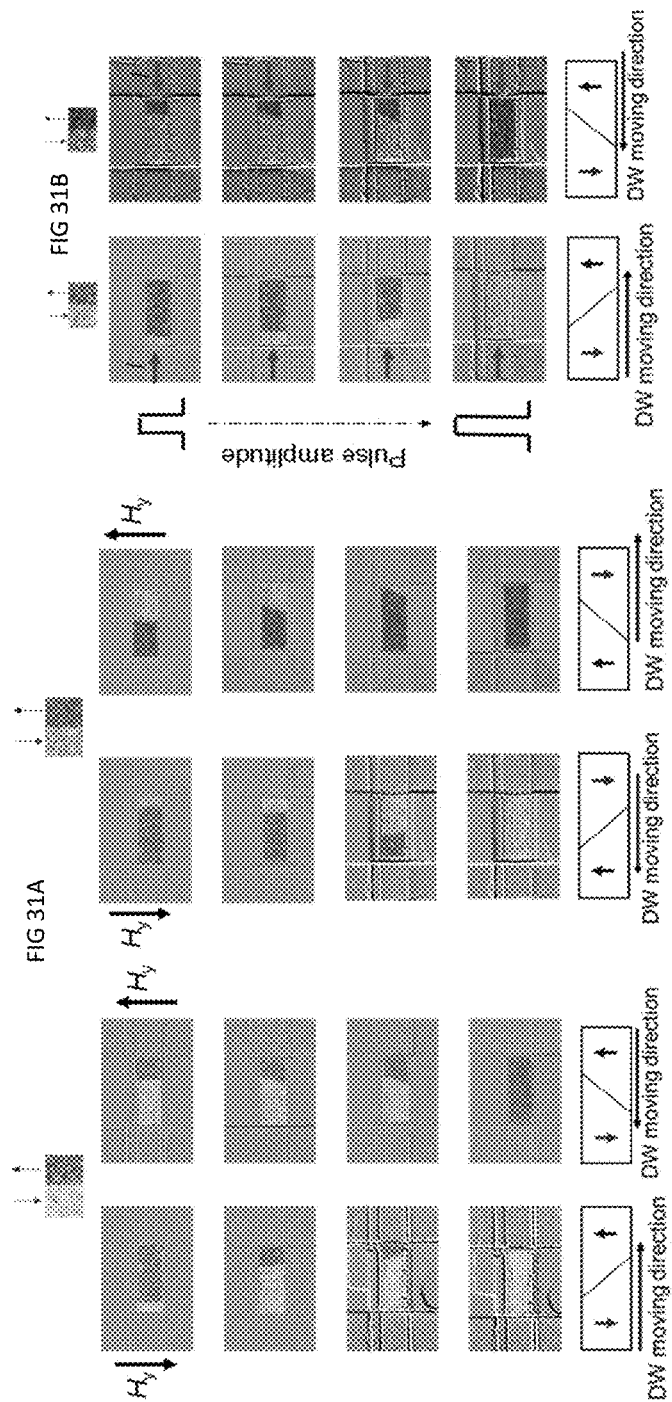

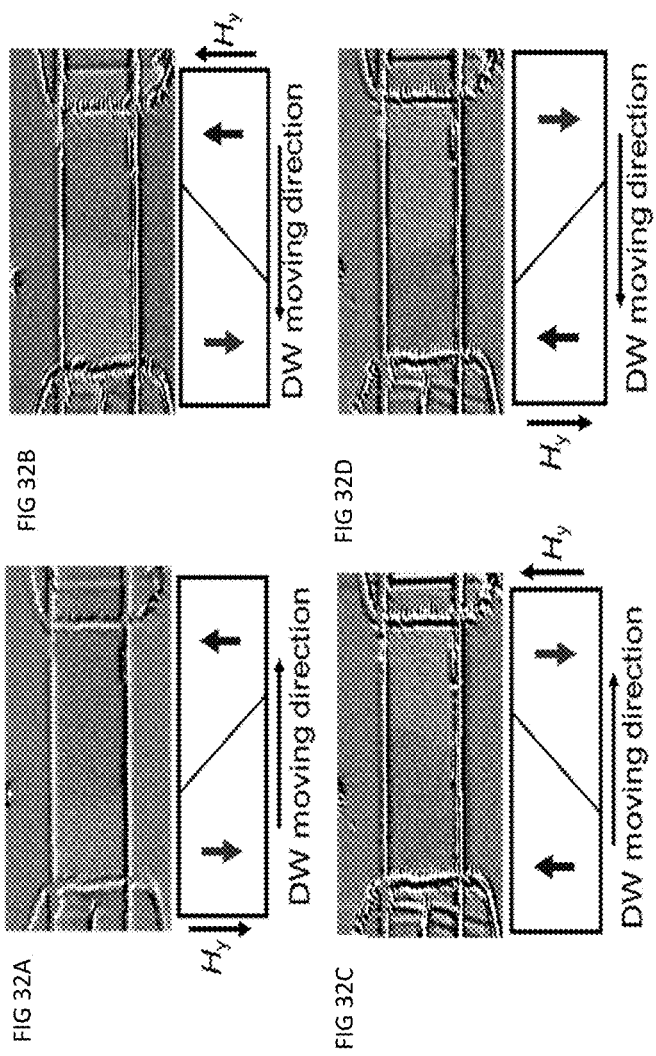

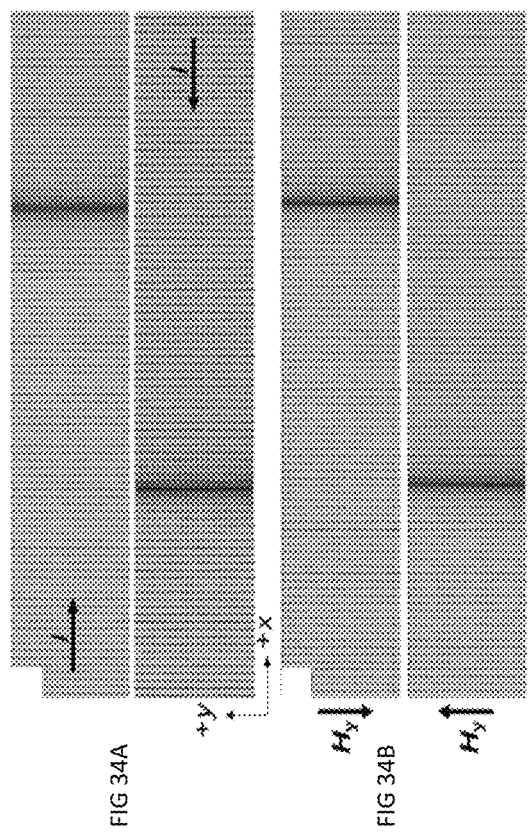

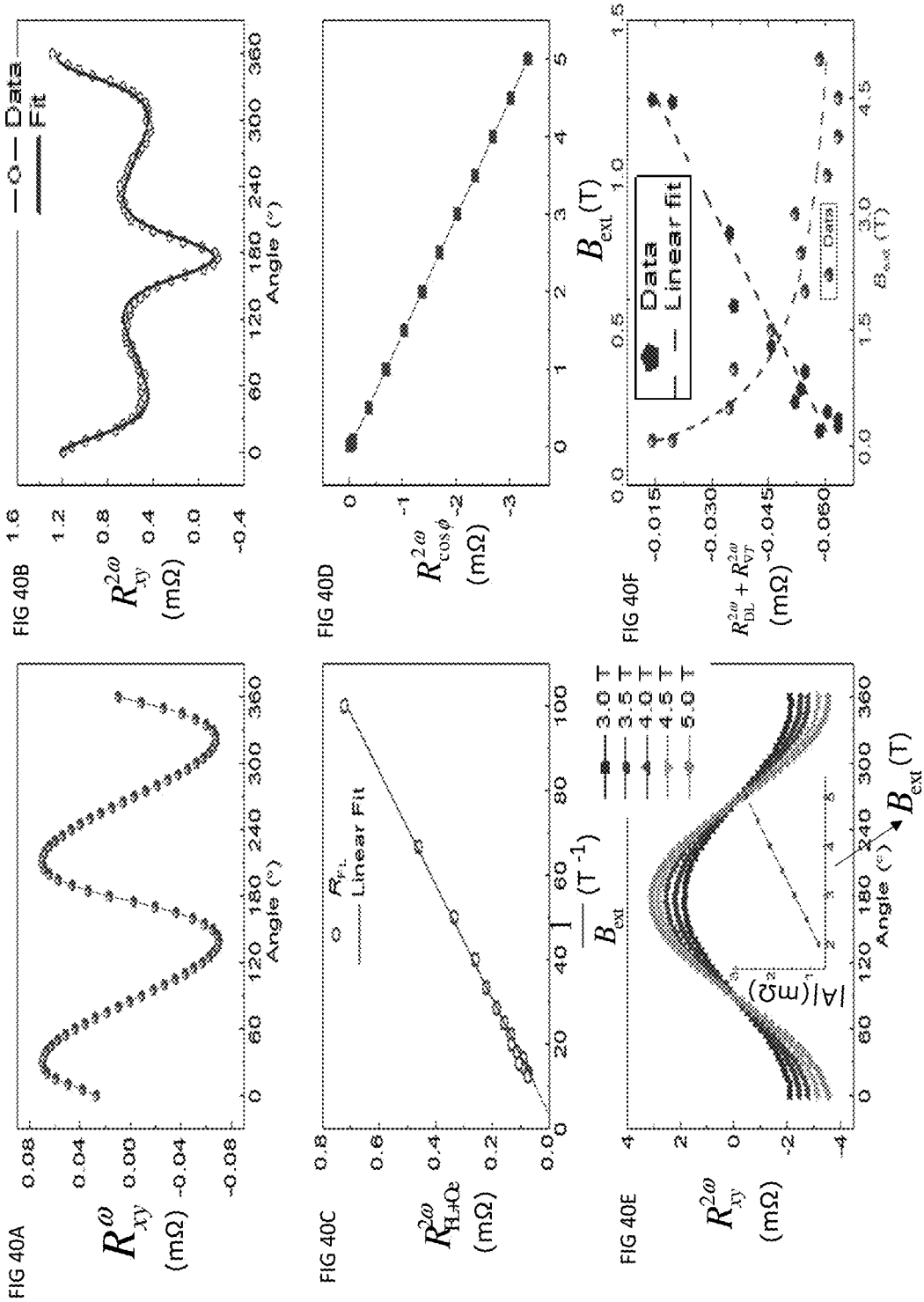

SPIN TORQUE DEVICE HAVING A SPIN CURRENT POLARIZED AT A CANTING ANGLE OF OUT-OF-PLANE SPIN

TECHNICAL FIELD

The present Invention relates to spin torque devices, such as those used in spintronic devices, and spintronic devices Incorporating such spin torque devices.

BACKGROUND

Magnetic memory is a non-volatile memory technology with fast operation, high power-efficiency, and high endurance in a single magnetic element. Conventional memory technologies use electric charges or currents to store data. In magnetic memory, the data is stored by magnetic elements, exhibiting striking features such as non-volatility, low-power consumption and high-speed operation. Thus, magnetic memory is a promising candidate for universal memory applications or universal usage.

Magnetic memory technologies Include spin transfer torque-magnetic random access memory (STT-MRAM). STT-MRAM has shown great potential for replacing traditional memory technologies. However, the writing speed in the STT-MRAM is typically limited to the Incubation time for switching, which can get down to several nanoseconds. This largely Impedes applications of STT-MRAM on the cache memory that requires a faster operation speed of sub to a few-nanosecond time scale. Furthermore, both the reading and writing current flow through the same channel in a STT-MRAM device, and undesired writing of data may occur during the reading of data. Moreover, the high current density flowing through the tunnel barrier causes reliability issues in STT-MRAM.

In view of the limitations of STT-MRAM, spin-orbit torque magnetic random access memory (SOT-MRAM) has attracted great attention. A typical SOT-MRAM device consists of a non-magnetic layer and a magnetic layer. A charge current flowing in the plane of the non-magnetic layer is converted to a spin current. The spin current then exerts a torque on an adjacent magnetic layer and switches the magnetization states of the perpendicularly magnetized layer between "up" and "down". The currents for data writing/reading are applied in two separated channels. Since the spin polarization is orthogonal to the magnetization, the magnetization can be switched by a charge current in a negligible Incubation time. However, an external magnetic field is typically required to break the symmetry for achieving deterministic switching in a SOT-MRAM device. The external field seriously restricts the down-scaling of devices and is an obstacle for the high-density Integration of magnetic memories.

It is desirable therefore to provide a device that avoids or ameliorates at least one of the aforementioned drawbacks of the prior art, or at least provides a useful alternative.

SUMMARY

Described herein is a spin torque device comprising:
a reference magnetic layer ("reference layer");
a magnetic layer having a switchable magnetisation direction along a first axis ("free layer");
a non-magnetic layer between the reference layer and the free layer; and
a spin source layer adapted to generate a spin current from a current Injected along a second axis perpendicular to the first axis,
wherein electrons of different spins in the spin source layer are rearranged by scattering so the spin current is generated in a plane perpendicular to the second axis and polarized at an angle to the first axis, so that the spin current diffuses into the free layer to produce spin torque to switch the switchable magnetisation direction.

The non-magnetic layer may be a dielectric layer. The free layer, reference layer (also referred to herein as a fixed layer) and non-magnetic layer may form a magnetic tunnel junction (MTJ).

The angle may be a canting angle of out-of-plane spin. That canting angle may be selected to correspond with a predetermined switching polarity and switching current density. Alternatively, or in addition, the canting angle may be selected to correspond with a predetermined switching time.

The spin source layer may be an antiferromagnetic layer. The antiferromagnetic layer may be non-collinear. The antiferromagnetic layer may be one of (001), (010) and (100) oriented. The antiferromagnetic layer may be iridium-manganese compounds. The antiferromagnetic layer may be between about 1 nm to about 20 nm thick. In some embodiments, the antiferromagnetic layer is about 8 nm thick.

The spin source layer may exhibit broken crystalline Inversion symmetry. The spin source layer may be arranged to receive the current along a low-symmetry or lack-of-symmetry axis. The spin source layer may be formed from tungsten-telluride compounds.

The spin source layer may produce out-of-plane spin accumulation when the current is an in-plane charge current.

The spin torque device may form a stack comprising a capping layer, the free layer and reference layer being between the capping layer and spin source layer. The capping layer may be a magnesium-oxide/silicon-dioxide layer.

The free layer may exhibit perpendicular magnetic anisotropy. The free layer may be formed from one of:
a ferromagnetic material comprising at least one of Fe, Co, Ni, alloys of one or more of Fe, Co, Ni, and CoFeB alloy;
a ferrimagnetic material comprising at least one of CoPd, CoTb, FeCoTb, FeCoGd, and CoGd alloys, and the multilayers $[C/Tb]_n$, $[Co/Pd]_n$ and $[Co/Gd]_n$;
a ferromagnetic or ferrimagnetic Insulator comprising YIG; or
a two-dimensional magnetic material comprising at least one of FeGeTe compounds and $VSe_2$.

Also described herein is a spintronics device comprising:
a magnetic layer having a switchable magnetisation direction along a first axis, a first surface and opposite second surface ("free layer");
a spin source layer adapted to generate a spin current from a current Injected along a second axis perpendicular to the first axis, the first surface being adjacent the spin source layer,
a fixed layer; and
a non-magnetic layer disposed between the fixed layer and the free layer,
wherein electrons of different spins in the spin source layer are rearranged by scattering so the spin current is generated in a plane perpendicular to the second axis and polarized at an angle to the first axis, so that the spin current diffuses into the free layer to produce spin torque to switch the magnetisation direction.

The non-magnetic layer may be sandwiched between the free layer and the fixed layer, the spintronics device further comprising a capping layer adjacent the fixed layer.

Embodiments of the present invention enable reliable, ultrafast and energy-efficient spin-orbit torque magnetization operation in magnetic memory without an external magnetic field. In other embodiments in which an external magnetic field is applied, even more rapid switching may be achieved. Embodiments of the present invention therefore offer great enhancements in terms of the operation speed and energy-efficiency of magnetic memory.

Advantageously, by removing or reducing the requirement for an externally applied magnetic field, embodiments of the present invention can achieve the high-density of Integration of magnetic memory devices.

BRIEF DESCRIPTION OF THE DRAWINGS

Embodiments of the present invention will now be described, by way of non-limiting example, with reference to the drawings in which:

FIGS. 1A and 1B show:
FIG. 1A is a schematic of a three-terminal MTJ device; and
FIG. 1B is a schematic of tunneling magnetoresistance (TMR) as a function of current density Injected in the bottom spin source layer;

FIGS. 2A to 2C show field-free spin-orbit torque switching based on out-of-plane spin generation, in which:
FIG. 2A is a schematic diagram of a spin-orbit torque device;
FIG. 2B shows current-induced switching loops for $\theta=15°$ in the absence of an external magnetic field; and
FIG. 2C shows the temporal evolution of averaged magnetization with a current density $J=2.0\times10^{11}$ Am$^{-2}$;

FIGS. 3A and 3B demonstrate the simulated critical switching current density and switching time as a function of canting angle of out-of-plane spins, in which:
FIG. 3A shows the critical switching current density as a function of the canting angle of spin currents; and
FIG. 3B shows the switching time as a function of the canting angle of spin currents;

FIGS. 4A and 4B show the X-ray power diffraction (XRD) data and schematics of experimental setup, in which:
FIG. 4A shows the XRD data measured on 8 nm (001)-oriented IrMn$_3$; and
FIG. 4B is a schematic of device measurement structure with a bias current applied along the x direction;

FIGS. 6A to 6C show the current Induced out-of-plane spin accumulations on the surface of (001)-IrMn$_3$, in which each figure Illustrates the two-dimensional helicity-dependent photovoltage (HDP) data in (001)-oriented IrMn$_3$ under a bias current I of:
−10 mA (FIG. 6A);
0 mA (FIG. 6B); and
10 mA (FIG. 6C);

FIGS. 7A to 7C show the spin-torque ferromagnetic resonance (ST-FMR) measurements on a WTe$_2$ (17.2 nm)/Py (6 nm) sample, in which:
FIG. 7A shows a microscopic image of the ST-FMR device;
FIG. 7B Illustrates the sample geometry for the ST-FMR measurements; and FIG. 7C shows the ST-FMR spectrum of the WTe$_2$ (17.2 nm)/Py (6 nm) sample with currents along the a-axis with Lorentzian fits;

FIGS. 8A to 8E show the current-driven magnetization switching measurements on a WTe$_2$/Py sample with currents along the a-axis, providing the magneto-optical Kerr effect (MOKE) images of the device, in which:
injection of current pulses from the left terminal are shown, and the magnetization is switched from the +y direction (FIG. 8A) to −y direction (FIG. 8B);
injection of current pulses from the right terminal are shown, and the magnetization is switched from the −y direction (FIG. 8C) to +y direction (FIG. 8D)—scale bar is 5 μm; and
FIG. 8E is the simulated critical switching current density and switching time versus the ratio of the out-of-plane damping-like SOT over the in-plane damping like SOT;

FIGS. 10A to 10D provide a schematic experimental setup and XRD measurements, in which:
FIG. 10A shows XRD data measured on 8 nm (001)-oriented IrMn$_3$;
FIG. 10B shows XRD data measured on 8 nm (111)-oriented IrMn$_3$;
FIG. 10C is a schematic of device measurement structure with the bias current applied along the x direction; and
FIG. 10D is a schematic of scanning photovoltage measurements;

FIGS. 11A to 11O show the current Induced out-of-plane spin accumulations on the surface of (001)-IrMn$_3$, showing two-dimensional HDP data in (001)-oriented IrMn$_3$ for:
FIG. 11A bias current of I=−10 mA and $\theta=-45°$;
FIG. 11B bias current of I=−10 mA and $\theta=0°$;
FIG. 11C bias current of I=−10 mA and $\theta=45°$;
FIG. 11D bias current of I=−10 mA and $\theta=90°$;
FIG. 11E bias current of I=−10 mA and $\theta=135°$;
FIG. 11F bias current of I=0 mA and $\theta=-45°$;
FIG. 11G bias current of I=0 mA and $\theta=0°$;
FIG. 11H bias current of I=0 mA and $\theta=45°$;
FIG. 11I bias current of I=0 mA and $\theta=90°$;
FIG. 11J bias current of I=0 mA and $\theta=135°$;
FIG. 11K bias current of I=10 mA and $\theta=-45°$;
FIG. 11L bias current of I=10 mA and $\theta=0°$;
FIG. 11M bias current of I=10 mA and $\theta=45°$;
FIG. 11N bias current of I=10 mA and $\theta=90°$; and
FIG. 11O bias current of I=10 mA and $\theta=135°$;

FIGS. 12A and 12B show the current and crystallization direction dependence of the spin accumulations in (001)-IrMn$_3$, in which:
FIG. 12A is the transverse voltage $V_T$ in (001)-oriented IrMn$_3$ as a function of bias current with different $\theta$;
FIG. 12B is the normalized SHC $\sigma_{xy}^z+\sigma_{xz}^z$ and spin Hall angle in (001)-oriented IrMn$_3$ with respect to $\theta$;

FIGS. 13A to 13O show the current Induced out-of-plane spin accumulations in (III)-IrMn$_3$ for:
FIG. 13A bias current of I=−10 mA and $\theta=-45°$;
FIG. 13B bias current of I=−10 mA and $\theta=0°$;
FIG. 13C bias current of I=−10 mA and $\theta=45°$;
FIG. 13D bias current of I=−10 mA and $\theta=90°$;
FIG. 13E bias current of I=−10 mA and $\theta=135°$;
FIG. 13F bias current of I=0 mA and $\theta=-45°$;
FIG. 13G bias current of I=0 mA and $\theta=0°$;
FIG. 13H bias current of I=0 mA and $\theta=45°$;
FIG. 13I bias current of I=0 mA and $\theta=90°$;
FIG. 13J bias current of I=0 mA and $\theta=135°$;
FIG. 13K bias current of I=10 mA and $\theta=-45°$;

FIG. 13L bias current of I=10 mA and θ=0°;
FIG. 13M bias current of I=10 mA and θ=45°;
FIG. 13N bias current of I=10 mA and θ=90°;
and
FIG. 13O bias current of I=10 mA and θ=135°;
FIGS. 15A and 15B show the current dependence of HDP in (001)-IrMn$_3$ and (111)-IrMn$_3$, respectively;
FIGS. 16A to 16C show the two-dimensional HDP data in (001)-oriented IrMn$_3$ under the bias current I=−5 (FIG. 16A), 0 (FIG. 16B) and 5 mA (FIG. 16C) when shining linearly polarized light;
FIGS. 17A to 17F show Raman measurements and MOKE measurements, in which:
FIG. 17A shows the sample image of a Py disk on top of exfoliated WTe$_2$ flake.
FIG. 17B shows a typical angle-dependent polarized Raman spectra of WTe$_2$ flake/Py in the parallel-polarized configuration, by rotating the sample with respect to the excitation laser polarization direction;
FIG. 17C shows the representative angle-dependent Intensities of the A$_g$ (A$_1$) mode at ~212 cm$^{-1}$;
FIG. 17D shows the angular dependence of the normalized remanent magnetization;
FIG. 17E shows the magnetic hysteresis loops for an external magnetic field H along the hard axis;
and
  FIG. 17F shows the magnetic hysteresis loops for an external magnetic field H along the easy axis;
FIGS. 18A to 18D show ST-FMR measurements, in which:
FIG. 18A shows the sample geometry for the ST-FMR measurements;
FIG. 18B shows the ST-FMR spectra for the WTe$_2$ (19.6 nm)/Py (6 nm) device with the current;
FIG. 18C shows the ST-FMR signal from the WTe$_2$ (19.6 nm)/Py (6 nm) sample at 6 GHz;
and
  FIG. 18D shows the thickness dependent charge-to-spin conversion efficiency of WTe$_2$ from ST-FMR averaged between 6 and 7 GHz;
FIGS. 19A to 19D show SOT-driven magnetization switching measurements, in which:
FIG. 19A shows the sample schematic for MOKE measurements;
FIG. 19B shows the device image with electrodes and WTe$_2$ (80 nm)/Py region;
FIG. 19C shows the switching process captured by MOKE Images;
and
  FIG. 19D shows WTe$_2$ thickness-dependent switching current density J$_C$ in the WTe$_2$ layer;
FIGS. 20A to 20I show domain wall (DW) tilting Induced by the Interfacial DMI In WTe$_2$/Py, in which:
FIG. 20A shows the initial domain configuration without an external field;
FIG. 20B shows the domain configuration after a current pulse of 30 μs with J=3.89×10$^5$ A cm$^{-2}$;
FIG. 20C shows the domain configuration after a current pulse of 30 μs with J=4.53×10$^5$ A cm$^{-2}$;
FIG. 20D shows the initial domain configuration without an external field, where the current pulse is applied from the opposed direction;
FIG. 20E shows the domain configuration after a current pulse of 30 μs with J=3.89×10$^5$ A cm$^{-2}$, where the current pulse is applied from the opposed direction;
FIG. 20F shows the domain configuration after a current pulse of 30 μs with J=4.53×10$^5$ A cm$^{-2}$, where the current pulse is applied from the opposed direction;
FIG. 20G shows the DW tilt angle versus easy-axis external magnetic field H$_y$, for both experimental and micromagnetic simulation results;
FIG. 20H shows the micromagnetic simulation results of a 192-nm-wide wire with D=−1 mJ m$^{-2}$ and a J=3×10$^7$ A cm$^{-2}$;
and
  FIG. 20I shows the micromagnetic simulation result of a 192-nm-wide wire with D=−1 mJ m$^{-2}$ and an easy-axis external magnetic field H$_y$=±50 Oe;
FIGS. 21A to 21H show magnetic easy axis characterization in WTe$_2$/Py, in which:
FIG. 21A is an optical image of a first device, showing a scale bar of 20 μm;
FIG. 21B is the Raman spectra of the device of FIG. 21A;
FIG. 21C shows the magnetic hysteresis loop along the easy axis of the device of FIG. 21A;
FIG. 21d shows the magnetic hysteresis loop along the hard axis of the device of FIG. 21A;
FIG. 21E provides the optical Image of another device, showing a scale bar of 20 μm;
FIG. 21F is the Raman spectra of the device of FIG. 21E;
FIG. 21G shows the magnetic hysteresis loop along the easy axis of the device of FIG. 21E;
and
  FIG. 21H shows the magnetic hysteresis loop along the hard axis of the device of FIG. 21E;
(FIG. 22A) in-plane damping-like torque τ$_∥$×w/I$_{rf}$;
(FIG. 22B) shows out-of-plane field-like torque τ$_⊥$×w/I$_{rf}$;
(FIG. 22C) shows spin conductivity as a function of WTe$_2$ thickness (data averaged between 6 and 7 GHz);
and
  (FIG. 22D) provides the planar Hall signal of the WTe$_2$ (58 nm)/Py (6 nm) device at different in-plane external fields;
(FIG. 23A) the effective charge-to-spin conversion efficiency obtained at 6 and 7 GHz;
(FIG. 23B) the ST-FMR spectra for the WTe$_2$ (122 nm)/Py (6 nm) device with the current in the b-axis;
(FIG. 23C) provides the ST-FMR signal fit at 6 GHz showing the symmetric (V$_s$) and antisymmetric (V$_a$) Lorentzian contributions;
and
  (FIG. 23D) shows the J$_{S,rf}$/J$_{C,rf}$ value obtained at frequencies from 5.5 to 7.5 GHz;
FIGS. 25A to 25C show:
(FIG. 25A) the vibrating sample magnetometer (VSM) measurement results;
(FIG. 25B) shows the effective charge-to-spin conversion efficiency in WTe$_2$ from the switching current density;
and
  (FIG. 25C) Illustrates the total switching current I$_C$ as a function of WTe$_2$ thickness;
FIGS. 26A to 26E show the current-driven magnetization switching measurements on WTe$_2$/Py sample, in which:
(FIG. 26A) is a measurement schematic with scale bar of 10 μm;
  MOKE images of the device are provided with Injection of current pulses from the left terminal of the device as magnetization is switched from the +y direction (FIG. 26B) to the −y direction (FIG. 26C); and
  showing no switching takes place from the −y direction (FIGS. 26D and 26E) even when a large current density of 1.1×10$^6$ A cm$^{-2}$ is applied from the left terminal of the device;
(FIG. 27A) the in-plane Oersted field H$_{Oe}$ in different samples based on the equation H$_{Oe}$=μ$_0$J$_C$t/2;
and (FIG. 27B) simulations of the y and z component of the Oersted field generated by the current through the WTe$_2$ layer as a function of Y position in the WTe$_2$ (43.3 nm)/Py (6 nm) sample based on Blot-Savart law (dashed lines Indicate the boundary of the WTe$_2$ layer);

FIGS. 28A to 28D provide the current-driven magnetization switching measurements on the Cu/Py sample, in which:
(FIG. 28A) J=0×10$^5$ A cm$^{-2}$;
(FIG. 28B) J=2.97×10$^7$ A cm$^{-2}$;
(FIG. 28C) J=0×10$^5$ A cm$^{-2}$, where the current pulse is applied from the opposed direction; and
(FIG. 28D) J=2.97×10$^7$ A cm$^{-2}$, where the current pulse is applied from the opposed direction;

FIGS. 29A to 29E show the current-driven magnetization switching measurements on a WTe$_2$/Py sample with currents along the a-axis, in which:
MOKE images of the device are shown with Injection of current pulses from the left terminal, the magnetization being switched from the +y direction (FIG. 29A) to the −y direction (FIG. 29B); and
MOKE images of the device with Injection of current pulses from the right terminal, the magnetization being switched from the −y direction (FIG. 29C) to the +y direction (FIG. 29D); and
(FIG. 29E) is the simulated critical switching current density and switching time versus the ratio of the out-of-plane damping-like SOT over the in-plane damping like SOT;

FIGS. 30A to 30D show the current-driven magnetization switching measurements on the Pt (6 nm)/Py sample, in which:
(FIG. 30A) J=0×10$^5$ A cm$^{-2}$;
(FIG. 30B) J=2.97×10$^7$ A cm$^{-2}$;
(FIG. 30C) J=0×10$^5$ A cm$^{-2}$, where the current pulse is applied from the opposed direction; and
(FIG. 30D) J=2.97×10$^7$ A cm$^{-2}$, where the current pulse is applied from the opposed direction;

FIGS. 31A and 31B show the DW tilting on a WTe$_2$ (62 nm)/Py (6 nm) sample driven by external magnetic field and current, respectively;

FIGS. 32A to 32D show the DW tilting on WTe$_2$ (14 nm)/Py (6 nm) sample driven by external magnetic field, with the DW moving left to right and external magnetic field in the y-direction (FIG. 32A) and in the −y-direction (FIG. 32C), and the DW moving right to left and external magnetic field in the y-direction (FIG. 32D) and in the −y-direction (FIG. 32B). The size of the channel is 8 μm×30 μm;

FIGS. 34A and 34B show micromagnetic simulations of DW motion without DMI, in which:
FIG. 34A shows the DW configuration when a current density of 3×10$^7$ Acm$^{-2}$ in the x-axis is applied; and
FIG. 34B shows a micromagnetic simulation of a 192-nm-wide wire in the absence of DMI when an easy-axis magnetic field H$_y$=50 Oe is applied;

FIGS. 38A to 38D illustrate micromagnetic simulations at different conditions, in which:
FIG. 38A shows the simulation for initial conditions of counter-clockwise DW with a negative DMI value;
FIG. 38B shows the simulation for initial conditions of counter-clockwise DW with a positive DMI value;
FIG. 38C shows the simulation for initial conditions of clockwise DW with a negative DMI value; and
FIG. 38D shows the simulation for initial conditions of clockwise DW with a positive DMI value;

FIGS. 40A to 40F show the in-plane second harmonic measurements on WTe$_2$ (58 nm)/Py (6 nm), in which:
FIGS. 40A and 40B show R$_{xy}^\omega$ and R$_{xy}^{2\omega}$ signals for I$_0$=5.5 mA and B$_{ext}$=150 Oe, respectively;
FIG. 40C shows R$_{FL+Oe}^{2\omega}$ as a function of $$\frac{1}{B_{ext}};$$

FIG. 40D shows a plot of R$_{cos\,\phi}^{2\omega}$ linearly proportional to B$_{ext}$, especially at larger field;
FIG. 40E shows R$_{xy}^{2\omega}$ at different B$_{ext}$ in a larger external field region; and
FIG. 40F shows magnitude of A versus B$_{ext}$.

DETAILED DESCRIPTION

Figure 2C:
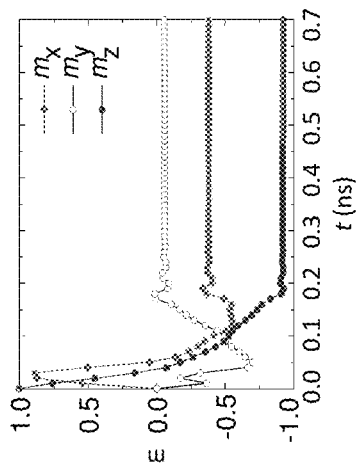

The present disclosure demonstrates field-free spin-orbit torque switching in magnetic devices that can significantly Improve the Integration, operation speed and power-efficiency of magnetic memory devices over known devices.

In the present disclosure, exemplary methods for a SOT-based field-free switching magnetic memory are described. The magnetization switching between "up" and "down" states is achieved by flowing electric currents in the absence of an external magnetic field. The SOT-based field-free switching operation can greatly Improve the density and scalability of magnetic memory over devices requiring an applied magnetic field. Furthermore, a lower energy consumption and faster operation speed of magnetic memory can be achieved in the proposed SOT-MRAM devices. The present Invention thus provides a significant technological advancement towards the commercial scalability and viability of magnetic memory.

The devices disclosed herein can be used in spintronic devices, and spintronic devices are also further described herein. Spintronics alms to develop spin-based logic and memory devices with high-energy efficiency and fast operational speed. The core of non-volatile magnetic memory or logic cell is a magnetic tunnel junction (MTJ) on top of electrical current lines (FIG. 1A), exhibiting fast operation and low energy consumption. As shown in the device 100 of FIG. 1A, a MTJ structure comprises a free magnetic layer 102, a non-magnetic layer (presently a tunnel barrier oxide layer 104), and a reference magnetic layer 106. The data writing process in a magnetic memory is realized by alternating the relative alignment of magnetization orientations between the free layer 102 and reference layer 106. The electrical resistance of a MTJ is low (high) with the parallel (antiparallel) alignment between two magnetic layers 102, 106. As such, the binary data can be written in a MTJ by switching the magnetization states of the free layer 102. For example, a high resistance state can represent '1' and a low resistance state can represent '0' (FIG. 1B). Meanwhile, the stored data can be read out by measuring the resistance state of the MTJ.

The parallel and anti-parallel alignments between two magnetic layers 102, 106 are achieved by switching the direction of the free layer 102 with respect to that of the reference layer 106. The current flowing through a MTJ can switch the free layer 102. This writing mechanism is called spin-transfer torque (STT). Due to the nature of non-volatility, STT-MRAM has been demonstrated as a candidate for the replacement of static random access memory. However, STT-MRAM suffers nanosecond-scale Incubation delay, read corruption (e.g. the 'read' operation results in data being Inadvertently written) and other issues limits the application of STT-MRAM.

SOT-MRAM can naturally overcome drawbacks that typically exist in a STT-MRAM device. The Incubation time is negligibly small in a SOT-MRAM device. Furthermore, the writing and reading of data are separated in the SOT-MRAM. In contrast to STT-MRAM, SOT-MRAM exhibits a faster access speed, lower energy consumption, better endurance, and fewer errors.

An SOT device 100 is shown in FIG. 1A. The device 100 includes a magnetic free layer 102 (i.e. with switchable magnetisation direction), reference layer 106 with a non-magnetic material (presently tunnel barrier 104) between layers 102 and 106. Writing operations are performed by applying a current between terminals T1 and T3. Read operations are performed by applying a current between terminals T1 and T2, and measuring the resistance across the MTJ. In a write operation, a charge current flowing in the plane of the bottom layer (between write terminals T1 and T3 in spin source layer 108), such as Ta, W, Pt and $Bi_2Se_3$, is converted to a spin current. The spin current accumulates at the Interface between the bottom spin source layer 108 and magnetic free layer 102, exerts a torque on the adjacent magnetic layer 102, and switches the magnetization states of the magnetic layer 102. In prior art devices, the SOT-Induced magnetization switching generally requires an in-plane external magnetic field to break the symmetry, if the magnetic layer 102 has perpendicular anisotropy. The presence of an external magnetic field causes problems in scaling down SOT devices as well as the high density Integration. Thus, achieving field-free switching in SOT-MRAM devices can greatly Increase the density and scalability of magnetic memory.

Presently, a field-free spin-orbit torque magnetization switching mechanism in a non-magnetic/ferromagnetic structure is proposed, where the current-induced out-of-plane spin accumulations from a non-magnetic material can effectively switch an adjacent ferromagnet in the absence of an external magnetic field. Further, examples below demonstrate two representative materials which can generate out-of-plane spins with an in-plane charge current. By employing scanning photovoltage microscope, current Induced out-of-plane spin accumulations are imaged in an antiferromagnet (001)-$IrMn_3$. Moreover, the examples provided herein demonstrate out-of-plane damping-like SOT from out-of-plane spins generated by $WTe_2$. The out-of-plane SOT in $WTe_2$ is further utilized to facilitate the damping-like magnetization switching in the in-plane magnetized system.

An out-of-plane spin current in SOT devices is used to achieve the deterministic switching without an external magnetic field. This field-free switching behaviour arises from the out-of-plane component of spin polarization of generated spin current that breaks the symmetry in deterministic SOT switching. Utilizing the current Induced out-of-plane spins, the field-free SOT switching mechanism is demonstrated.

The results described below, with reference to the figures, show SOT switching based on micromagnetic simulations. The SOT utilizes spin currents generated by spin-orbit Interactions to efficiently manipulate the magnetization. SOT is composed of two components, namely, the damping-like torque (DLT), $\tau_{DLT} \sim \hat{m} \times (\hat{m} \times \hat{s})$ and the field-like torque (FLT), $\tau_{FLT} \sim \hat{m} \times \hat{s}$, where $\hat{m}$ and $\hat{s}$ indicate the directions of the magnetization of the magnet and the spin polarization of the Incoming spin current, respectively. A spin current, generated from the bottom spin source layer 108 (FIG. 1A), is typically along the $\hat{y}$ direction. When the substantial magnetization $\hat{m}$ is orthogonal to the spin direction $\hat{y}$, torques (DLT and FLT) can be considered as equivalent fields with $\hat{m} \times \hat{y}$ symmetry ($H_{DLT}$) and $\hat{y}$ symmetry ($H_{FLT}$), respectively. The deterministic SOT switching in perpendicularly magnetized materials can be successfully explained by the DLT, as its $\hat{m} \times \hat{y}$ symmetry can break the $\hat{z}$-symmetry in total magnetic energy, in the out-of-plane direction. On the other hand, FLT is reported to affect the switching current density while FLT itself does not play a key role in determining the switching direction due to its $\hat{y}$-symmetry. Thus, an external magnetic field is required for achieving the deterministic switching in prior art devices.

As such, it is technologically Important to find materials that can generate this out-of-plane spin polarization, break the symmetry, eliminate the external magnetic field, and thus achieve the field-free switching.

To understand the effect of out-of-plane spins on the magnetization switching, micromagnetic simulations were performed on the SOT switching. Micromagnetic simulations are carried out by Mumax3 software, numerically solving the below equation Including the damping-like and field-like component of spin-orbit torques:

$$\frac{d\hat{m}}{dt} = -\gamma \mu_0 \hat{m} \times \hat{H}_{eff} + \alpha \hat{m} \times \frac{d\hat{m}}{dt} + \gamma \tau_{DLT} \hat{m} \times (\hat{m} \times \hat{s}) + \gamma \tau_{FLT} \hat{m} \times \hat{s} \quad (1)$$

where $\gamma$ is the gyromagnetic ratio, $\mu_0$ is the permeability of the vacuum, $\alpha$ is the damping constant, the damping-like torque $\tau_{DLT} = c_{DLT}(\eta J)/(2eM_s d)$ and field-like torque $\tau_{FLT} = c_{FLT}(\eta J)/(2eM_s d)$. The equivalent fields for $\tau_{DLT}$ and $\tau_{FLT}$ are defined as $H_{DLT} = -\tau_{DLT}(\hat{m} \times \hat{s})$ and $H_{FLT} = \tau_{FLT} \hat{s}$, respectively. The following parameters are used in the simulation: the saturation magnetization $M_s$ of 600 emu/cm$^3$, the exchange stiffness constant $A_{ex}$ of $1.3 \times 10^{-6}$ erg/m, and the damping $\alpha$ of 0.01. With reference to FIG. 2A, the magnetic anisotropy of the magnet 200 is set as perpendicular anisotropy along the z-axis with $K_u = 0.59 \times 10^6$ erg/cm$^3$. The direction of the spin current is set as (0, cos θ, sin θ), where θ is the canting angle of the out-of-plane component of the spin polarization in the yz plane (FIG. 2A). The dimension is 128 nm×128 nm×2 nm and the unit cell size is 2 nm×2 nm×2 nm. The magnet is set as a pillar with a diameter of 128 nm.

In particular, FIG. 2A Illustrates a spin torque device 202 comprising a magnetic layer (free layer) 200 having a switchable magnetisation direction along a first axis, and a spin source layer 204 adapted to generate a spin current from a current Injected along a second axis (x-axis) perpendicular to the first axis (y-axis). The material of the spin source layer 204 is selected such that electrons of different spins in the spin source layer 204 are rearranged by scattering so the spin current is generated in a plane (yz plane) perpendicular to the second axis and polarized at an angle (θ) to the first axis. As a result, the spin current diffuses into the magnetic layer 200 to produce spin torque to switch the magnetisation direction. Atop the free layer 200 is a reference or fixed layer 208 (shown in broken lines), with a non-magnetic (e.g. dielectric) barrier layer 210 (shown in broken lines). Layers 200, 208, 210 together form a MTJ. The spin source layer 204 is adjacent a first surface (lower surface in FIG. 2A) of the free layer 200, and the non-magnetic layer 210 may be against a second surface of the free layer 200—e.g. opposite the first surface. Notably, each of the layers presently described may be formed from multiple smaller layers, each of which may be the same or different material and the same or different magnetic anisotropy, without detracting from the present teachings. The non-magnetic layer 210 may also comprise a spacer layer or be adjacent a spacer layer, between layers 200 and 208.

The device 202 can be used in a spintronics device such as SOT-MRAM.

FIG. 2A thus Illustrates an arrangement comprising a magnetic pillar 200 with perpendicular magnetic anisotropy on top of a spin source or spin generation layer 204. Direct or pulsed currents are Injected from the spin source layer 204 along the x-axis. Arrow 206 denotes the direction of charge current and θ indicates the canting angle of out-of-plane spin, or polarization of the generated spin current, in the yz plane.

Figure 2B:
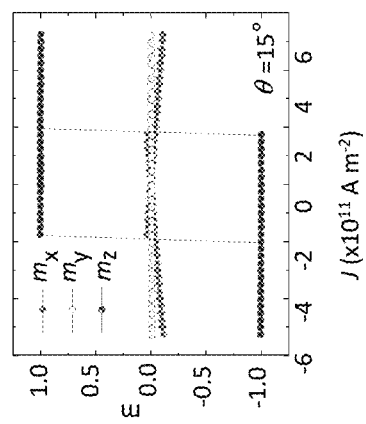
Figure 2A:
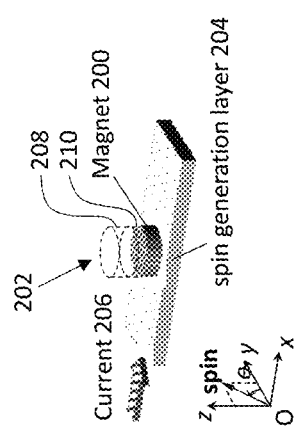

FIG. 2B shows the SOT Induced magnetization switching loop as a function of current density with θ=15°. Utilizing the out-of-plane spin polarization, a deterministic SOT switching scheme is achieved in the absence of an external magnetic field. When sweeping a charge current from $+J_{max}$ to $-J_{max}$, the average magnetization state of $m_z$ is switched from "up" state to "down" state, and is switched back to "up" state with the current sweeping from $-J_{max}$ back to $+J_{max}$ (FIG. 2B). Moreover, the polarity of switching loops can be controlled by changing the canting angle θ from positive to negative. The canting angle may be selected to correspond with a predetermined switching polarity. The critical switching $J_c$ is extracted from the magnetization switching. With a small component of out-of-plane spin current, a field-free deterministic switching is achieved. FIG. 2C shows the temporal evolution of the averaged out-of-plane magnetization ($m_z$). At the beginning of the simulation (t=0 ns), an 'up' state is Initialized. A reversed magnetization state is then gradually achieved by SOT as the simulation proceeds (for time >0 ns). A 'down' magnetization state is obtained at t~0.18 ns. Thus, the switching time can be acquired as Δt=0.18 ns.

Apart from the switching behaviour, two parameters Including the switching current density and switching time are very Important for applications. The power consumption of the device is mainly determined by the switching current density and the pulse duration while the operation speed of the device is mainly determined by the current pulse duration and switching time. As shown in FIG. 3A, increasing the canting angle of out-of-plane spins leads to a decrease of the critical switching current density by two orders of magnitude. The canting angle may therefore be selected to correspond with a predetermined switching current density. Meanwhile, the switching time shows a decrease with θ~1-20° in FIG. 3B. Therefore, the canting angle may also, or Instead, be selected to correspond with a predetermined switching time. Thus, an energy-efficient and fast operational magnetic device can be achieved with out-of-plane spins.

Thus, it is demonstrated that the out-of-plane spin generation can break the symmetry Inherent in previous SOT devices and realize the deterministic switching without an external magnetic field. By Increasing the canting angle θ to the out-of-plane of spin currents, the switching efficiency sharply Increases, and the critical switching current density and switching time decrease significantly.

The spin source layer 204 may be an antiferromagnetic layer. Thus, it is useful to demonstrate the observation of out-of-plane spin accumulations in a non-collinear antiferromagnet, presently (001)-IrMn$_3$, which shows a great potential for efficient switching the magnetization without an external magnetic field.

To observe out-of-plane spin accumulations, 8-nm-thick IrMn$_3$ thin films were deposited on MgO (001) substrates at room temperature in a high-vacuum direct current (d.c.) sputter deposition chamber—notably, various embodiments may employ an antiferromagnetic layer having one of (001), (010) and (100) orientation and the antiferromagnetic layer may be between, for example, 1 nm and 20 nm and other thicknesses depending on the desired application. Subsequently, an MgO (1 nm)/SiO$_2$ (3 nm) layer is radio frequency (rf) sputter deposited to protect IrMn$_3$ thin films from oxidation and degradation. The θ–2θ x-ray diffraction measurements show that IrMn$_3$ films grown on MgO substrates are oriented along (001)-facets (FIG. 4A). The thin films are then patterned into Hall bar devices with a length of 100 μm in the longitudinal direction, 40 μm in the transverse direction and the 10 μm of channel width by standard photolithography and Ar-ion milling techniques. Different length, height and width may be employed as needed. The film is capped with an MgO (1 nm)/SiO$_2$ (3 nm) layer to prevent degradation and oxidation—thus, a stack is formed comprising a capping layer (presently MgO) with the spin source later being between the capping layer and magnetic layer. Finally, top electrodes of Ta (5 nm)/Cu (100 nm)/Ru (5 nm) are deposited. Scanning photovoltage measurements are carried out by focusing a laser 400 at normal Incidence on the device while Injecting a DC bias current between electrode A and B into the device along the x axis (FIG. 4B). A circularly polarized laser is normally focused on the sample for such measurements.

Figure 5:
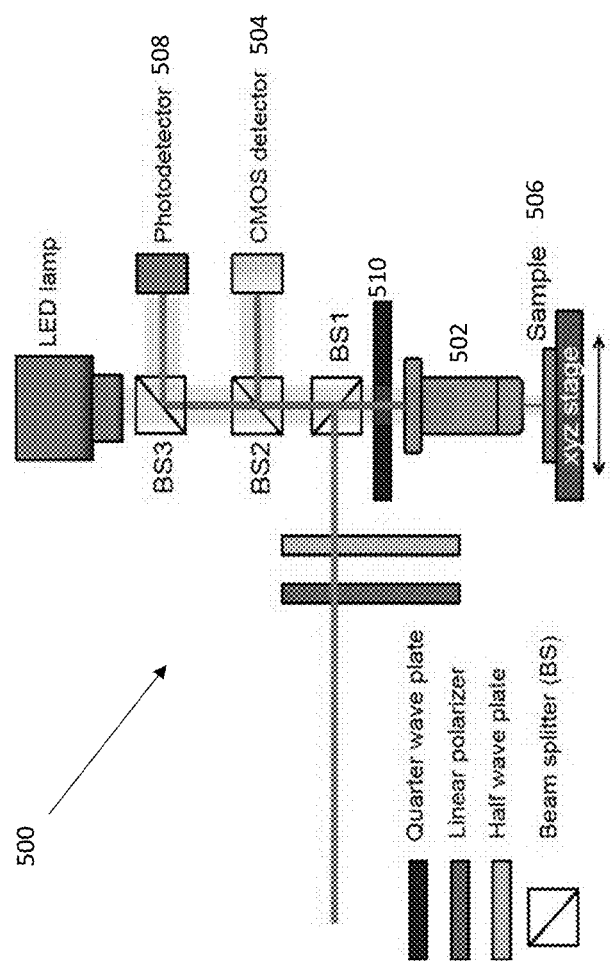
FIG. 5 provides a schematic of scanning photovoltage measurements.

The schematic diagram of a system 500 for scanning photovoltage measurements is shown in FIG. 5. A circularly polarized laser is normally focused on the sample. Two-dimensional Imaging is achieved by moving the device with a piezo stage while shining the laser. The photovoltage is read out via a lock-in amplifier of which the reference frequency is in phase with the chopper. In all experiments, laser light (wavelength λ=650 nm, power of pump laser beam $I_{pump}$=2.4 mW) is focused at normal Incidence onto (001)-oriented IrMn$_3$ using a 80× microscope objective lens 502. The spot size of laser is ~1.5 μm, and the laser is modulated by a chopper at a frequency of 572 Hz. One reflected laser beam is collected by a CMOS detector 504 to display the position of laser spot on the device 506, while a photodetector 508 is used to collect the other reflected laser beam to measure the reflectivity of the device. The polarization of the laser varies between left circularly polarized (LCP) and right circularly polarized (RCP) light by rotating the quarter waveplate 510. For present purposes, the difference between the photovoltages generated by RCP and LCP, namely the helicity dependent photovoltage (HDP), is defined as $V_\pm = V_{RCP} - V_{LCP}$. As a result, the difference between the absorption of LCP and RCP changes with respect to the local spin accumulation, which is then manifested by the sign and magnitude of the Induced HDP. The generated HDP between electrode A and B (FIG. 4B) is then sampled by a lock-In amplifier of which the reference frequency is in phase with the chopper. Two-dimensional Imaging is achieved by moving the device with a piezo stage while measuring the generated photovoltage at each laser spot.

FIGS. 6A to 6C show the scanning HDP data in a (001)-oriented $IrMn_3$ channel with Injecting the current along the [$\bar{1}$10] directions (e.g. In the (001)-plane). Channel boundaries are determined by the direct reflection image of the device. The black dashed lines Indicate the boundaries of device channel while the black arrows Indicate the bias current direction with the current density of $1.25 \times 10^7$ $A/cm^2$. There is no observable photovoltage under zero bias current (FIG. 6B), as there is no current Induced spin accumulation. The photovoltage is obtained not only along the device edges, but also on the entire surface of the device upon application of a finite bias current, contrary to the previous observations in semiconductors and heavy metals, where the out-of-plane spins accumulate only along the device edges. We also note that reversing the bias current direction causes the HDP to switch its sign. The out-of-plane spins have been manifested from $WTe_2$/permalloy and $NbSe_2$/permalloy systems by means of an electrical measurement such as ST-FMR, where the measured signal averages the whole channel, while the present data is the first measurement Involving the direct visualization of the out-of-plane spin accumulation generated on the surface of the device with an in-plane charge current. More Importantly, due to the significant out-of-plane spin accumulation generated from (001)-$IrMn_3$ with currents applying along the [$\bar{1}$10] direction, the present results evidence that the field-free magnetization switching of a magnetic layer may be achieved with a (001)-$IrMn_3$ spin source.

As shown in FIGS. 6A to 6C, the current Induced spin accumulation in the (001)-oriented $IrMn_3$ is Imaged. As shown, a significant out-of-plane spin accumulation is observed on the surface of (001)-oriented $IrMn_3$. The present results not only provide a better understanding of current Induced spin accumulation in an antiferromagnet $IrMn_3$ which cannot be understood from the conventional spin Hall scenario, but also pave a way for using antiferromagnetic materials for field-free magnetization switching.

The spin source layer 204 may exhibit broken crystalline Inversion symmetry. It is therefore demonstrated that two-dimensional (2D) material Td-phase tungsten telluride $WTe_2$ (referred to as $WTe_2$ hereafter) exhibiting broken crystalline Inversion symmetry can generate spin currents with an out-of-plane spin polarization component. Moreover, this is achieved with the spin source layer 204 being arranged such that the current is applied along a low-symmetry axis (the a-axis for $WTe_2$). These kind of 2D materials are promising candidates for use as spin current sources to achieve SOT field-free magnetization switching of magnetic memory and logic devices.

Figure 7A:
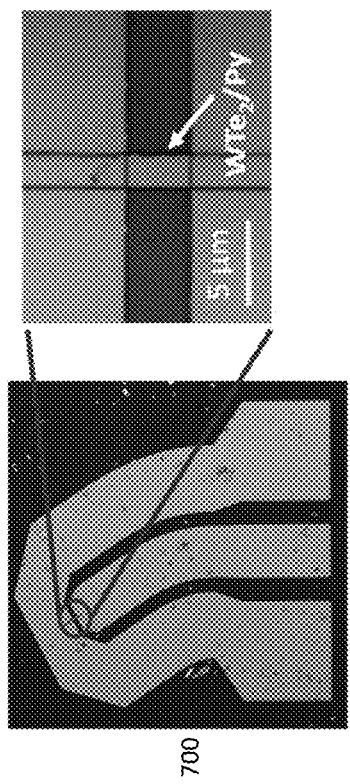

A spin current converted from a charge current in $WTe_2$ can exert SOTs to an adjacent ferromagnetic layer. When the current is Injected along the a-axis of $WTe_2$, due to the broken two-fold rotational symmetry and broken mirror symmetry, an out-of-plane spin is generated. This further gives rise to an out-of-plane damping-like SOT. To demonstrate this charge-to-spin conversion mechanism, a sample was prepared with the structure of $WTe_2$ (17.2 nm)/Py (6 nm) with currents Injected to the a-axis as shown in FIG. 7A.

The $WTe_2$ single crystal flake was exfoliated on a thermally oxidized silicon wafer with 300 nm $SiO_2$. The exfoliated sample was Immediately transferred into a high vacuum sputter chamber for deposition of 6 nm Py ($Ni_{81}Fe_{19}$) and 4 nm $SiO_2$ capping. The $WTe_2$ flake/Py/$SiO_2$ sample was patterned into rectangular bars by electron beam lithography (EBL) and Ion milling. Afterwards, a second-step of EBL and thermal evaporation were employed to form the Cr (30 nm)/Cu (100 nm) electrical contact pads.

The SOTs were then evaluated using spin-torque ferromagnetic resonance (ST-FMR). FIG. 7A shows a microscope image of the ST-FMR device 700. For the ST-FMR measurements, as schematically shown in FIG. 7B, a radio frequency (rf) current ($I_{rf}$) with a frequency of 9 GHz and a power of 13 dBm was applied along the x-axis (the a-axis of $WTe_2$) using a signal generator. An external magnetic field (H) was swept in the xy plane with an angle of 40° away from the x-axis. The Py magnetization precesses due to the rf current-induced torques Including the in-plane torque ($\tau_\parallel$) from the oscillating in-plane spin current and out-of-plane torque ($\tau_\perp$) from the oscillating rf current-induced Oersted field as well as the out-of-plane spin current.

Figure 7C:
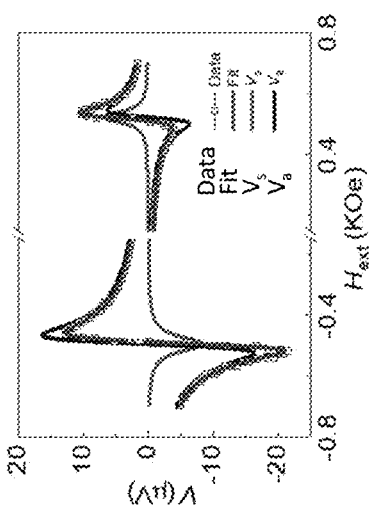
Figure 7B:
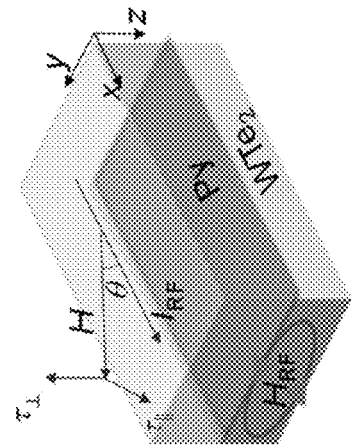

FIG. 7C shows the representative ST-FMR signal V for the $WTe_2$ (17.2 nm)/Py (6 nm) sample with the current Injected along the a-axis. The ST-FMR signal can be fitted by $V = V_s F_s + V_a F_a$, where $F_s$ and $F_a$ are symmetric and antisymmetric Lorentzian functions, as shown in FIG. 7C. The amplitudes of symmetric ($V_s$) and antisymmetric component ($V_a$) are proportional to the in-plane damping-like spin-orbit torque (SOT) ($\tau_\parallel$) and out-of-plane torque ($\tau_\perp$), respectively. From the fitted $V_s$ and $V_a$, the in-plane damping-like SOT $\tau_{81}$ ~0.131 Oe is obtained as well as out-of-plane torque $\tau_\perp$ (left side: −0.168 Oe, right side: 0.052 Oe) following the established analysis methods. $\tau_\perp$ (left)$=-\tau_A + \tau_B$ and $\tau_\perp$ (right)$=\tau_A + \tau_B$, where $\tau_A$ is the out-of-plane Oersted field torque and $\tau_B$ is the out-of-plane damping-like SOT from the out-of-plane spin. From the above relations, $\tau_A$ and $\tau_B$ are found to be 0.112 Oe and 0.056 Oe. Therefore, the torque ratios of $\tau_\parallel/\tau_A$ and $\tau_B/\tau_A$ are 1.18 and 0.51, respectively. The spin conductivity along the a-axis in our sample is $5.95 \times 10^3$ ($\hbar/2e$) $(\Omega m)^{-1}$, which is comparable to the value of $8 \pm 2 \times 10^3$ ($\hbar/2e$) $(\omega m)^{-1}$.

Thus, the out-of-plane damping-like torque can be obtained from the out-of-plane spin generated by the current flowing in the a-axis of $WTe_2$, which can be easily Identified from the asymmetric amplitudes of the $V_a$ components for the positive and negative resonance magnetic fields as shown in FIG. 7C ($V_a$).

Following the above, a $WTe_2$ (22 nm)/Py switching sample was fabricated with the magnetic easy axis parallel to the b-axis of the $WTe_2$ crystal by engineering the shape anisotropy and the charge current in the a-axis. The coercive field of this sample is 12 Oe. The magnetization of Py can be switched with a current density $J_C$ of $6.89 \times 10^5$ A $cm^{-2}$. The switching process is shown in FIGS. 8A to 8D.

The current-in-a-axis (I//a) sample can then be compared with current-in-b-axis (I//b) samples. The $J_C$ of $WTe_2$ (22 nm, I//a)/Py sample is ~20% and ~45% lower than that in $WTe_2$ (24 nm, I//b)/Py sample and $WTe_2$ (13 nm, I//b)/Py sample, respectively, indicating that the out-of-plane damping-like SOT can indeed make the switching more efficient. Subsequently, we perform the macrospin simulations to understand this switching process. The magnetization dynamics in our macrospin model is governed by the following equation with considering an additional out-of-plane damping-like SOT:

$$\frac{dm}{dt} = -\gamma m \times H_{eff} + \alpha m \times \frac{dm}{dt} - \qquad (2)$$
$$\gamma H_{SOT} m \times (m \times \sigma_y) - \gamma \beta_{perp} H_{SOT} m \times (m \times \sigma_z)$$

where $\beta_{perp}$ is the ratio of out-of-plane damping-like SOT ($-\gamma \beta_{perp} H_{SOT} m \times (m \times \sigma_z)$) over the in-plane damping-like SOT ($-\gamma H_{SOT} m \times (m \times \sigma_y)$), $\sigma_y$ is the in-plane spin polarization along the y axis, and $\sigma_z$ is the out-of-plane spin polarization. $\beta_{perp} \sim 0.5$ is previously reported. In the calculations, $\beta_{perp}$ was changed from 0 to 1. The damping constant is kept at 0.007 which was obtained from experiments. The simulated critical switching current density $J_C$ with respect to $\beta_{perp}$ is plotted in FIG. 8E. The out-of-plane damping-like SOT can assist the in-plane anti-damping switching when $\beta_{perp} < 0.58$. However, further Increasing $\beta_{perp}$ leads to magnetization precession without successful switching, which is similar to the magnetization oscillation at large current and large magnetic field in the spin-torque nano-oscillator. In the present system, the in-plane damping-like SOT tends to align the magnetization to the y-axis, whereas the out-of-plane damping-like SOT prefers the z-axis. Therefore, the competing effect between the two torques drives the magnetization into the oscillatory mode. In addition, as shown in FIG. 8E, the switching time decreases as a function of $\beta_{perp}$ and it is reduced by 32% when $\beta_{perp} = 0.5$.

The out-of-plane damping-like SOT can therefore be demonstrated from the out-of-plane spin generated by $WTe_2$. Similar teachings may be extended to other spin source layer materials in accordance with present teachings. The out-of-plane SOT was furthered utilized to facilitate the damping-like magnetization switching in the in-plane magnetized system. As evidenced by the macrospin simulations, both the switching current density and switching time can be greatly reduced with the help of the out-of-plane damping-like SOT. By engineering the magnetization tilting, the out-of-plane spin generated by $WTe_2$ can enhance the switching efficiency and realize the field-free SOT magnetization switching, as a promising candidate in further SOT-MRAM devices.

Figure 9:
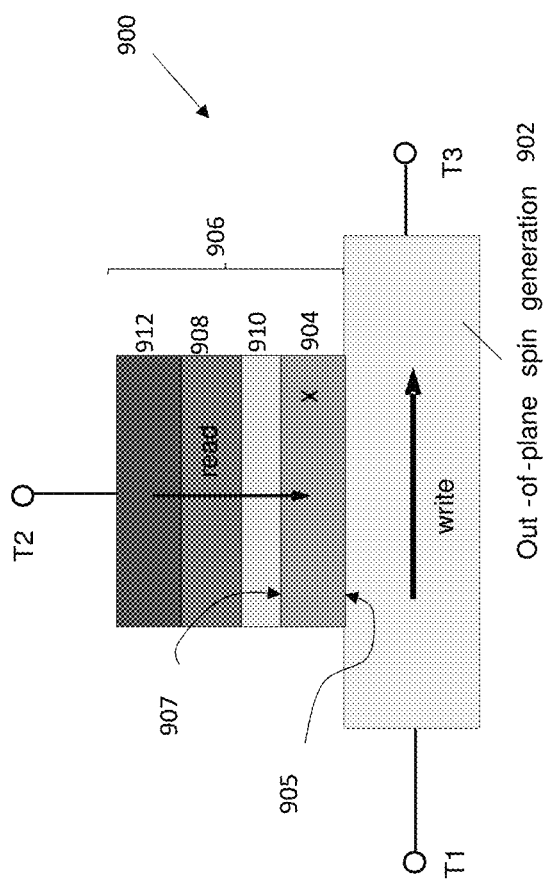
FIG. 9 shows schematics of SOT-MRAM based on out-of-plane spin generation.

The schematic stack of a spintronics device 900 utilizing the proposed out-of-plane spin generation from the bottom spin generation layer 902 is shown in FIG. 9, which provides a side view of a three-terminal MRAM based on the out-of-plane spin generation. The device 900 comprises a magnetic layer (free layer 904) having switchable magnetism direction along a first axis, a first surface 905 and opposite second surface 907. The spin source layer 902, adjacent first surface 905, is adapted to generate a spin current from a current Injected along a second axis (between T1 and T3) perpendicular to the first axis—presently, an in-plane writing current is Injected into the bottom layer from T1 to manipulate the magnetization of free layer 904, while the reading current is Injected from T2 to read the resistance of the junction 906 (between T1 and T2). A spacer layer or tunnel barrier 910 is adjacent the second surface 907, and a fixed layer 908 is positioned opposite the tunnel barrier 910 relative to the free layer 904. A capping layer 912 is also positioned in the device 900, with the fixed layer 908 between the capping layer 912 and tunnel barrier 910. As discussed above, electrons of different spins in the spin source layer 902 are rearranged so the spin current is generated in a plane perpendicular to the second axis and polarized at an angle to the first axis, so that the spin current diffuses into the magnetic layer 904 to produce spin torque to switch the magnetisation direction of the magnetic layer 904.

It is worth noting that the bottom layer 902 for out-of-plane spin generation is not limited to the aforementioned materials systems ($IrMn_3$ and $WTe_2$). Other strong spin-orbit Interaction systems with low-symmetry in crystal structures or transport properties can also lead to the out-of-plane spin generation. Furthermore, heterostructures with in-plane magnet and conductive space layer can also generate the out-of-plane spin current due to the spin procession. The generated spin current can efficiently manipulate the magnetization states of adjacent magnetic layers 904 and thus the electrical resistance between layers 904 and 908. The free layer 904 exhibiting perpendicular magnetic anisotropy may Include, but is not limited to, one or more of the following materials: ferromagnetic materials such as Fe, Co, Ni and their alloys, and CoFeB alloy; ferrimagnetic materials such as CoPd, CoTb, FeCoTb, FeCoGd, and CoGd alloys, and the multilayers $[Co/Tb]_n$, $[Co/Pd]_n$ and $[Co/Gd]_n$; ferromagnetic or ferrimagnetic Insulators, such as YIG; two-dimensional magnetic materials, such as $FeGeTe$ compounds and $VSe_2$.

The devices disclosed herein show current Induced SOT switching without an external magnetic field utilizing the out-of-plane spin generation. A strong enhancement of switching efficiency can be achieved with faster switching speed and lower energy-consumption. According to the operational speed, the proposed MRAM can be used in designing storage, static memory, cache memory and CPU core. It should be understood that various adaptations and modifications may be made to the techniques shown in the present disclosure. It should be appreciated that details Included in the various example embodiments are merely provided for purposes of Illustration, and are not Intended to limit the scope, applicability, or configuration of the invention. For example, it should be understood that the various elements described above may be made from differing materials, implemented in different combinations or otherwise formed or used differently without departing from the Intended scope of the invention.

The current Induced out-of-plane spin accumulation on the surface of an (001)-$IrMn_3$ antiferromagnet was further Investigated. In this regard, non-collinear antiferromagnetic materials can generate large spin currents, and thus manipulate magnetization efficiently. As described below, the current Induced spin accumulation was spatially imaged in the (001) and (111) oriented $IrMn_3$ antiferromagnets upon Injecting current along different crystallographic directions by scanning photovoltage microscopy. In contrast with traditional spin Hall effect in which the spins lie in-plane at the top surface of devices, a significant out-of-plane spin accumulation is observed on the device surface in (001)-oriented $IrMn_3$, while the out-of-plane spin accumulation is very small in (111)-oriented $IrMn_3$ antiferromagnets. In addition, the spin accumulation in (001)-oriented $IrMn_3$ depends strongly on the current flowing direction with respect to the crystallographic direction, which is not the case for (111)-oriented $IrMn_3$, in line with the calculated spin Hall conductivity. The maximum spin Hall angle of $IrMn_3$ (001) and $IrMn_3$ (111) are determined to be $\sim 0.083$ and $\sim 0.018$, respectively. The results of this Investigation facilitate Improved understanding of the current Induced spin accumulations in antiferromagnetic materials as well as suggest the proposed field-free switching mechanisms in an antiferromagnet/ferromagnet system.

Unveiling the current Induced spin textures in various materials is of great Importance to not only the fundamental understanding of spin-orbit coupling phenomena but also the practical application to new functional spintronics devices. Current Induced spin accumulations have been observed in semiconductors as well as heavy metals with magneto-optical Kerr effects and topological Insulators (TI) by means of the bilinear magnetoelectric resistance and scanning photovoltage microscopy. Further, Lorentz transmission electron microscopy has been used as a powerful tool to image chiral spin textures. Those spin textures are then utilized for switching the ferromagnets (FMs). Exploring materials with novel spin textures is of great Interest not only to the fundamental understanding of spin-orbitronics phenomena but also for efficient magnetization switching.

Some properties of antiferromagnets (AFs), such as pinning and hardening of ferromagnet layers, may be used for a variety of technological applications such as magnetic read heads and sensors. Moreover, non-collinear antiferromagnets may be show to provide an effective spin current source to manipulate the FM, leading to magnetic field-free SOT switching of neighbouring FMs.

Furthermore, there is wide variability in charge-to-spin conversion efficiencies in AFs as determined by means of spin-torque ferromagnetic resonance (ST-FMR), spin pumping and harmonic measurements. The facet-dependence of spin orbit torques in non-collinear $IrMn_3$ AFs, the negative spin Hall angles from epitaxial $Ir_{15}Mn_{85}$ as well as the spin Hall conductivities in the collinear and non-collinear AFs have been theoretically explored. However, direct visualization of the facet-dependent current Induced spin texture in the AFs has not been publicly explored. In addition, the experimental observation of crystallographic-direction-dependent current Induced spin accumulation has not been studied yet. Therefore, visualizing the anisotropic current Induced spin textures in AFs is of great Importance for a detailed understanding of anisotropic spin Hall phenomena and a better understanding of the magnetization switching mechanisms using AFs.

The Influence of crystal facet as well as the crystallographic direction on the current Induced spin accumulation in an AF, $IrMn_3$, system is desirable to study. To do so, the current Induced spin accumulation was imaged in a (001)-oriented and (111)-oriented $IrMn_3$ using scanning photovoltage microscopy. In contrast to the conventional spin Hall phenomena in which the in-plane spin accumulation at the top surface of the channel is Induced by the in-plane charge current, the results in the present Instance showed significant current Induced out-of-plane spin accumulation at the top surface of the device in (001)-oriented $IrMn_3$. The out-of-plane spin accumulation shows the maximum with currents applied along the [$\bar{1}$10] direction. In contrast, the out-of-plane spins accumulate only along the edges of the channel in (111)-oriented $IrMn_3$, similar to previous observations in semiconductors, TIs, and heavy metals. The maximum spin Hall angle of the (001)- and (111)-oriented $IrMn_3$ Is ~0.083 and ~0.018, respectively. The present results show the great potential of using (001)-$IrMn_3$ to achieve field-free magnetization switching in AF/FM bilayer systems when a charge current is applied along the [$\bar{1}$10] direction. Furthermore, it is demonstrated herein that the current Induced spin accumulations depend on the facet as well as the crystallographic direction in $IrMn_3$, thus providing a better understanding of anisotropic spin Hall physics in AFs.

Figure 10B:
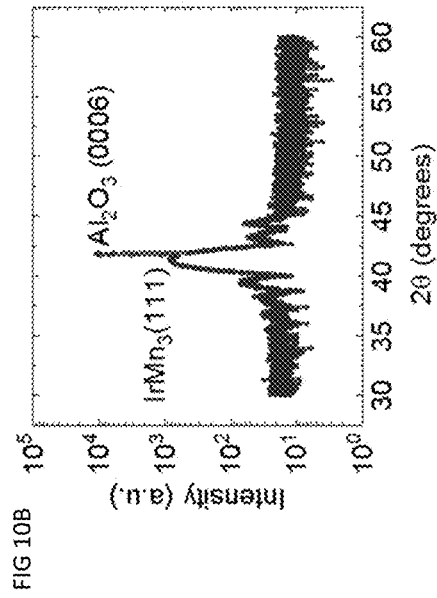
Figure 10D:
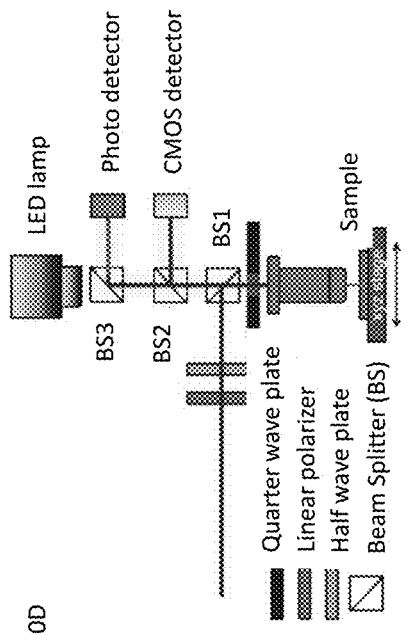
Figure 10A:
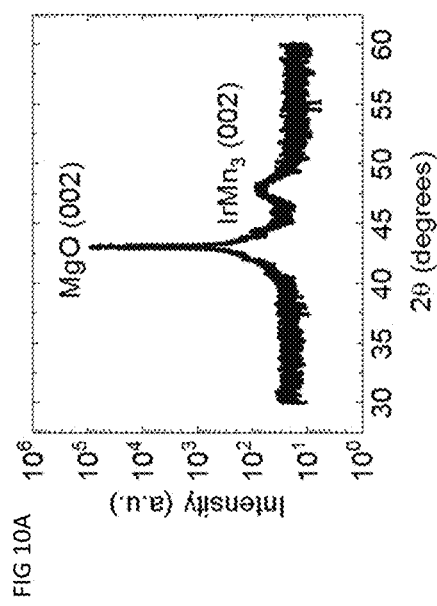
Figure 10C:
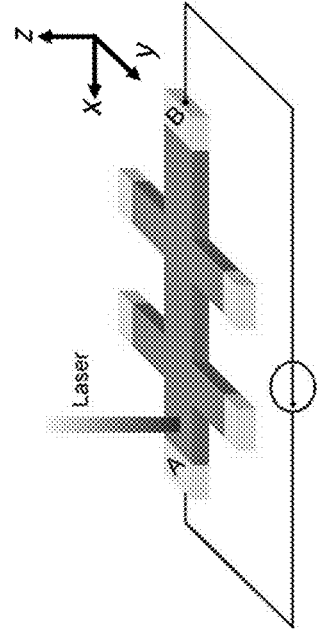

Again, 8-nm-thick $IrMn_3$ thin films were deposited on MgO (001) substrates and $Al_2O_3$ (0001) substrates at room temperature in a high-vacuum direct current sputter deposition chamber. Subsequently, a MgO (1 nm)/$SiO_2$ (3 nm) layer was rf sputter deposited to protect or cap the $IrMn_3$ thin films from oxidation and degradation. The θ-2θ x-ray diffraction measurements show that $IrMn_3$ films grown on MgO and $Al_2O_3$ substrates are oriented along (001)- and (111)-facets, respectively (FIGS. 10A and 10B). The thin films were then patterned into Hall bar devices along different crystallographic directions with a length of 100 μm in the longitudinal direction, 40 μm in the transverse direction and the 10 μm of channel width by standard photolithography and Ar-ion milling techniques. Finally, top electrodes of Ta (5 nm)/Cu (100 nm)/Ru (5 nm) were deposited. Scanning photovoltage measurements were carried out by focusing a laser at normal Incidence on the device while Injecting a DC bias current between electrode A and B into the device along the x axis (FIG. 10C), being the same setup as previously described with reference to FIG. 5 with the same parameters and controls applied.

Following from FIGS. 6A to 6C, FIGS. 11A to 11O show the scanning HDP data in a (001)-oriented $IrMn_3$ channel with Injecting the current along different crystallographic directions. θ is defined as the angle between [$\bar{1}$10] and the applied bias current direction in the (001)-plane. It is shown that the HDP image with θ=−45°, 0°, 45°, 90° and 135°. θ=0° corresponds to the bias current applied through [$\bar{1}$10] direction in (001)-plane. It is of particular note that the case of θ=135° is equivalent to the current reversed case of θ=−45° (i.e., θ=135° with I=10 mA is the same as the case of θ=−45° with I=−10 mA). Channel boundaries are determined by the direct reflection image of the device. The black dashed lines Indicate the boundaries of device channel while the black arrows Indicate the bias current direction with the current density of $1.25 \times 10^7$ A/cm$^2$. There is no observable photovoltage under zero bias current, as there is no current Induced spin accumulation. The photovoltage is obtained on the entire surface of the device upon application of a finite bias current, contrary to the previous observations in semiconductors, HM, and TI where the out-of-plane spins accumulate only along the device edges.

Consistent with the discussion of FIGS. 6A to 6C, it is also notable that reversing the bias current direction causes the HDP to switch its sign. The out-of-plane spin accumulations is the strongest in case of θ=0° and weakest in θ=90°. The out-of-plane spins have been manifested from $WTe_2$/permalloy and $NbSe_2$/permalloy systems by means of an electrical measurement such as ST-FMR where the measured signal averages the whole channel, while our work serves as the first report Involving the direct visualization of the out-of-plane spin accumulation generated on the surface of the device with an in-plane charge current. More Importantly, due to the significant out-of-plane spin accumulation generated from (001)-$IrMn_3$ with currents applying along the [$\bar{1}$10] direction (θ=0), our results suggest that the field-free magnetization switching could possibly be achieved with in (001)-$IrMn_3$ based AF/FM systems.

The laser is then fixed at the center of the device to measure the HDP by sweeping the bias current. The linear relationship of HDP with respect to the bias current confirms that our observation is a current Induced effect (FIG. 15A). Furthermore, we Investigate the Influence of light polarization on the HDP. There is no observable signal either without or with the bias current when shining linearly polarized light (FIGS. 16A to 16C). As shown in FIGS. 16A to 16C, the bias current is applied through the [$\bar{1}$10] direction in the (001)-plane. There is negligible HDP either without or with the bias current.

Figures 12A, 12B:
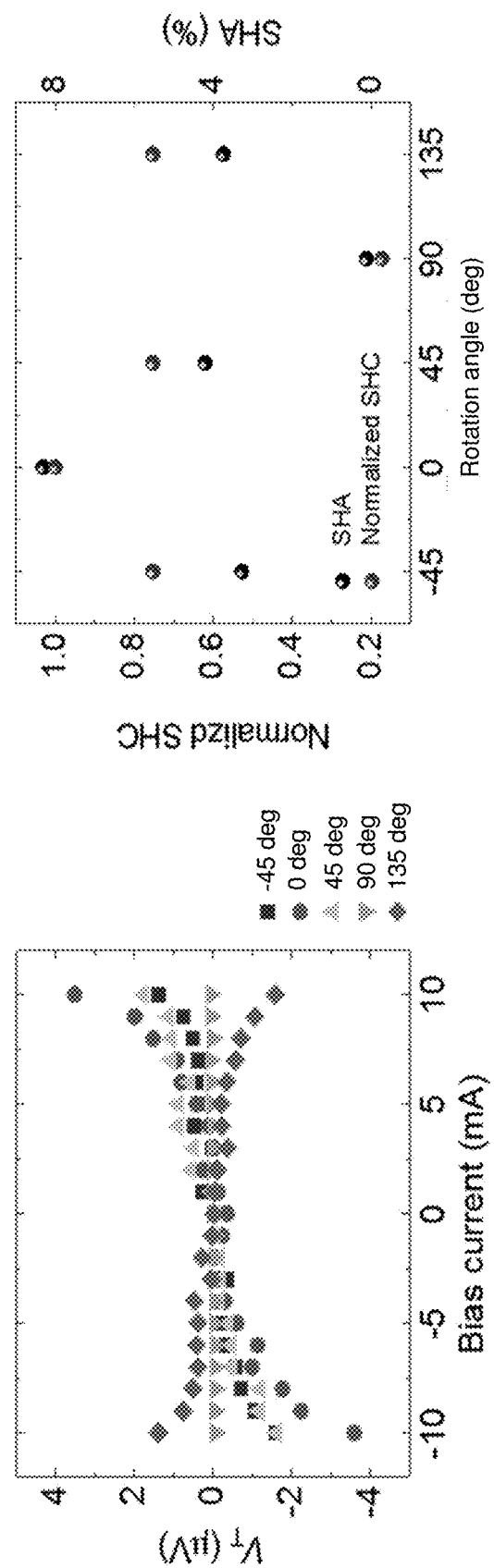

In order to better understand the surface out-of-plane spin accumulation, the spin Hall conductivity $\sigma_{ij}^k$ was employed using ab initio calculations in (001)-oriented IrMn$_3$, in which the spin current, charge current and spin polarization are along the i, j and k direction, respectively. The spin current $J_{si}^k$ generated by an electric field $E_j$ can be expressed as $J_{si}^k = \Sigma_j \sigma_{ij}^k E_j$ where $J_{si}^k$ represents the spin current flowing along the i direction with the spin polarization along the k direction, $E_j$ represents the electric field along the j direction and $\sigma_{ij}^k$ represents the spin Hall conductivity (SHC). It is worth noting that the $\sigma_{ij}^k$ is a third-order tensor with (i, j, k)=(x, y, z). Firstly, the SHC is calculated when the current is applied along the [$\bar{1}$10] direction as shown in the case of θ=0° of Table 1. In addition, a transformation matrix can then be applied to achieve any arbitrary rotation between two SHC tensors according to:

$$\sigma_{ij}^{s,k} = \sum_{l,m,n} D_{il} D_{jm} D_{kn} \sigma_{ln}^{s,n} \quad (3)$$

where $D_{il}$, $D_{jm}$ and $D_{kn}$ are the elements of the rotation matrix D. Equation (3) can be used to calculate the SHC with varying θ in the case of (001)-oriented IrMn$_3$ (Table 1). Following the present experimental configuration, the value of $\sigma_{zx}^z$ is particularly Important, where the charge currents along the x direction generate out-of-plane spin currents (z axis) with spin polarizations along the z axis. As can be seen from Table 1, the calculated $\sigma_{zx}^z$ shows the maximum value with θ=0° and zero with θ=90° in (001)-oriented IrMn$_3$.

voltage $V_T$ in (001)-oriented IrMn$_3$ as a function of bias current with different θ, and FIG. 12B is the normalized SHC $\sigma_{xy}^z + \sigma_{xz}^z$ and spin Hall angle in (001)-oriented IrMn$_3$ with respect to θ.

The spin Hall angle (SHA) in (001)-oriented IrMn$_3$ is calculated where the HDP is detected along the transverse direction. The circularly polarized light is normally Incident on the device to excite the out-of-plane spin polarized carriers and thus the spin-dependent transverse voltage $V_T$ is generated due to the Inverse spin Hall effect. To avoid the Influence of the laser position on the spin Hall angle characterization, we Increase the laser spot size to ~10 μm such that the laser spot fully covers the cross section of the Hall bar devices. The spin Hall angle is defined as $\theta_{sh} = \sigma_{sh}/\sigma_N$, where $\sigma_{sh}$ and $\sigma_N$ are the spin Hall conductivity and device charge conductivity, respectively. The transverse electric field generated by the Inverse spin Hall effect can be written as $E_\perp = \rho_{sh}(J_s \times \sigma) = \theta_{sh} \rho_N (J_s \times \sigma)$, where $J_s$ is the spin current density and σ is the spin-polarization unit vector. The spin current density can be further replaced by $J_s = J_{//} P$, where $J_{//}$ is the bias current density and P is the carrier spin polarization. Finally, the magnitude of transverse electric field can be substituted by $E_\perp = V_T/w$ and thus $V_T = \theta_{sh} \rho_N w J_{//} P$, where w is the device channel width.

Next, $V_T$ is measured with respect to the bias current as shown in FIG. 12A in (001)-oriented IrMn$_3$ with different θ. Under the same amount of the bias currents, the magnitude of the $V_T$ changes with θ and shows the maximum at θ=0°. In order to estimate the spin Hall angle in (001)-oriented IrMn$_3$, we need to obtain the carrier spin polarization (P),

TABLE 1

| | $\sigma^x$ | | | $\sigma^y$ | | | $\sigma^z$ | | |
|---|---|---|---|---|---|---|---|---|---|
| | $\begin{pmatrix} \sigma_{xx}^x & \sigma_{xy}^x & \sigma_{xz}^x \\ \sigma_{yx}^x & \sigma_{yy}^x & \sigma_{yz}^x \\ \sigma_{zx}^x & \sigma_{zy}^x & \sigma_{zz}^x \end{pmatrix}$ | | | $\begin{pmatrix} \sigma_{xx}^y & \sigma_{xy}^y & \sigma_{xz}^y \\ \sigma_{yx}^y & \sigma_{yy}^y & \sigma_{yz}^y \\ \sigma_{zx}^y & \sigma_{zy}^y & \sigma_{zz}^y \end{pmatrix}$ | | | $\begin{pmatrix} \sigma_{xx}^z & \sigma_{xy}^z & \sigma_{xz}^z \\ \sigma_{yx}^z & \sigma_{yy}^z & \sigma_{yz}^z \\ \sigma_{zx}^z & \sigma_{zy}^z & \sigma_{zz}^z \end{pmatrix}$ | | |
| θ = −45° | $\begin{pmatrix} 0 & 68 & -67 \\ 241 & 2 & 75 \\ -240 & -75 & -3 \end{pmatrix}$ | | | $\begin{pmatrix} -2 & -241 & -75 \\ -68 & 0 & 67 \\ 75 & 240 & 3 \end{pmatrix}$ | | | $\begin{pmatrix} 3 & 75 & 240 \\ -75 & -3 & -240 \\ 67 & -67 & 0 \end{pmatrix}$ | | |
| θ = 0° | $\begin{pmatrix} -216 & 0 & 0 \\ 0 & 220 & 8 \\ 0 & -315 & -4 \end{pmatrix}$ | | | $\begin{pmatrix} 0 & -124 & -147 \\ 121 & 0 & 0 \\ -165 & 0 & 0 \end{pmatrix}$ | | | $\begin{pmatrix} 0 & 78 & 340 \\ -72 & 0 & 0 \\ 95 & 0 & 0 \end{pmatrix}$ | | |
| θ = 45° | $\begin{pmatrix} 0 & -68 & 67 \\ -241 & 2 & 75 \\ 240 & -75 & -3 \end{pmatrix}$ | | | $\begin{pmatrix} 2 & -241 & -75 \\ -68 & 0 & -67 \\ 75 & -240 & -3 \end{pmatrix}$ | | | $\begin{pmatrix} -3 & 75 & 240 \\ -75 & 3 & 240 \\ 67 & 67 & 0 \end{pmatrix}$ | | |
| θ = 90° | $\begin{pmatrix} 0 & 121 & 0 \\ -124 & 0 & 142 \\ 0 & 165 & 0 \end{pmatrix}$ | | | $\begin{pmatrix} 220 & 0 & -8 \\ 0 & -216 & 0 \\ 315 & 0 & -4 \end{pmatrix}$ | | | $\begin{pmatrix} 0 & 72 & 0 \\ -78 & 0 & 340 \\ 0 & 95 & 0 \end{pmatrix}$ | | |
| θ = 135° | $\begin{pmatrix} 0 & -68 & -67 \\ -241 & -2 & 75 \\ -240 & -75 & 3 \end{pmatrix}$ | | | $\begin{pmatrix} 2 & 240 & -75 \\ 68 & 0 & 67 \\ 75 & 240 & -3 \end{pmatrix}$ | | | $\begin{pmatrix} 3 & 75 & 240 \\ -75 & -3 & 240 \\ -67 & 67 & 0 \end{pmatrix}$ | | |

The calculated results of spin Hall conductivity (SHC) with different θ in (001)-oriented IrMn$_3$, where θ denotes the angle between the bias current and the [$\bar{1}$10] direction in the (001)-plane.
The SHC is in the unit of (h/e) (S/cm).

FIGS. 12A and 12B show the current and crystallization direction dependence of the spin accumulations in (001)-IrMn$_3$, respectively, in which FIG. 12A is the transverse which can be expressed as $P = G P_0 \tau_s/n_e$ with the spin lifetime $\tau_s$, initial spin-polarization $P_0$, the optically excited electron density rate G, and the total electron density $n_e$. The spin lifetime $\tau_s$ is reported to be ~1 ps. The optically excited electron density can be written as $$G = \alpha n_p (1-R)/d \int_0^d e^{-\alpha z} dz$$

with $\alpha$ is the absorption coefficient, $n_p$ is the irradiated photon density per unit time, R is the reflectance of the sample, d is the sample thickness and z is the variable of the sample thickness direction. R is taken to be 0.24 and $\alpha$ to be $1 \times 10^6$ cm$^{-1}$ in (001)-oriented IrMn$_3$ thin film as reported from the previous studies. The case of $\theta = 0°$ is then used as an example for the spin Hall angle calculation in (001)-oriented IrMn$_3$. The photoexcited spin polarized carrier density can be estimated as $8.33 \times 10^{19}$ m$^{-3}$. The initial out-of-pane spin polarization $P_0$ in IrMn$_3$ is estimated to be ~0.015. The transverse voltage $V_T$ is 3.51 μV under a bias current of 10 mA (FIG. 12A). Thus, the spin Hall angle $\theta_{sh}$ is calculated to be ~0.083 with $\theta = 0°$. SHA can be evaluated with different $\theta$ as shown in FIG. 12B and compared with the calculated SHC. It is worth noting that two tensor components $\sigma_{xy}^z$ and $\sigma_{xz}^z$ were considered based on the experimental configuration. The trend of measured SHA with different crystallographic directions is in line with the calculated SHC, $\sigma_{xy}^z + \sigma_{xz}^z$, in FIG. 12B.

By performing similar measurements in (111)-oriented IrMn$_3$, the facet-dependent behavior of the current Induced spin accumulation can be described. As shown in FIGS. 13A to 13O, the photovoltage is obtained with opposite sign near the two opposing edges and changes its sign when reversing the bias current. This is in line with the conventional spin Hall effect observed in semiconductors, topological Insulators and heavy metal systems. There is a negligible signal with zero bias current. Furthermore, the HDP is proportional to the bias current, indicating the current Induced effect (FIG. 15B). The current Induced spin accumulation is then measured by varying $\theta$ in the (111)-plane. The spins accumulate near the edge of the channel and show the opposite sign near two opposing edges with $\theta = -45°, 0°, 45°, 90°$ and $135°$. The photovoltage shows no clear dependence on $\theta$, suggesting that the current Induced spin accumulation does not vary with $\theta$ in (111)-oriented IrMn$_3$, consistent with the constant value of the calculated SHC $\sigma_{xy}^z$ and the zero value of $\sigma_{zx}^z$.

FIGS. 13A to 13O show two-dimensional HDP data in (111)-oriented IrMn$_3$ under the bias current I=−10 (a-e), 0 (f-j) and 10 mA (k-o) with $\theta = -45°$ (FIGS. 13A, 13F and 13K), 0° (FIGS. 13B, 13G and 13L), 45° (FIGS. 13C, 13H and 13M), 90° (FIGS. 13D, 13I and 13N) and 135° (FIGS. 13E, 13 and 13O). $\theta = 0°$ corresponds to the bias current applied along the [$\bar{1}$10] direction in the (111)-plane. Note that the case of $\theta = 135°$ is equivalent to the current reversed case of $\theta = -45°$ (i.e., $\theta = 135°$ with I=10 mA is the same as the case of $\theta = -45°$ with I=−10 mA). Black dashed lines Indicate the edges of the device while black arrows Indicate the current direction.

Figures 14A, 14B:
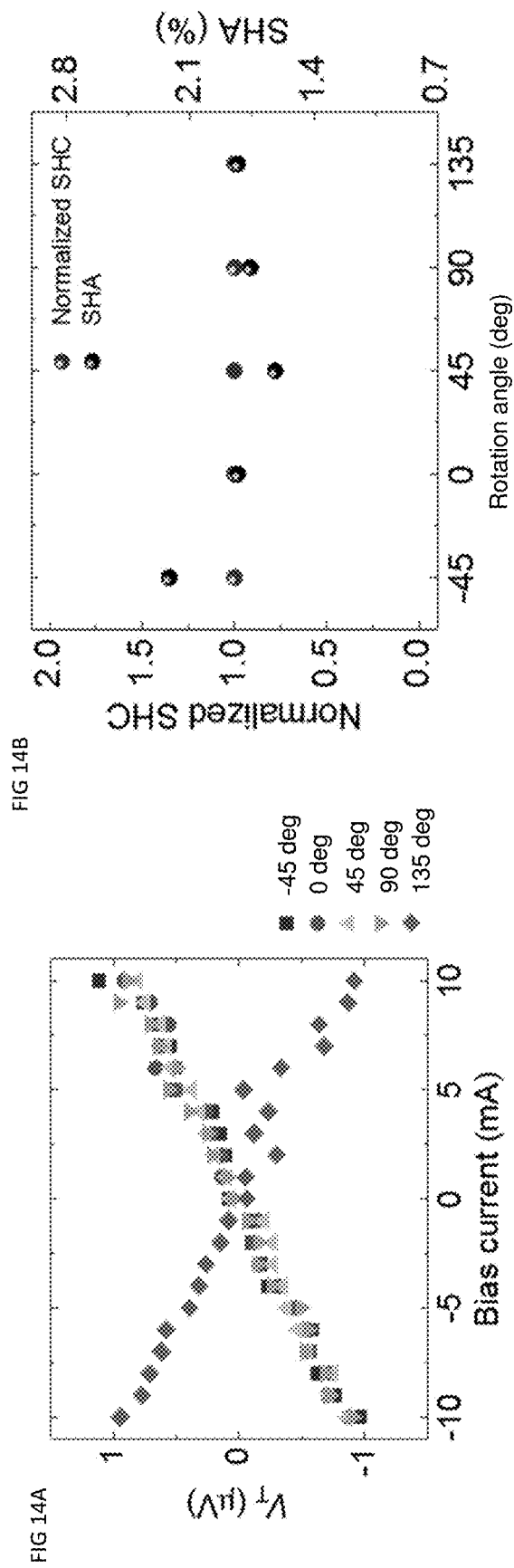
FIGS. 14A and 14B show the current and crystallization direction dependence of the spin accumulations in (111)-IrMn$_3$, respectively.

Lastly, the spin Hall angle in the (111)-oriented IrMn$_3$ is evaluated for different $\theta$. The $V_T$ shows no clear dependence on $\theta$ (FIG. 14A). The case of $\theta = 0°$ can be used as an example for the spin Hall angle calculation in (111)-oriented IrMn$_3$. The photoexcited spin polarized carrier density can be estimated as $8.33 \times 10^{19}$ m$^{-3}$. The initial out-of-pane spin polarization $P_0$ in IrMn$_3$ is estimated to be ~0.015. The transverse voltage $V_T$ is 0.9 μV under a bias current of 10 mA (FIG. 14A). Thus, the spin Hall angle $\theta_{sh}$ is calculated to be ~0.018. It is noteworthy that the spin Hall angle shows an almost constant value of ~0.018 with different $\theta$ (FIG. 14B), consistent with the calculated SHC $\sigma_{xy}^z + \sigma_{xz}^z$ (Table 2).

TABLE 2

| | $\sigma^x$ | $\sigma^y$ | $\sigma^z$ |
|---|---|---|---|
| | $\begin{pmatrix} \sigma_{xx}^x & \sigma_{xy}^x & \sigma_{xz}^x \\ \sigma_{yx}^x & \sigma_{yy}^x & \sigma_{yz}^x \\ \sigma_{zx}^x & \sigma_{zy}^x & \sigma_{zz}^x \end{pmatrix}$ | $\begin{pmatrix} \sigma_{xx}^y & \sigma_{xy}^y & \sigma_{xz}^y \\ \sigma_{yx}^y & \sigma_{yy}^y & \sigma_{yz}^y \\ \sigma_{zx}^y & \sigma_{zy}^y & \sigma_{zz}^y \end{pmatrix}$ | $\begin{pmatrix} \sigma_{xx}^z & \sigma_{xy}^z & \sigma_{xz}^z \\ \sigma_{yx}^z & \sigma_{yy}^z & \sigma_{yz}^z \\ \sigma_{zx}^z & \sigma_{zy}^z & \sigma_{zz}^z \end{pmatrix}$ |
| $\theta = -45°$ | $\begin{pmatrix} 153 & 153 & 0 \\ 153 & -153 & 318 \\ 0 & -5 & 0 \end{pmatrix}$ | $\begin{pmatrix} 153 & -153 & -318 \\ -153 & -153 & 0 \\ 5 & 0 & 0 \end{pmatrix}$ | $\begin{pmatrix} 0 & 98 & 0 \\ -98 & 0 & 0 \\ 0 & 0 & 0 \end{pmatrix}$ |
| $\theta = 0°$ | $\begin{pmatrix} -216 & 0 & 0 \\ 0 & 216 & 318 \\ 0 & -5 & 0 \end{pmatrix}$ | $\begin{pmatrix} 0 & 216 & -318 \\ 216 & 0 & 0 \\ 5 & 0 & 0 \end{pmatrix}$ | $\begin{pmatrix} 0 & 98 & 0 \\ -98 & 0 & 0 \\ 0 & 0 & 0 \end{pmatrix}$ |
| $\theta = 45°$ | $\begin{pmatrix} 153 & -153 & 0 \\ -153 & -153 & 318 \\ 0 & -5 & 0 \end{pmatrix}$ | $\begin{pmatrix} -153 & -153 & -318 \\ -153 & 153 & 0 \\ 5 & 0 & 0 \end{pmatrix}$ | $\begin{pmatrix} 0 & 98 & 0 \\ -98 & 0 & 0 \\ 0 & 0 & 0 \end{pmatrix}$ |
| $\theta = 90°$ | $\begin{pmatrix} 0 & 216 & 0 \\ 216 & 0 & 318 \\ 0 & -5 & 0 \end{pmatrix}$ | $\begin{pmatrix} 216 & 0 & -318 \\ 0 & -216 & 0 \\ 5 & 0 & 0 \end{pmatrix}$ | $\begin{pmatrix} 0 & 98 & 0 \\ -98 & 0 & 0 \\ 0 & 0 & 0 \end{pmatrix}$ |
| $\theta = 135°$ | $\begin{pmatrix} -153 & -153 & 0 \\ -153 & 153 & 318 \\ 0 & -5 & 0 \end{pmatrix}$ | $\begin{pmatrix} -153 & 153 & -318 \\ 153 & 153 & 0 \\ 5 & 0 & 0 \end{pmatrix}$ | $\begin{pmatrix} 0 & 98 & 0 \\ -98 & 0 & 0 \\ 0 & 0 & 0 \end{pmatrix}$ |

The calculated results of SHC with different $\theta$ in (111)-oriented IrMn$_3$, where $\theta$ denotes the angle between the bias current and the [$\bar{1}$10] direction in the (111)-plane.
The SHC is in the unit of (h/e) (S/cm).

FIGS. 14A and 14B show the current and crystallization direction dependence of the spin accumulations in (111)-IrMn$_3$, respectively. FIG. 14A Illustrates the transverse voltage V$_T$ in (111)-oriented IrMn$_3$ as a function of bias current with different θ. FIG. 14B illustrates the normalized SHC $\sigma_{xy}^z + \sigma_{xz}^z$ and spin Hall angle in (111)-oriented IrMn$_3$ with respect to θ.

The current Induced spin accumulation in (001) and (111)-oriented IrMn$_3$ was Imaged. Observable from the Imaging is a significant out-of-plane spin accumulation on the surface from (001)-oriented IrMn$_3$, which depends strongly on the current flowing direction.

Next, we Investigated magnetization switching and Dzyaloshinskii-Morlya Interaction in WTe$_2$/ferromagnet heterostructures. Weyl semimetal WTe$_2$ has been discovered to have strong spin-orbit coupling and a large spin polarization protected by time-reversal symmetry in both the surface and bulk states. However, magnetization switching using the above Interesting properties has not been demonstrated so far. Utilizing WTe$_2$ as a spin current source, current-induced magnetization switching can be demonstrated without assistive magnetic fields in WTe$_2$/Py heterostructures at room temperature. An extremely small charge current density of ~1.58×10$^5$ Acm$^{-2}$ and the thickness-dependent charge-to-spin conversion efficiency up to ~0.8 with the current along the b-axis in the WTe$_2$ layer are found. Furthermore, a strong Dzyaloshinskii-Moriya Interaction (DMI) with a DMI constant up to −1.8 mJ m$^{-2}$ is Identified at the WTe$_2$/Py Interface from the chiral domain wall tilting. The demonstration of efficient current-driven magnetization switching and sizable Interfacial DMI In WTe$_2$/ferromagnet heterostructures open a new avenue for the Weyl semimetal based spintronic device applications.

In order to facilitate a wider adoption of spintronic devices, the required current and power consumption for manipulating the magnetization needs to be minimized. One effort towards this goal is the search for new materials which can provide a considerable charge-to-spin conversion efficiency. Recently, Weyl semimetals, a class of exotic topological materials, have received extensive attention due to the spin-momentum locking and large spin polarization in both the bulk and Fermi arc surface states. Recent works have suggested a pronounced Edelstein effect in Weyl semimetals due to their nontrivial band structure, which can be one order of magnitude stronger than that in topological Insulators or Rashba systems, and the strong Intrinsic spin Hall effect from the bulk states in Weyl semimetals can also contribute to the spin current generation. Of currently explored Weyl semimetals, the Td phase of WTe$_2$ (referred to as WTe$_2$ hereafter) is particularly Intriguing due to not only its strong spin-orbit coupling and nontrivial band structures, but also its atomically flat layers with high surface quality, essential for spintronic device applications.

Here, the room temperature current-driven magnetization switching in WTe$_2$/Py heterostructures is demonstrated using magneto-optical Kerr effect (MOKE) microscopy. The effective charge-to-spin conversion efficiency θ$_{SH}$ of WTe$_2$ is determined using spin torque ferromagnetic resonance (ST-FMR) technique, which Increases with Increasing the thickness of WTe$_2$ up to 0.8, indicating a significant bulk contributions from WTe$_2$ In the spin current generation. In addition, the Interfacial DMI at the WTe$_2$/Py Interface is Identified from the chiral domain wall (DW) tilting, and a DMI constant of −1.80 mJ m$^{-2}$ is extracted. The present disclosure demonstrates a great potential of WTe$_2$ as a highly efficient spin current source and also sheds light on the role of the Interface effects between Weyl semimetals and magnetic thin films.

Figure 17A:
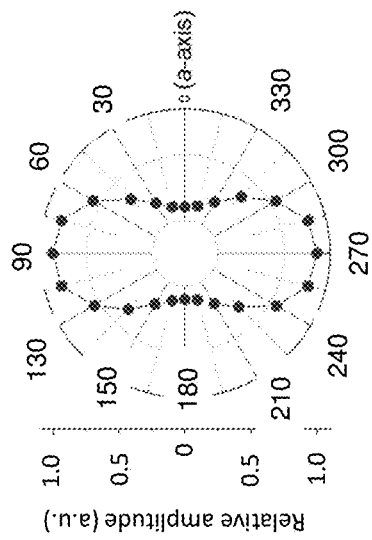
Figure 17B:
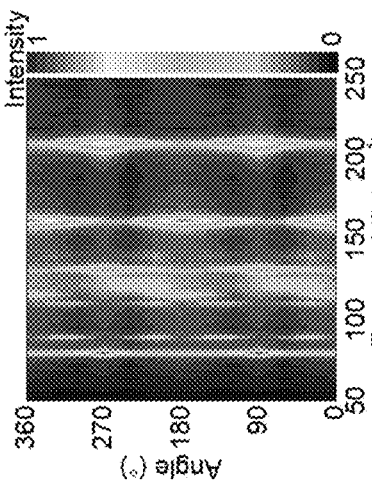
Figure 17D:
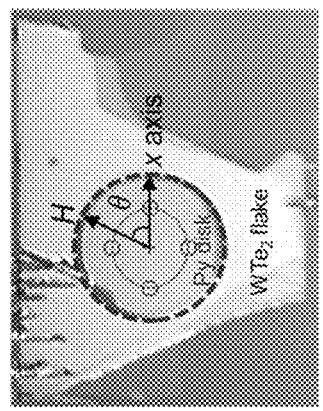
Figure 17C:
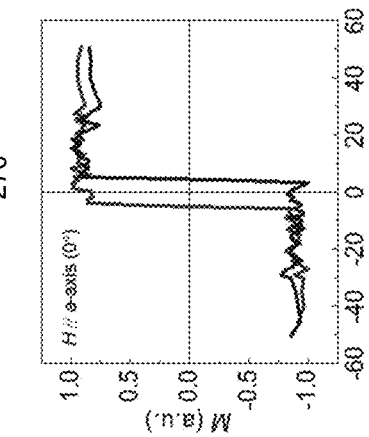

WTe$_2$ single crystals were exfoliated onto thermally oxidized silicon wafers and the exfoliated samples were Immediately transferred into an ultra-high vacuum sputter chamber for the deposition of Py and SiO$_2$. FIG. 17A shows the sample image of a Py disk on top of exfoliated WTe$_2$ flake. FIG. 17B shows a typical angle-dependent polarized Raman spectra of WTe$_2$ flake/Py in the parallel-polarized configuration, by rotating the sample with respect to the excitation laser polarization direction. FIG. 17C shows the representative angle-dependent Intensities of the A$_g$ (A$_1$) mode at ~212 cm$^{-1}$. FIG. 17D shows the angular dependence of the normalized remanent magnetization (M$_R$/M$_S$), where M$_s$ is the saturation magnetization. The magnetic hysteresis loops for an external magnetic field H along the hard axis in FIG. 17E and easy axis in FIG. 17F.

Figure 17E:
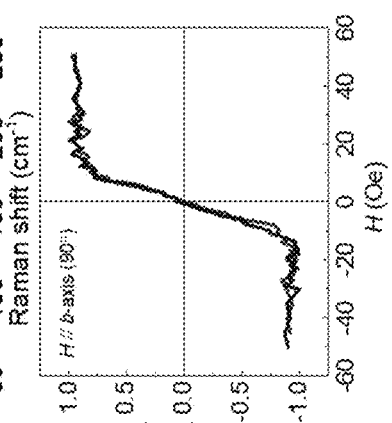
Figure 17F:
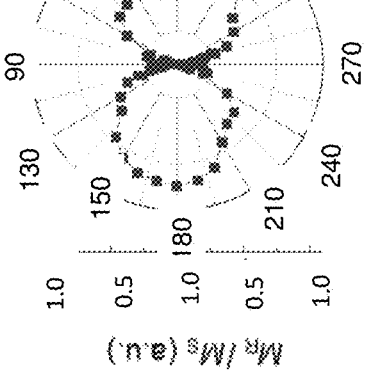

To confirm the crystal structure of WTe$_2$, Raman measurements were performed on WTe$_2$, WTe$_2$/SiO$_2$ (4 nm), and WTe$_2$/Py (6 nm)/SiO$_2$ (4 nm), and the a- and b-axis of WTe$_2$ were Identified. To reveal the magnetization anisotropy of Py against the crystalline orientation of WTe$_2$, a Py disk was fabricated with a thickness of 6 nm and a radius of 15 μm on top of WTe$_2$ flake (~60 nm) as shown in FIG. 17A. The disk shape was chosen to avoid Influences from the shape anisotropy of Py. FIG. 17B shows a typical angle-dependent polarized Raman spectra of the Td-phase of WTe$_2$ In the parallel configuration. The polar diagram of the relative Intensity of the Raman mode A$_g$ (A$_1$) at the frequency ~212 cm$^{-1}$ is presented in FIG. 17C. The minimum relative Intensity of this vibration mode appears when the a-axis is in parallel with the laser polarization direction (x-axis). Subsequently, we perform the MOKE measurements on the Py disk. FIG. 17D shows the angular dependence of normalized remanence (M$_R$/M$_S$), which presents a uniaxial magnetic anisotropy in the Py film in which the easy axis of Py is oriented along the a-axis of the WTe$_2$ flake and the hard axis is along the b-axis. FIGS. 17E and 17F show the magnetic hysteresis loops for the external magnetic field H along the hard and easy axis, respectively.

Both MOKE measurements and polarized Raman measurements were conducted on two other WTe$_2$/Py samples (the first device and the second device). The results are presented in FIGS. 21A to 21H. These measurements confirmed that for all devices, the magnetic easy axis of Py is along the a-axis.

The charge-to-spin conversion efficiency in WTe$_2$ (t nm)/Py (6 nm) samples was then evaluated using the ST-FMR technique. FIG. 18A shows the sample geometry for the ST-FMR measurements. τ$_∥$ is the in-plane spin-orbit torque, and τ$_⊥$ is the out-of-plane torque. I$_{RF}$ is the Injected radio frequency (rf) current. The external magnetic field H is applied with an angle θ against I$_{RF}$. FIG. 18B shows the ST-FMR spectra for the WTe$_2$ (19.6 nm)/Py (6 nm) device with the current in the b-axis. The rf frequency is from 5 to 8 GHz. FIG. 18C shows the ST-FMR signal from the WTe$_2$ (19.6 nm)/Py (6 nm) sample at 6 GHz. The solid lines are fits showing the symmetric (V$_s$) and antisymmetric (V$_a$) Lorentzan contribution. FIG. 18D shows the thickness dependent charge-to-spin conversion efficiency of WTe$_2$ from ST-FMR averaged between 6 and 7 GHz. Following the established analysis method, the charge-to-spin conversion efficiency θ$_{SH}$ is shown in FIG. 18D varying from 0.09 to 0.51, which is larger than that of typical heavy metals.

The symmetric ($V_s$) and antisymmetric ($V_a$) Lorentzian component were decomposed from the ST-FMR signal. The amplitude of $V_s$ and $V_a$ are related to $\tau_\parallel$ and $\tau_\perp$ by:

$$V_s = -(I_{rf}\gamma \cos\theta_H/4)(dR/d\theta_H)(1/\Delta)F_s(H_{ext})\tau_P, \quad (4)$$

$$V_a = -(I_{rf}\gamma \cos\theta_H/4)(dR/d\theta_H)\{[1+(\mu_0 M_{eff}/B_{ext})]^{1/2}/\Delta\}F_a(H_{ext})\tau_\perp, \quad (5)$$

where $I_{rf}$ is the RF current flowing through the device, $\gamma$ is the gyromagnetic ratio, $dR/d\theta_H$ is the angular dependent magnetoresistance at $\theta_H=40°$, $\Delta$ is the linewidth of ST-FMR signal, $F_s(H_{ext})$ and $F_a(H_{ext})$ are symmetric and antisymmetric Lorentzian functions, $H_{ext}$ ($B_{ext}$ In SI) is in-plane external magnetic field, and $M_{eff}$ is the effective magnetization of Py. The charge-to-spin conversion efficiency $\theta_{SH}$ of WTe$_2$ is given by:

$$\theta_{SH} = \frac{J_{S,rf}}{J_{C,rf}} = \frac{V_s}{V_a}\frac{e\mu_0 M_S t d}{\hbar}[1+(\mu_0 M_{eff}/B_{ext})]^{1/2}, \quad (6)$$

where t and d are the thicknesses of Py and WTe$_2$, respectively. $M_S$ is the saturation magnetization of Py. Determining $\theta_{SH}$ from Equation (6) is based on the assumption that the field-like torque is mainly contributed by the Oersted field, which is confirmed by the in-plane second-harmonic measurements. In Table 3, the device parameters are provided, $\mu_0 M_{eff}$ and $$\frac{V_s}{V_a}[1+(\mu_0 M_{eff}/B_{ext})]^{1/2}.$$

Figure 22A:
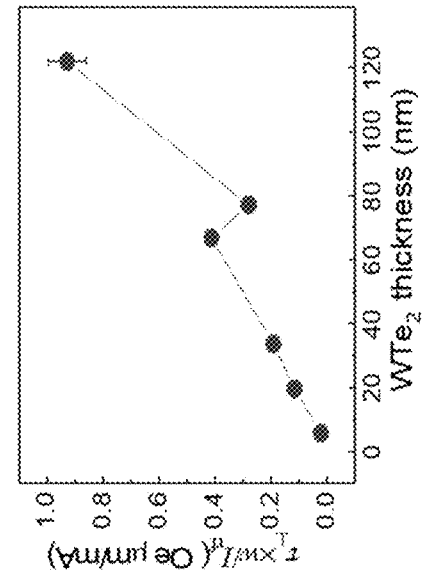
FIGS. 22A to 22D show.
Figure 22B:
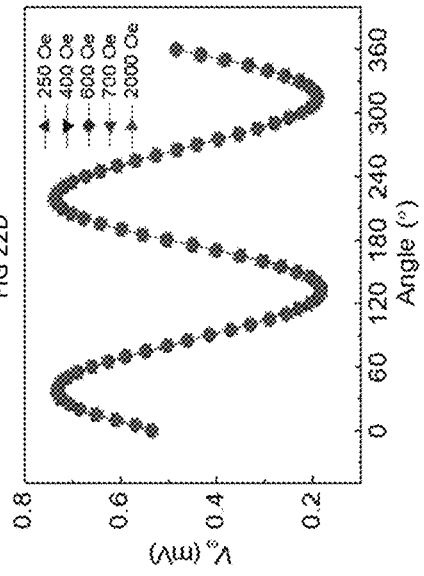
Figure 22C:
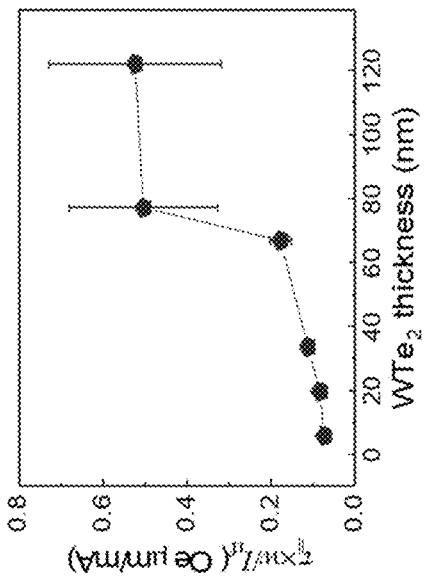

The value of $$\frac{V_s}{V_a}[1+(\mu_0 M_{eff}/B_{ext})]^{1/2}$$

is averaged between 6 and 7 GHz. Following the methods established previously, the in-plane damping-like torque $\tau_\parallel$ per unit $I_{rf}/w$ and out-of-plane field-like torque $\tau_\perp$ per unit $I_{rf}/w$ which is dominated by the Oersted field, as well as the spin conductivity $\sigma_s$ as shown in FIG. 22C were extracted—w is the width of the sample and $I_{rf}$ is the rf current Injected to the sample with power loss considered for Individual sample. The spin conductivity (or torque conductivity) is defined as the spin current density per unit electric field, i.e., $\sigma_s = J_s/E = \tau_\parallel M_s t_{FM}/E$, where $J_S$ is the spin current density absorbed by the ferromagnet at $\theta=0°$, E is the electric field across the device, and $\tau_\parallel$ is the in-plane SOT on the unit Py moment at $\theta=0°$.

Figure 22D:
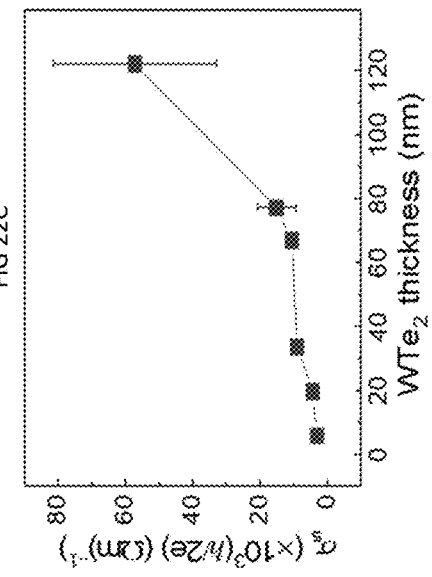

As can be seen, both $\tau_\parallel \times w/I_{rf}$ and $\sigma_s$ overall Increase with the WTe$_2$ thickness, which clearly show the trend of the torque efficiency as a function of the WTe$_2$ thickness. The out-of-plane torque is line with the Oersted field behaviour. FIG. 22D shows that the planar Hall signals measured on WTe$_2$ (58 nm)/Py (6 nm), for the external field from 250 Oe to 2000 Oe. The overlapped data signify that the magnetization is aligned with the applied field beyond 250 Oe. In the present ST-FMR measurements, the resonant fields at 6 and 7 GHz are ~500 and ~700 Oe, respectively, which are much larger than 250 Oe. Therefore, the present measurement condition satisfies the macrospin model, and thus validates the present analysis of the ST-FMR.

TABLE 3

ST-FMR device parameters, $\mu_0 M_{eff}$ and $\frac{V_s}{V_a}[1+(\mu_0 M_{eff}/B_{ext})]^{1/2}$.

| Device No. | WTe$_2$ thickness (nm) | L × W (μm) | $\mu_0 M_{eff}$ (T) | Resistance (Ω) | $\frac{V_s}{V_a}[1+(\mu_0 M_{eff}/B_{ext})]^{1/2}$ |
|---|---|---|---|---|---|
| S1 | 122.0 | 15 × 10 | 0.86 | 64.8 | 0.54 |
| S2 | 77.1 | 10 × 9 | 0.56 | 87.4 | 1.17 |
| S3 | 66.8 | 15 × 15 | 0.92 | 101.3 | 0.42 |
| S4 | 64.4 | 29 × 15 | 0.77 | 154.4 | 0.48 |
| S5 | 33.6 | 12.5 × 10 | 0.83 | 84.9 | 0.57 |
| S6 | 33.4 | 10 × 10 | 0.81 | 62.4 | 0.54 |
| S7 | 19.6 | 11 × 9 | 0.69 | 155.9 | 0.70 |
| S8 | 5.8 | 10 × 12.5 | 0.82 | 156.1 | 2.98 |

Figure 23A:
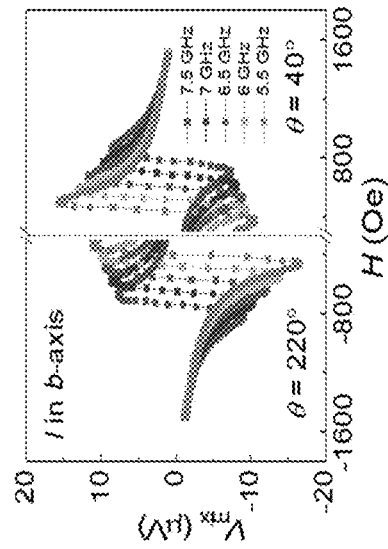
FIGS. 23A to 23D provide.
Figure 23B:
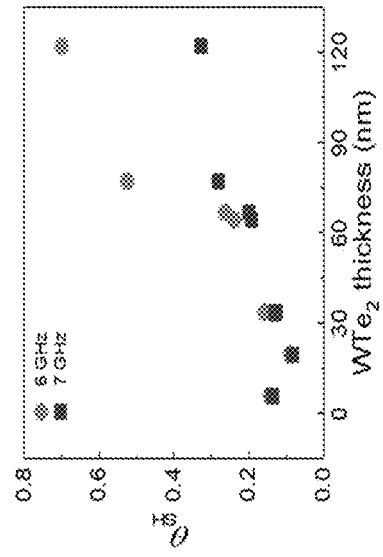
Figure 23D:
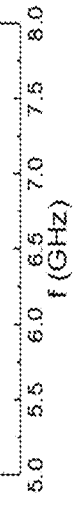
Figure 23C:
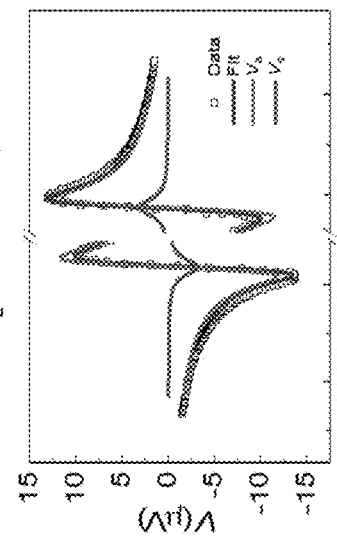

The effective charge-to-spin conversion efficiency is taken as the average of 6 and 7 GHz data. $J_{S,rf}/J_{C,rf}$ is plotted values for 6 and 7 GHz in FIG. 23A. For thicker samples, the frequency-dependence is quite large, especially for 122 nm sample. In FIG. 23B, the ST-FMR spectra of WTe$_2$ (122 nm)/Py (6 nm) sample are shown for various frequencies—the rf current frequency is from 5.5 to 7.5 GHz. The representative Lorentzian fitting for the ST-FMR spectrum at 6 GHz is shown in FIG. 23C. From the fitting, the frequency-dependents $J_{S,rf}/J_{C,rf}$ value is obtained, as shown in FIG. 23D, which exhibits a systematic frequency-dependent behaviour. A larger frequency gives rise to a smaller $J_{S,rf}/J_{C,rf}$ value possibly due to the skin depth (b) effect. A large frequency gives rise to a smaller δ, thus possibly making more currents flow in the upper part of WTe$_2$ and less currents in the lower part, consequently a smaller $J_{S,rf}/J_{C,rf}$ value. Therefore, a higher frequency can possibly underestimate the charge-to-spin conversion efficiency.

Based on angle-resolved photoemission spectroscopy and theoretical calculations, it can be shown that when the charge current is injected in the a-axis of WTe$_2$, the spin polarization has both b-axis and out-of-plane components, but no a-axis component. However, when the current flows along the b-axis, the spin polarization shows an a-axis component. It is known that one efficient mechanism for switching the in-plane magnetization by spin currents is through an anti-damping process, where the Injected spin moments are antiparallel with the equilibrium magnetization. In order to utilize the anti-damping torque from spin accumulations while the magnetic easy axis of Py is along the a-axis, current pulses were Injected along the b-axis so that the accumulated spin polarization is along the a-axis, as shown in FIGS. 19A and 19B.

MOKE microscopy is employed to image the current-driven magnetization switching. FIG. 19A shows the sample schematic for MOKE measurements. The sample size is 30 μm×15 μm. FIG. 19B shows the device image with electrodes 1900 and WTe$_2$ (80 nm)/Py region 1902. FIG. 19C shows the switching process captured by MOKE Images. The left-hand side of the MOKE images show the magnetization is switched from the +y to −y direction by current pulses in the +x direction. The right-hand side of the MOKE Images shows the magnetization is switched from the −y to +y direction by current pulses in the −x direction. The current densities are Indicated besides the MOKE Images. FIG. 19D shows WTe$_2$ thickness-dependent switching current density J$_C$ In the WTe$_2$ layer. Error bars show the standard deviations of J$_C$ in three Independent measurements.

Figure 24:
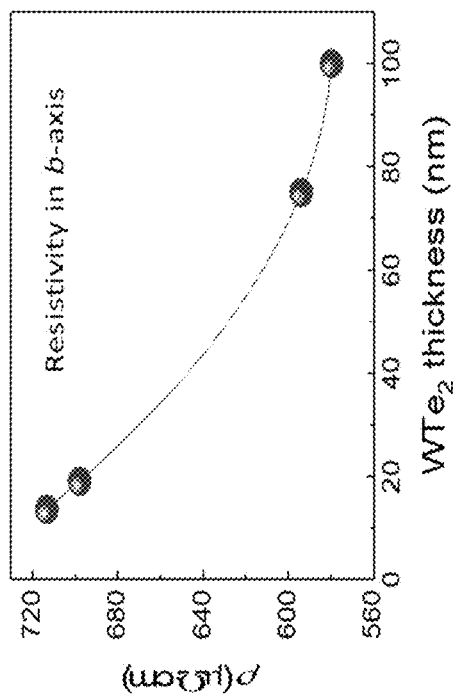
FIG. 24 illustrates the thickness dependence of WTe$_2$.

To obtain the switching current density (J$_C$) in WTe$_2$, the current distribution in the WTe$_2$/Py stacks must be known. To obtain the WTe$_2$ resistivity, fabricated devices were fabricated with a stack structure of WTe$_2$/Py (6 nm)/SiO$_2$ (4 nm). The resistivity of Py and WTe$_2$/Py were then measured separately using the four probe geometry, from which the resistivity of WTe$_2$ was extracted. The resistivity of Py was measured to be ~90 μΩ·cm. FIG. 24 shows the resistivity of WTe$_2$ along the b-axis, which varies between 579.8 μΩ·cm and 713.2 μΩ·cm at 300 K depending on WTe$_2$ thickness. The variation of the resistivity of WTe$_2$ is due to the changes in the band structure with decreasing the thickness, which can reduce the overlap between the conduction and valence bands. The value of WTe$_2$ resistivity is comparable with previous results.

FIG. 19C shows the representative switching process of the WTe$_2$ (80 nm)/Py (6 nm) device. Based on experimental observations and previous micromagnetic simulations, the current-driven magnetization switching of the micron sized device Initiates with the nucleation of a reversed domain followed by domain wall (DW) propagation. The magnetization reversal occurs as a result of the anti-damping mechanism, in which the spin (moment) polarization is collinear with the local magnetic moment, therefore no assistive magnetic field is required. The critical current density J$_{C0}$ for anti-damping switching in the absence of thermal fluctuations is given by:

$$J_{C0} = \frac{2e}{\hbar}\mu_0 M_S t\alpha(H_C + M_{eff}/2)/(J_S/J_C), \quad (7)$$

where M$_S$, t, α, H$_C$ and M$_{eff}$ denote the saturation magnetization, the thickness of Py, the damping constant, the coercive field, and the effective magnetization, respectively. In the present device, M$_S$ of Py is ~5.8×10$^5$ A m$^{-1}$ from the vibrating sample magnetometer measurement (FIG. 25A), t is 6 nm, H$_C$ is ~0.8 mT obtained from MOKE microscopy. α and M$_{eff}$ are ~0.0067 and ~0.86 T, respectively, as determined from ST-FMR measurements.

Since the present measurements were carried out at room temperature, the real switching current density Incorporating the Influence of thermal fluctuations is J$_C$, which is related to J$_{C0}$ by the following expression:

$$\frac{J_C}{J_{C0}} = 1 - \frac{K_B T}{K_{Py} V_N} \ln\frac{t_P}{t_0}, \quad (8)$$

where t$_P$ is the current pulse width of ~30 μs, t$_0$ is the attempt time of ~1 ns, K$_{Py}$ is the anisotropy energy density of Py given by H$_C$M$_S$/2. The DW width (δ$_m$) of Py is assumed to be ~180 nm, from which we can estimate V$_N$=δ$_m^2$t. From Equations (7) and (8), the effective charge-to-spin conversion efficiency of WTe$_2$ is determined to be from 0.14 to 0.62, when the thickness of WTe$_2$ is from 13 to 103.1 nm, as shown in FIG. 25B. It is evident that θ$_{SH}$ from switching measurements are slightly larger than that from ST-FMR.

The total critical switching current I$_C$ as a function of WTe$_2$ thickness is shown in FIG. 25C. The I$_C$ is related to the device width, thickness and J$_C$, which differ for different devices. In Table 4, the device parameters are provided, total switching current and switching current density in WTe$_2$ and Py layers for the switching devices.

TABLE 4

Switching device information, total switching current and switching current densities in WTe$_2$ and Py.

| Device No. | WTe$_2$ thickness (nm) | L × W (μm) | H$_C$ (Oe) | Resistance (Ω) | Total current (mA) | Current density in WTe$_2$ (10$^5$ A cm$^{-2}$) | Current density in Py (10$^6$ A cm$^{-2}$) |
|---|---|---|---|---|---|---|---|
| D1 | 80.0 | 30 × 15 | 9 | 90.6 | 5.3 | 2.87 | 1.94 |
| D2 | 43.3 | 9 × 10 | 10 | 64.1 | 6.2 | 4.78 | 3.42 |
| D3 | 61.4 | 15 × 10 | 12 | 83.1 | 8.3 | 5.30 | 3.68 |
| D4 | 40.7 | 20 × 15 | 10 | 148.4 | 4.3 | 3.46 | 2.48 |
| D5 | 47.4 | 27 × 18.5 | 12 | 331.4 | 4.8 | 3.50 | 2.49 |
| D6 | 13.0 | 10.5 × 10 | 8 | 203 | 11.5 | 13.68 | 10.04 |
| D7 | 24.0 | 18 × 9 | 14 | 249 | 8.8 | 8.73 | 6.40 |
| D8 | 103.0 | 5 × 10 | 14 | 41.6 | 6.1 | 2.79 | 1.86 |
| D9 | 73.5 | 5 × 10 | 12 | 54.3 | 6.3 | 3.60 | 2.45 |
| D10 | 35.1 | 10 × 10 | 11 | 91.6 | 9.4 | 7.99 | 5.79 |

Before Injecting the current, the Py magnetization is first saturated in the +y direction by an external magnetic field H. After removal of H, the remanence M$_R$ is in the +y direction (a-axis), as Indicated by the dark contrast denoted with the arrow X in the left panel of FIG. 19C, due to the uniaxial magnetic anisotropy. By applying current pulses from the left electrode, the DW gradually moves along the current direction and the magnetization is finally switched to the −y direction. It is observable that the magnetization switching takes place by firstly nucleating a reversed domain followed by DW propagation. Upon reversing the current direction, the DW motion is reversed and the magnetization is switched from the −y back to +y direction, as displayed in the right panel of FIG. 19C. The switching from both cases Initiates at a current density of J∼1.58×10$^5$ A cm$^{-2}$ and completes at J$_C$∼2.96×10$^5$ A cm$^{-2}$. This switching sequence suggests a positive spin Hall angle of WTe$_2$, in agreement with the ST-FMR results and similar to Pt and Bi$_2$Se$_3$ in which a charge current along the +x direction gives rise to a spin magnetic moment in the −y direction.

Devices with different WTe$_2$ thicknesses have also been studied as set out herein. From both the ST-FMR and switching measurements, the effective θ$_{SH}$ in WTe$_2$ can be determined. Both show a bulk-like behaviour with a saturation, which is an Indication of a bulk-like origin of SOT. Since WTe$_2$ flakes exhibit a well-crystalized structure and strong spin orbit coupling (SOC) in the bulk, a strong spin Hall effect is expected. Therefore, what is presently observed is the spin Hall effect of WTe$_2$.

The spin Hall torque is a bulk torque and depends on the thickness of the SOC source. The spin Hall torque, in general, increases with Increasing the thickness of the SOC layer and then saturates beyond the spin diffusion length. Presently, it is considered that for WTe$_2$ the spin diffusion length is quite large due to the following reasons: (1) WTe$_2$ shows a long spin relaxation time, resulting from a low electron-hole recombination rate as well as the suppression of backscattering due to time-reversal symmetry; and (2) the b-axis of WTe$_2$ presents a large mobility which Implies a long mean-free path (λ) up to 12 μm, and the λ along the c-axis of WTe$_2$ is one order smaller. The latter is still much longer than that for normal metals which are typically in nanometre range. In addition, a recent work reported a large spin diffusion length (>22 nm) in WTe$_2$ from non-local measurements.

The J$_C$ resulting from the study of WTe$_2$ thicknesses is summarized only in the WTe$_2$ layer for complete switching in FIG. 19D. The J$_C$ first decreases with Increasing WTe$_2$ thickness, and then saturates, in line with the trend of the charge-to-spin conversion efficiency from the ST-FMR measurements. From control experiments and further analysis, it was confirmed that the Oersted field and heating effect do not play a key role in the observed current-induced magnetization switching.

The switching of the magnetization depends on the direction of the current pulse. As presented in FIGS. 26A to 26E, when the current pulse is in the +x direction, the magnetization is switched from the +y to −y direction. However, the current pulse along the +x direction is not able to switch the magnetization from the −y to +y direction as shown in FIGS. 26D and 26E. The nature of the polarity of magnetization switching Indicates that the magnetization switching is not due to Joule heating.

Figure 27B:
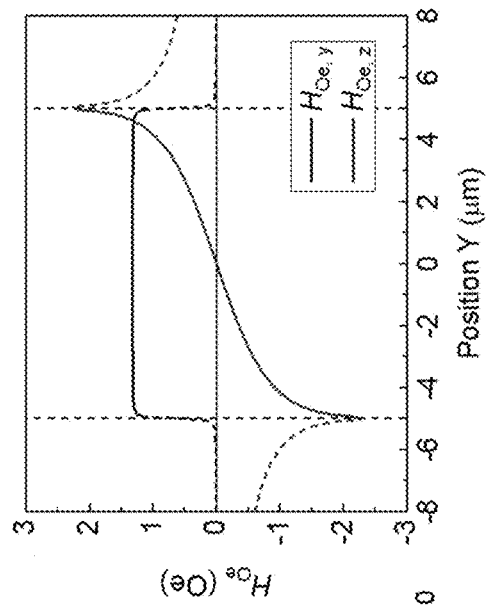
FIGS. 27A and 27B show.
Figure 27A:
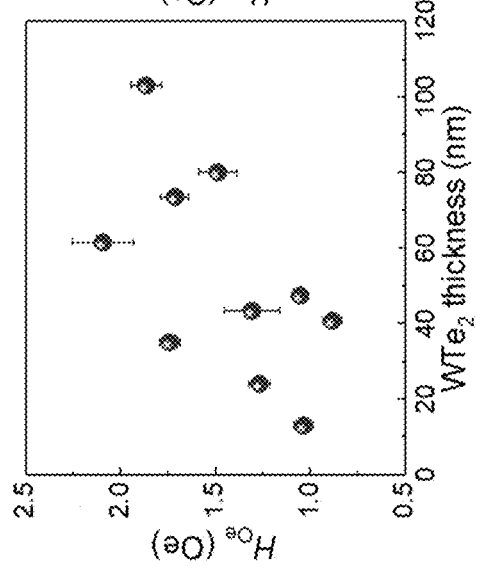

The Oersted fields (H$_{Oe}$) may also be calculated in samples based on H$_{Oe}$=μ$_0$J$_C$t/2 derived from Ampère's law, where t is the thickness of WTe$_2$. For all of devices, the estimated Oersted fields are 0.8-2.1 Oe as shown in FIG. 27A, which are much smaller than the coercive field (8-14 Oe) and in-plane anisotropy field H$_k$ (20∼60 Oe) of the samples. Moreover, Cu (12 nm)/Py (6 nm) control devices were fabricated and current driven magnetization switching measurements were also performed. FIGS. 28A to 28D show the results. There was no observable switching behaviour up to J=2.97×10$^7$ A cm$^{-2}$, which is two orders of magnitude larger than the k for our WTe$_2$/Py samples.

In addition, using the Blot-Savart law, it was possible to calculate the magnetic field generated by the current passing through WTe$_2$ with different widths and thicknesses. FIG. 27B shows the Oersted field distribution in the Py layer on the WTe$_2$ (43.3 nm)/Py (6 nm) sample as an example. It was found that the horizontal Oersted fields H$_{Oe\_y}$ in all the switching samples are 0.89-2.1 Oe, similar to that determined from Ampère's law. The out-of-plane Oersted fields H$_{Oe\_z}$, at the sample edges are from 1.87-3.95 Oe. Therefore, the Oersted field generated in WTe$_2$/Py samples should not play a key role in the current driven magnetization switching. The Oersted field effect was therefore Incorporated, which partially compensates the H$_C$ and reevaluated the effective charge-to-spin conversion efficiency. The revised θ$_{SH}$ only changes ∼0.5%.

Magnetization switching has been studied in the topological Insulator Bi$_2$Se$_3$ as well as heavy metals such as Pt. It has been shown that the J$_C$ of Bi$_2$Se$_3$ can be as low as ∼6×10$^5$ A cm$^{-2}$. However, the power required to switch the magnetization in Bi$_2$Se$_3$/Py bilayers is up to 19 times greater than that in the present WTe$_2$/Py devices, as the resistivity of Bi$_2$Se$_3$ (2600 μΩ·cm for 8 QL sample) is much higher than that of WTe$_2$ (∼580 μΩ·cm). In order to compare WTe$_2$ with Pt, control experiments were performed with Pt (6 nm)/Py (6 nm) samples and it was found that the averaged J$_C$ is ∼2.80×10$^7$ A cm$^{-2}$, which shows that the power consumption is ∼350 times larger than that in WTe$_2$.

For a better comparison, current-driven switching measurements were also performed on another set of control samples, Pt/Py. FIGS. 30A to 30D shows the MOKE images of one of the Pt (6 nm)/Py (6 nm) samples. The magnetization switching starts to take place at ∼2.8×10$^7$ A cm$^{-2}$, which is about two orders larger than the J$_C$ in WTe$_2$/Py samples. The measured Pt resistivity is 22.7 μΩ·cm. In particular, FIG. 30A to 30D show MOKE images of the device with Injection of current pulses from the left terminal. In FIGS. 30A and 30B, the magnetization is switched from the +y direction (FIG. 30Q) to −y direction (FIG. 30B). FIGS. 30C and 30D show MOKE images of the device with Injection of current pulses from the right terminal, with magnetization being switched from the −y direction (FIG. 30C) to +y direction (FIG. 30D). Scale bar is 10 μm.

In addition, as compared to the surface of Bi$_2$Se$_3$ which is dominated by disconnected and nonuniform 1-nm-step triangle terraces, WTe$_2$ exhibits flat surfaces with a roughness <0.3 nm. Therefore, WTe$_2$ offers significant advantages for the Integration with magnetic tunnel junctions over topological Insulators.

In order to gain Insight into the current-driven magnetization switching process, the DW motion was studied. Hall crosses were patterned from the WTe$_2$ flake/Py stack with 10-μm-wide channels. For the case of the current applied along the b-axis, a series of DW Images are displayed in FIGS. 20A to 20F, which are MOKE microscopy images showing DW motion and tilting with Increasing the amplitude of current pulses—the arrows Indicate current directions. FIG. 20A shows the Initial domain configuration without an external field. FIG. 20B shows the domain configuration after a current pulse of 30 μs with J=3.89×10$^5$ A cm$^{-2}$, indicated by the arrows. The DW shows a tilt angle of −6.3° In FIG. 20B. By Increasing J to 4.53×10$^5$ A cm$^{-2}$, the DW moves along the current direction and DW tilt angle Increases to ∼14.8°, shown in FIG. 20C. As presented in FIGS. 20D to 20F, the tilt direction is reversed when a current pulse is applied from the opposite direction.

In order to exclude the possibility that the observed DW tilting is a result of current-related phenomena such as an asymmetric current flow in the vicinity of the DW, solely magnetic field-driven DW motion was measured. The thickness of WTe$_2$ used for this Investigation is 61.4 nm. FIG. 20G shows the DW tilt angle versus easy-axis external magnetic field H$_y$ for both experimental and micromagnetic simulation results. The line is a linear fit of the simulated data with D=−1.8 mJ m$^{-2}$. The DW was nucleated before applying H$_y$. FIG. 20H shows the micromagnetic simulation results of a 192-nm-wide wire with D=−1 mJ m$^{-2}$ and a J=3×10$^7$ A cm$^{-2}$ In the x-axis. The DW tilting direction is reversed upon reversing the current direction. The thick arrows Indicate the current directions. The small arrows in the track Indicate the magnetization directions in the xy-plane. The background marked 2000 indicates the +y magnetization state and the background marked 2002 indicates the −y magnetization. FIG. 20I shows the micromagnetic simulation result of a 192-nm-wide wire with D=−1 mJ m$^{-2}$ and an easy-axis external magnetic field H$_y$=±50 Oe. The DW tilt direction is opposite for positive and negative H$_y$. The external magnetic field, H$_y$, is applied along the easy axis (y-axis), and the DW tilting is also observed. The dependence of the tilt angle on H$_y$ is shown in FIG. 20G, where positive and negative values correspond to a leftward and rightward tilt from the y-axis, respectively. The absolute tilt angle Increases linearly from 0 to ~14.9° with Increasing the magnitude of H$_y$. The DW tilting with the current and external field is reproducible in other devices.

Domain wall tilting was measured based on various magnetic domain configurations as shown in FIGS. 31A, 31B and FIGS. 32A to 32D. The DW tilting orientation is determined by both the external field direction (FIG. 31A) and the domain configuration (up/down or down/up). In the current driven case (FIG. 31B), the DW wall moves in the direction of current. The tilt direction is consistent with the effect due to a negative DMI constant. The size of the channel is 10 μm×30 μm. FIGS. 32A to 32D show the field driven DW tilting from another sample of WTe$_2$ (14 nm)/Py (6 nm). The tilting and its orientations are in line with both the micromagnetic simulations and other experimental results.

Figure 33:
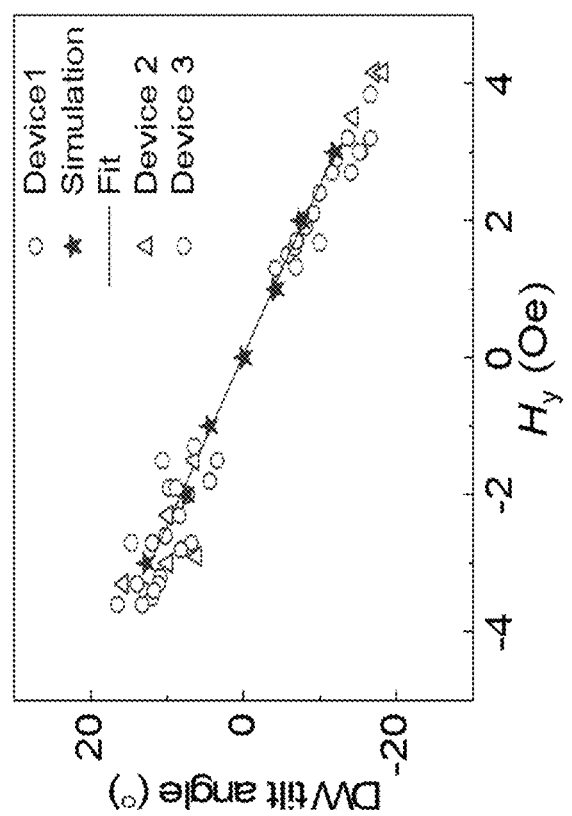
FIG. 33 shows the domain wall tilting angle with respect to easy-axis external field H$_y$.

Moreover, the domain wall tilting angles from the second device and a third device fall within the same range as Device 1 as shown in FIG. 33. The DMI values were further determined for the second device and third device as −1.85 mJ m$^{-2}$ and −1.70 mJ m$^{-2}$, respectively, by comparing the experimental results to the micromagnetic simulations.

DW tilting has been studied in multilayers with perpendicular magnetic anisotropy such as Pt/Co/NI/Co, and the mechanism is attributed to the Dzyaloshinskii-Moriya Interaction (DMI), a consequence of the strong spin-orbit coupling (SOC) and structural Inversion asymmetry in layered structures. However, in the present system, the Py film on WTe$_2$ presents in-plane magnetic anisotropy. A few theoretical works reported DW dynamics in the in-plane magnetic system Including DMI, in which a DW tilting angle was Implemented as a parameter in their one-dimensional model. However, no experimental observation of DMI Induced DW tilting in the in-plane magnetic system has been reported.

In the present case, micromagnetic simulations were used to correlate the observed experimental DW tilting with the DMI In WTe$_2$/Py bilayers as well as the type and chirality of DW. FIG. 20H shows the representative micromagnetic simulations with a DMI constant D=−1 mJ m$^{-2}$ and a current density of 3×10$^7$ Acm$^{-2}$ along the +x direction. A clear leftward DW tilting is observed with the DW moving in the current direction, and the tilt angle reverses when the current direction is reversed. The symmetry of tilting is consistent with the experiments in FIGS. 20A to 20G.

As a comparison, the case with no DMI was simulated. FIG. 34A shows the DW configuration when a current density of 3×10$^7$ Acm$^{-2}$ In the x-axis is applied. This is a micromagnetic simulation of a 192-nm-wide wire in the absence of DMI upon Injection of a current pulse with J=3×10$^7$ Acm$^{-2}$ In the x-axis. DW tilting is not observed. The region in the wire Indicates the magnetization along the −y (+y) direction. The DW is straight and tilting is not observed. Similarly, the easy-axis field-driven DW motion in the absence of DMI is also simulated in FIG. 34B. This is a micromagnetic simulation of a 192-nm-wide wire in the absence of DMI when an easy-axis magnetic field H$_y$=50 Oe is applied. Again, DW tilting is not observed.

Figures 35, 35A, 35B, 35C:
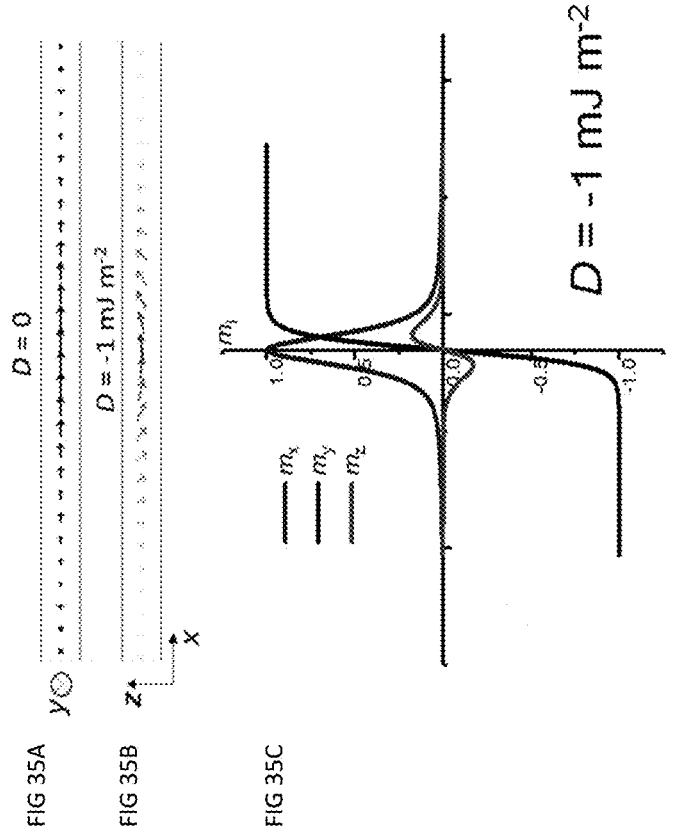
FIGS. 35A-C illustrate magnetization of DW with easy axis along the short axis of the wire when D=0 (FIG. 35A) and D=−1 mJ m$^{-2}$ (FIG. 35B)
Figure 36B:
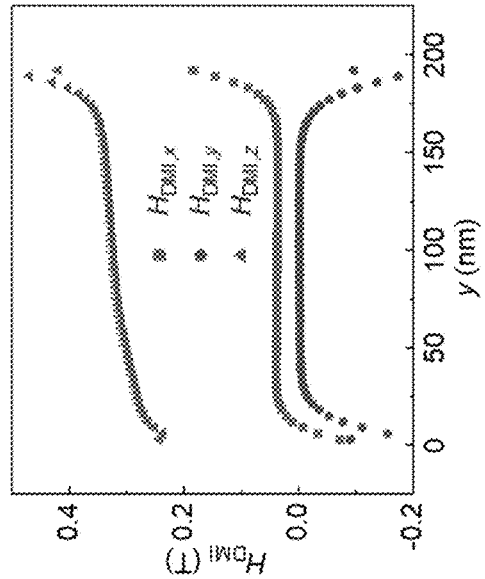
FIGS. 36A and 36B show the spatial distribution of the DMI field with D=0 and D=−1 mJ m$^{-2}$, respectively.
Figure 36A:
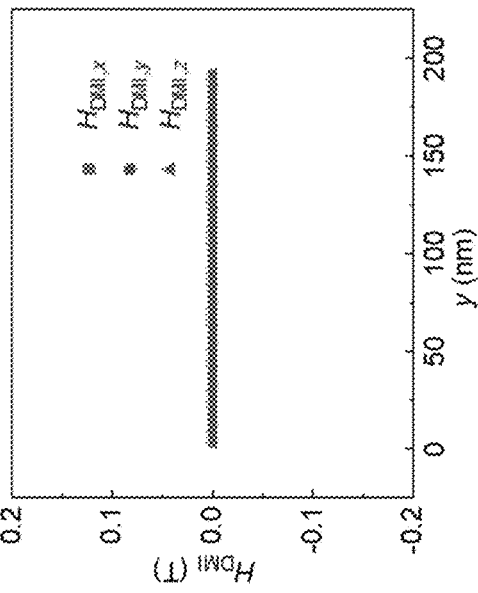

The magnetic profiles between the samples without and with the DMI were also compared using micromagnetic simulations. FIG. 35C Illustrates magnetization of DW with easy axis along the short axis of the wire. When D=0, the magnetization shows only in-plane m$_x$ and m$_y$ components. When D=−1 mJ m$^{-2}$, a chiral m$_z$ (out-of-plane) component appears at the DW. As shown in FIG. 35A, an in-plane Néel wall is observed in the absence of DMI, whereas a sizeable perpendicular component (m$_z$) (FIGS. 35B and 35C) appears under DMI constant D=−1 mJ m$^{-2}$, resulting from a DMI effective field described by [H$_{DMI,x}$, H$_{DMI,y}$, H$_{DMI,z}$]=(2D/M$_s$)[∂m$_z$/∂x, ∂m$_z$/∂y, −∂m$_x$/∂x−∂m$_y$/∂y], where M$_s$ is the saturation magnetization.

Figures 37A, 37B, 37C:
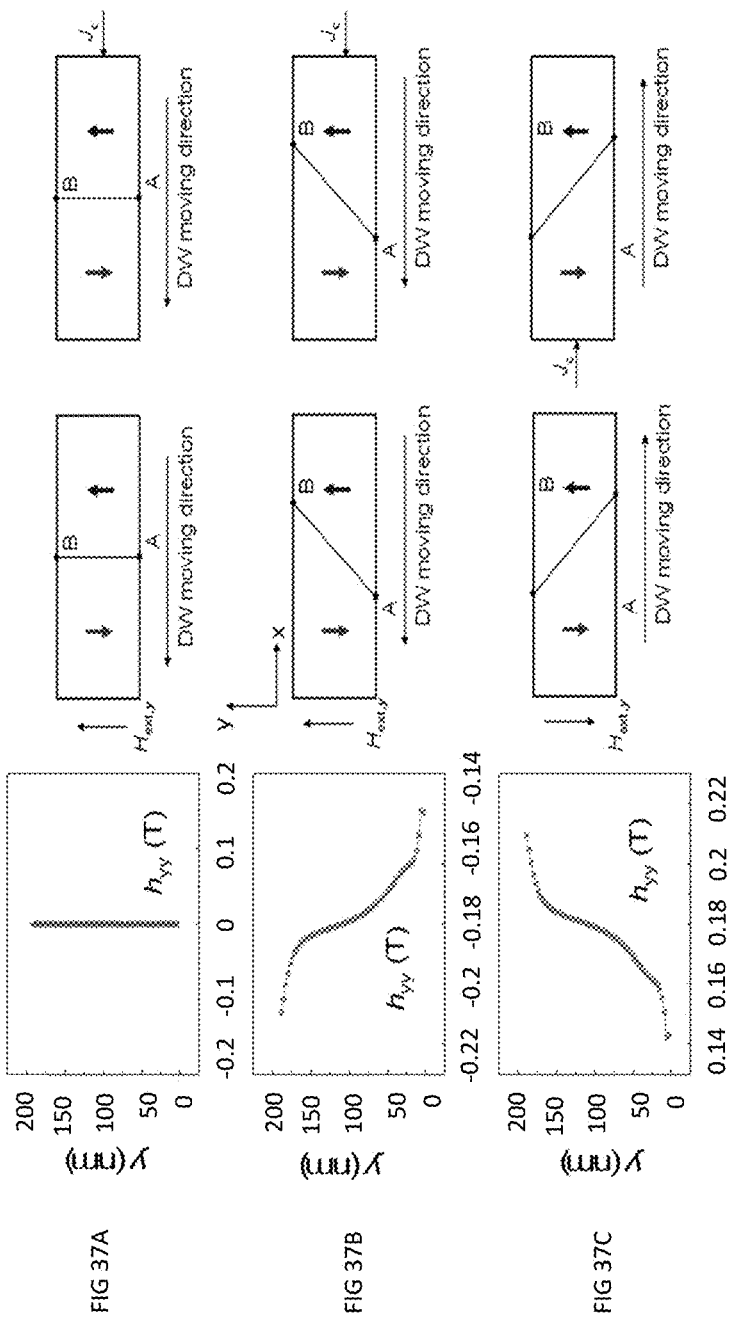
FIGS. 37A to 37C illustrate the DMI Induced damping-like effective field h$_{yy}$ (left panel) and schematics DW profiles (middle and right panels) in the sample when D=0, D=−1 mJ m$^{-2}$, and D=−1 mJ m$^{-2}$, respectively.

The DMI effect can then be described as a damping-like effective field [h$_{xx}$, h$_{yy}$, h$_{zz}$]=m×H$_{DMI}$=[m$_y$H$_{DMI,z}$−m$_z$H$_{DMI,y}$, m$_z$H$_{DMI,x}$−m$_x$H$_{DMI,z}$, m$_x$H$_{DMI,y}$−m$_y$H$_{DMI,x}$]. Since the DW is mainly moved by the easy-axis external magnetic field (H$_{ext,y}$) in the field-driven case, the additional effective field is considered in the same direction, that is h$_{yy}$. FIGS. 37A to 37C Illustrates the DMI Induced damping-like effective field h$_{yy}$ (left panel) and schematics DW profiles (middle and right panels) in the sample where the DW moves to the left with D=0 (FIG. 37A) and moves to the left with D=−1 mJ m$^{-2}$ (FIG. 37B); and moves to the right with D=−1 mJ m$^{-2}$ (FIG. 37C). As shown in FIG. 37A, the DW remains straight when the DMI is absent. For the case of positive H$_{ext,y}$ with the down/up domain configuration, h$_{yy}$ is negative across the sample width (y-direction), and it becomes stronger at a larger y (the left panel of FIG. 37B). As a result, the DMI stabilizes the magnetization at position B of the sample along the −y direction, leading to a faster DW motion at position A (see the middle panel of FIG. 37B). In contrast, when the DW motion is reversed, where h$_y$i is positive (the left panel of FIG. 37C), the tilting direction changes (the middle panel of FIG. 37C). Therefore, the DW tilting of the in-plane magnets can be explained by treating the DMI as a damping-like field, which stabilizes certain magnetization configurations depending on its polarity, and the spatial distribution of the DMI determines the tilting direction. The same analyses can also explain the DW tilting in the current-driven cases. For example, the direction of DW tilting under the current flowing from right to left (the right panel of FIG. 37B) is the same as the one under +H$_{ext,y}$.

Figures 38A, 38B, 38C, 38D:
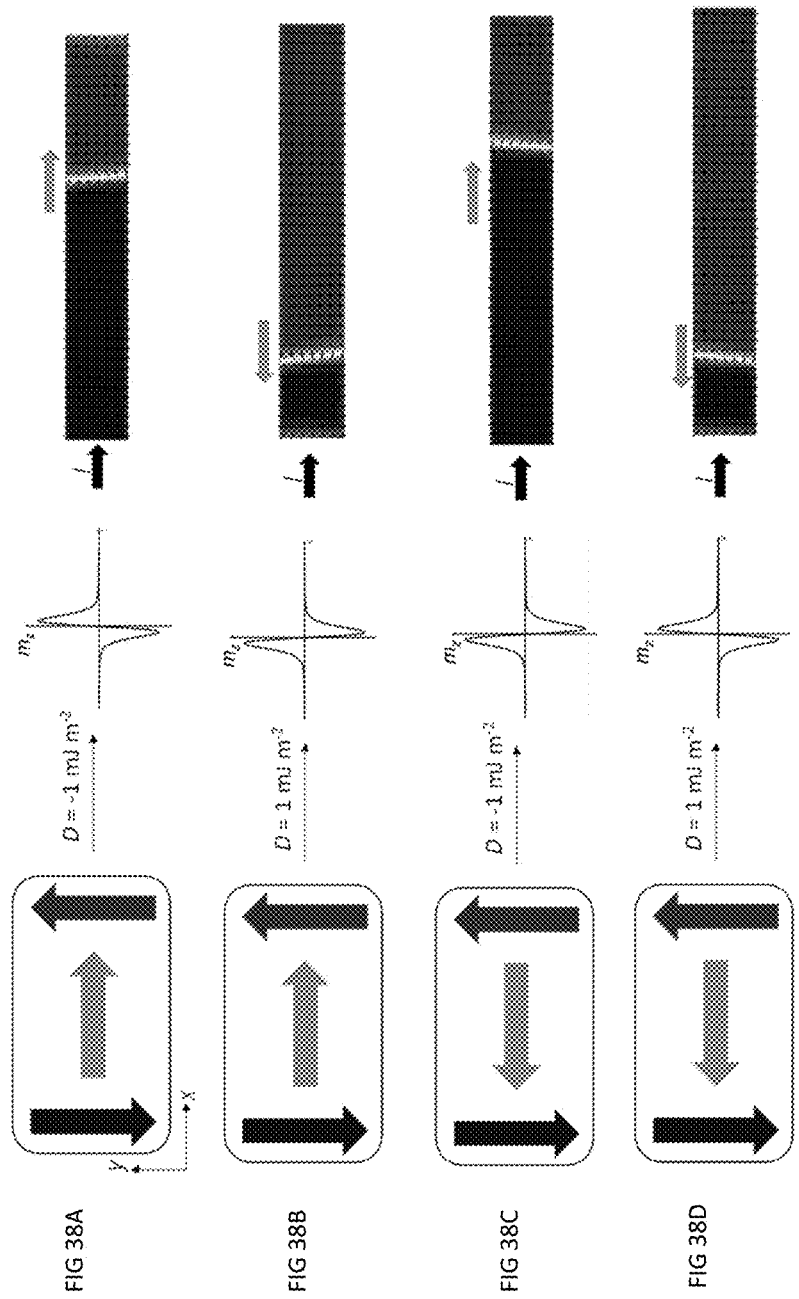
Figure 39:
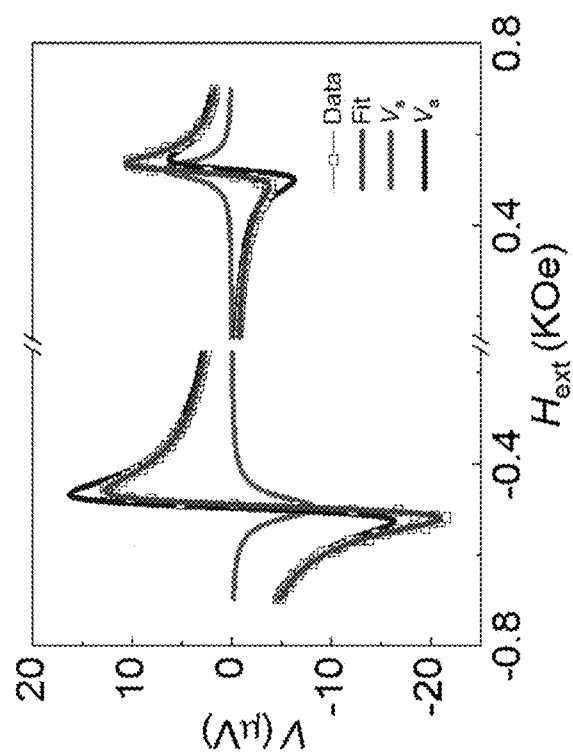
FIG. 39 shows the ST-FMR spectrum of WTe$_2$ (17.2 nm)/Py (6 nm) with currents along the a-axis at 9 GHz with a fit.

For a down/up DW configuration, the initial DW magnetization can be set as ↑→↓ (counterclockwise) or ↑←↓ (clockwise). For each DW chirality, D is set to be either −1 mJ m$^{-2}$ or 1 mJ m$^{-2}$. Under the Injection of positive current, the results of micromagnetic simulations are summarised in FIGS. 38A to 38D. FIGS. 38A to 38D Illustrates micromagnetic simulations at different conditions. FIG. 38A shows the simulation for initial conditions of counter-clockwise DW with a negative DMI value. With application of a positive current, DW moves to right with DW tilted to left. FIG. 38B shows the simulation for initial conditions of counter-clockwise DW with a positive DMI value. With application of a positive current, DW moves to left with DW tilted to left. FIG. 38C shows the simulation for initial conditions of clockwise DW with a negative DMI value. With application of a positive current, DW moves to right with DW tilted to right. FIG. 38D shows the simulation for initial conditions of clockwise DW with a positive DMI value. With application of a positive current, DW moves to left with DW tilted to right.

As shown, the simulation results (both DW tilting orientation and DW moving direction) are consistent with the present experimental results with only the combination of counterclockwise DW (↑→↓) and a negative DMI (−1 mJ m$^{-2}$). Moreover, the m$_z$ component of the DW depends on both the in-plane magnetization and the sign of D.

When the current is replaced by an external magnetic field H$_y$ of 50 Oe in the y direction, as shown in FIG. 20I, the DW presents a tilting in agreement with the experimental results shown in FIG. 20G. In contrast, when D is set to a positive value, the DW tilting shows an opposite trend, which does not agree with experiments.

The above results suggest that D is negative in the WTe$_2$/Py Interface. In addition, no DW tilting is observed in the absence of D, regardless of the driving mechanism. This further verifies that the DW tilting observed in WTe$_2$/Py heterostructures is originated from the Interfacial DMI. As Indicated by the simulation data and fit in FIG. 20G, D=−1.8 mJ m$^{-2}$ is estimated at the WTe$_2$/Py Interface, which is comparable with that of Pt/Co.

The mechanism of the DW tilting can be understood by describing the dynamic effect of DMI as an effective field which stabilizes asymmetric domain configurations and thus leads to a tilted DW. As a result of these Investigations, energy-efficient spintronic devices can be designed based on newly discovered exotic quantum materials.

The micromagnetic simulations were performed by using MuMax3 (versions 3.6.1 and 3.8) at zero temperature including the Interfacial DMI. The system is modeled with a single layer magnetic film with an effective uniaxial magnetic anisotropy along the a-axis of WTe$_2$. In Initial simulations to qualitatively understand the effects of DMI while maintaining reasonable simulation times, a geometrical shape of 1536 nm×192 nm×6 nm was chosen with a cell size of 3 nm×3 nm×6 nm. The magnetic parameters used for the simulations are the saturation magnetization M$_s$=580× 10$^3$ A m$^{-1}$, Gilbert damping constant α=0.0067 obtained from experiments, an anisotropy constant K$_u$=5×10$^4$ J m$^{-3}$ in order to compensate for the shape anisotropy Induced by the narrower wire, and an exchange stiffness A=10×10$^{-12}$ J m$^{-1}$ found in the literature for Py. SOT effects were included by using the available solver for Slonczewski spin torques. Based on the experimental observation that the damping-like torque dominates the system, only the damping-like torque was considered in the present simulations. To convert the parameters into transverse spin currents, a spin Hall angle of θ$_{SH}$=0.1 was assumed. To extract a reliable DMI value in FIG. 20G, simulations were performed with larger geometrical shape of 3072 nm×1536 nm which is in the same order of size as the present experiment (15 μm×10 μm). The anisotropy constant is set to 2×10$^3$ J m$^{-3}$, which is close to the experiment results obtained from MOKE measurements.

In order to confirm the large charge-to-spin conversion efficiency in WTe$_2$ and find the exact contribution of the field-like SOT in the out-of-plane torque, the in-plane second-harmonic measurements were performed on a WTe$_2$ (58 nm)/Py (6 nm) Hall bar device. For the measurements, an alternating current (ac) I=I$_0$ sin(ωt) was Injected along the b-axis while rotating an external magnetic field (B$_{ext}$) in the plane of the sample. At the same time, the first (R$_{xy}^\omega$) and second (R$_{xy}^{2\omega}$) harmonic Hall signals were measured using two lock-in amplifiers.

FIGS. 40A to 40E show the in-plane second harmonic measurements on WTe$_2$ (58 nm)/Py (6 nm). FIG. 40A shows the measurements for planar Hall resistance R$_{xy}^\omega$ of WTe$_2$/Py at 150 Oe. FIG. 40B shows the measurements for second-harmonic Hall resistance of WTe$_2$/Py at 150 Oe with a fit to Equation (10). FIG. 40C shows R$_{FL+Oe}^{2\omega}$ as a function of $$\frac{1}{B_{ext}}.$$

FIG. 40D shows R$_{cos\,\phi}^{2\omega}$ (=R$_{DL}^{2\omega}$+R$_{VT}^{2\omega}$+R$_{WTe2}^{2\omega}$) as a function of B$_{ext}$. FIG. 40E shows R$_{xy}^{2\omega}$ at larger field, indicating the contribution from WTe$_2$ itself. f, R$_{DL}^{2\omega}$+R$_{VT}^{2\omega}$ as a function of both B$_{ext}$+B$_{dmg}$ and $$\frac{1}{B_{ext}+B_{dmg}}.$$

FIGS. 40A and 40B show R$_{xy}^\omega$ and R$_{xy}^{2\omega}$ signals for I$_0$=5.5 mA and B$_{ext}$=150 Oe. The slight tilt in R$_{xy}^\omega$ In FIG. 40A is due to the in-plane uniaxial anisotropy of Py Induced by WTe$_2$ underlayer. By fitting the R$_{xy}^\omega$ data to R$_{xy}^\omega$=R$_{PHE}$ sin(2ϕ$_M$)+C and $$\sin(\phi_M - \phi) = -\frac{B_a}{2B_{ext}}\sin(2\phi_M - 2\phi_E),^{25}$$

where ϕ$_M$ is the magnetization angle of the Py, ϕ is the external field angle against the current direction, B$_a$ is the in-plane anisotropy field, and ϕ$_E$ is the easy axis direction with respect to the current direction, B$_a$ of the sample can be found as ~57 Oe and ϕ$_E$ is 89.1°. Since, the B$_{ext}$ (150 Oe) is greater than B$_a$ (57 Oe), ϕ$_M$ is close to ϕ. Therefore, the slight misalignment of M and B$_{ext}$ can be Ignored.

The R$_{xy}^{2\omega}$ signal shown in FIG. 40B can be fitted to:

$$R_{xy}^{2\omega} = \left(R_{PHE}\frac{B_{FL}+B_{Oe}}{B_{ext}}\right)\cos(2\phi)\cos(\phi) + \frac{1}{2}\left(R_{AHE}\frac{B_{DL}}{B_{ext}+B_{dmg}}+R_{VT}\right)\cos(\phi) \quad (10)$$

$$= R_{FL+Oe}^{2\omega}\cos(2\phi)\cos(\phi) + R_{cos\phi}^{2\omega}\cos(\phi)$$

where R$_{AHE}$ is the anomalous Hall resistance, R$_{PHE}$ is the planar Hall resistance, B$_{dmg}$ is the demagnetization field of the sample, and B$_{DL}$ and B$_{FL}$ are damping-like and field-like torques, respectively. Second-harmonic measurements were performed for different values of B$_{ext}$. The measured signal (R$_{xy}^{2\omega}$) for each B$_{ext}$ was separated into cos(ϕ)–contribution $$\left[R_{cos\phi}^{2\omega} = \frac{1}{2}\left(R_{AHE}\frac{B_{DL}}{B_{ext}+B_{dmg}}+R_{VT}\right)\right] \text{ and } \cos(2\phi)\cos(\phi) - \text{contribution}\left[R_{FL+Oe}^{2\omega} = R_{PHE}\frac{B_{FL}+B_{Oe}}{B_{ext}}\right]$$

by fitting it with Equation (10). As expected, $R_{FL+Oe}^{2\omega}$ has a linear dependence on $$\frac{1}{B_{ext}}$$

and converges at ~0. The overall effective field ($B_{FL}+B_{Oe}$) from field-like SOT field ($B_{FL}$) and the Oersted field ($B_{Oe}$) is determined to be 1.09±0.02 Oe ($R_{PHE}$=0.069Ω determined from the first-harmonic Hall signal). $B_{Oe}$ was estimated from WTe$_2$ to be ~1.19 Oe based on the parallel current distribution. Therefore, $B_{Oe}$ dominates the sum of $B_{FL}+B_{Oe}$, at least at room temperature. This observation confirms our earlier assumption of the Oersted field being the dominant contributor in the overall out-of-plane torque for ST-FMR measurements.

Next, the $B_{DL}$ is evaluated in the system. A plot of $R_{cos\ \phi}^{2\omega}$, is linearly proportional to $B_{ext}$, especially at larger field as shown in FIG. 40D. It is clearly different from the expected trend from a heavy metal/FM based SOT system [$R_{cos\ \phi}^{2\omega}$ should decrease with Increasing $B_{ext}$]. FIG. 40E shows $R_{xy}^{2\omega}$ at different $B_{ext}$ in a larger external field region. Each of the curve in FIG. 40E can be fitted by A×cos(ϕ), where A is a constant. The Inset of FIG. 40E shows magnitude of A versus $B_{ext}$. This large signal is attributed to the chiral-anomaly-induced giant second harmonic plan Hall resistance, which was observed to be linearly dependent on $B_{ext}$. As a result of the large background signal the extraction of $B_{DL}$ by the in-plane second-harmonic methods could be erroneous.

Nonetheless, an attempt was made to evaluate the $B_{DL}$ and the thermal contributions. For this, $R_{WTe2}^{2\omega}$ is removed from $R_{cos\ \phi}^{2\omega}$, the linear fit at large field which corresponds to the WTe$_2$-self-induced signal. FIG. 40F shows the second-harmonic Hall resistance after removing $R_{WTe2}^{2\omega}$, which is nearly linearly dependent on $$\frac{1}{B_{ext}+B_{dmg}}.$$

From fitting, the thermal contribution $R_{VT}^{2\omega}$ and $B_{DL}$ are found to be −0.067±0.003 mΩ and 6.5±0.5 Oe, respectively. $B_{DL}$ with a value of 6.5±0.5 Oe corresponds to a spin current density $J_S$ of 6.87×10$^9$ ($\hbar$/2e) Am$^{-2}$. The current density $J_C$ in WTe$_2$ is calculated to be 3.27×10$^9$ A m$^{-2}$, resulting in a charge-to-spin conversion efficiency $\theta_{SH}$ of 2.10. If it is assumed homogeneous current flowing within the bilayer, the $J_C$ is ~5.07×10$^9$ Am$^{-2}$, which leads to a $\theta_{SH}$ of 1.36. The estimated value of $\theta_{SH}$ from the second-harmonic measurements is much higher compared to that obtained from ST-FMR for the same thickness range. A possible reason for this discrepancy can be the linear background of the $R_{WTe2}^{2\omega}$ which makes the second-harmonic analysis difficult as discussed previously. Another reason is related to the low signal-to-noise ratio (s/n) due to a thermal signal related with WTe$_2$.

It will be appreciated that many further modifications and permutations of various aspects of the described embodiments are possible. Accordingly, the described aspects are Intended to embrace all such alterations, modifications, and variations that fall within the spirit and scope of the appended claims.

Throughout this specification and the claims which follow, unless the context requires otherwise, the word "comprise", and variations such as "comprises" and "comprising", will be understood to imply the inclusion of a stated Integer or step or group of Integers or steps but not the exclusion of any other Integer or step or group of Integers or steps.

The reference in this specification to any prior publication (or Information derived from it), or to any matter which is known, is not, and should not be taken as an acknowledgment or admission or any form of suggestion that that prior publication (or Information derived from it) or known matter forms part of the common general knowledge in the field of endeavour to which this specification relates.

The invention claimed is:

1. A spin torque device comprising:
a reference magnetic layer ("reference layer");
a magnetic layer having a switchable magnetisation direction along a first axis ("free layer");
a non-magnetic layer between the reference layer and the free layer; and
a spin source layer adapted to generate a spin current from a current injected along a second axis perpendicular to the first axis; and
a capping layer, the free layer being between the spin source layer and the capping layer,
wherein electrons of different spins in the spin source layer are rearranged by scattering so the spin current is generated in a plane perpendicular to the second axis and polarized at an angle to the first axis, so that the spin current diffuses into the free layer to produce spin torque to switch the switchable magnetisation direction,
wherein the angle is a canting angle of out-of-plane spin and the canting angle is selected to correspond with a predetermined switching polarity, and a predetermined switching current density and a predetermined switching time.

2. A spin torque device of claim 1, wherein the spin source layer is an antiferromagnetic layer.

3. A spin torque device of claim 2, wherein the antiferromagnetic layer is non-collinear.

4. A spin torque device of claim 2, wherein the antiferromagnetic layer is one of (001), (010), (111), and (100) oriented.

5. A spin torque device of claim 2, wherein the antiferromagnetic layer is iridium-manganese compounds.

6. A spin torque device of claim 2, wherein the antiferromagnetic layer is between about 1 nm to about 20 nm thick.

7. A spin torque device of claim 6, wherein the antiferromagnetic layer is about 8 nm thick.

8. A spin torque device of claim 1, wherein the spin source layer exhibits broken crystalline inversion symmetry.

9. A spin torque device of claim 8, wherein the spin source layer is arranged to receive the current along a low-symmetry or lack-of-symmetry axis.

10. A spin torque device of claim 8, wherein the spin source layer is formed from tungsten-telluride compounds.

11. A spin torque device of claim 1, wherein the spin source layer produces out-of-plane spin accumulation when the current is an in-plane charge current.

12. A spin torque device of claim 1, wherein the capping layer is a magnesium-oxide/silicon-dioxide layer.

13. A spin torque device of claim 1, wherein the free layer exhibits perpendicular magnetic anisotropy.

14. A spin torque device of claim 13, wherein the free layer is formed from one of:
- a ferromagnetic material comprising at least one of Fe, Co, Ni, alloys of one or more of Fe, Co, Ni, and CoFeB alloy;
- a ferrimagnetic material comprising at least one of CoPd, CoTb, FeCoTb, FeCoGd, and CoGd alloys, and the multilayers $[Co/Tb]_n$, $[Co/Pd]_n$ and $[Co/Gd]_n$;
- a ferromagnetic or ferrimagnetic insulator comprising YIG; or
- a two-dimensional magnetic material comprising at least one of FeGeTe compounds and $VSe_2$.

15. A spintronics device comprising:
- a magnetic layer having a switchable magnetisation direction along a first axis, a first surface and opposite second surface ("free layer");
- a spin source layer adapted to generate a spin current from a current injected along a second axis perpendicular to the first axis, the first surface being adjacent the spin source layer,
- a fixed layer; and
- a non-magnetic layer disposed between the fixed layer and the free layer,
- wherein electrons of different spins in the spin source layer are rearranged by scattering so the spin current is generated in a plane perpendicular to the second axis and polarized at an angle to the first axis, so that the spin current diffuses into the free layer to produce spin torque to switch the magnetisation direction,
- wherein the angle is a canting angle of out-of-plane spin and the canting angle is selected to correspond with a predetermined switching polarity,
- wherein the canting angle is selected to correspond with a predetermined switching current density and with a determined switching time, and
- wherein the non-magnetic layer is sandwiched between the free layer and the fixed layer, the spintronics device further comprising a capping layer adjacent the fixed layer.

* * * * *

UNITED STATES PATENT AND TRADEMARK OFFICE
CERTIFICATE OF CORRECTION

| | | |
|---|---|---|
| PATENT NO. | : 12,075,708 B2 | Page 1 of 1 |
| APPLICATION NO. | : 16/887247 | |
| DATED | : August 27, 2024 | |
| INVENTOR(S) | : Kaiming Cai et al. | |

It is certified that error appears in the above-identified patent and that said Letters Patent is hereby corrected as shown below:

On the Title Page

Under Item (30) [Foreign Application Priority Data] should be added to read:
Singaporean (SG) Application No. 10201904869W filed on May 29, 2019

Signed and Sealed this
Thirty-first Day of December, 2024

Derrick Brent
*Acting Director of the United States Patent and Trademark Office*